(12) United States Patent
Pham et al.

(10) Patent No.: US 9,762,168 B2
(45) Date of Patent: *Sep. 12, 2017

(54) COMPRESSOR HAVING A CONTROL AND DIAGNOSTIC MODULE

(71) Applicant: Emerson Climate Technologies, Inc., Sidney, OH (US)

(72) Inventors: Hung M. Pham, Dayton, OH (US); Fadi M. Alsaleem, Troy, OH (US)

(73) Assignee: Emerson Climate Technologies, Inc., Sidney, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/096,196

(22) Filed: Apr. 11, 2016

(65) Prior Publication Data

US 2016/0226416 A1 Aug. 4, 2016

Related U.S. Application Data

(63) Continuation of application No. 14/033,604, filed on Sep. 23, 2013, now Pat. No. 9,310,439.
(Continued)

(51) Int. Cl.
*G01R 31/34* (2006.01)
*H02P 25/04* (2006.01)
(Continued)

(52) U.S. Cl.
CPC ............. *H02P 25/04* (2013.01); *F04B 35/04* (2013.01); *F04B 49/06* (2013.01); *F04B 49/10* (2013.01);
(Continued)

(58) Field of Classification Search
CPC ...................................................... H02P 25/04
See application file for complete search history.

(56) References Cited

U.S. PATENT DOCUMENTS 2,054,542 A 9/1936 Hoelle
2,296,822 A 9/1942 Wolfert
(Continued)

FOREIGN PATENT DOCUMENTS

CA 1147440 A1 5/1983
CA 1151265 A1 8/1983
(Continued)

OTHER PUBLICATIONS

Office Action regarding U.S. Appl. No. 12/943,626, dated May 4, 2016.
(Continued)

*Primary Examiner* — Kawing Chan
(74) *Attorney, Agent, or Firm* — Harness, Dickey & Pierce, P.L.C.

(57) ABSTRACT

A refrigeration system includes a compressor and a capacitor electrically coupled to the compressor. A method of operating the refrigeration system includes measuring voltage values based on alternating current power powering the compressor. The method includes measuring current values based on the alternating current power. The method includes determining, with a controller, a power factor value based on at least one of the voltage values and at least one of the current values. The method includes receiving a supply air temperature value from an air temperature sensor installed in the refrigeration system. The method includes receiving a return air temperature value from an air temperature sensor installed in the refrigeration system. The method includes determining a temperature split based on a difference between the return and supply air temperature values. The method includes determining a fault in the capacitor based on the power factor value and the temperature split.

21 Claims, 6 Drawing Sheets

Related U.S. Application Data

(60) Provisional application No. 61/705,373, filed on Sep. 25, 2012.

(51) Int. Cl.
  *G01R 31/02* (2006.01)
  *F04C 28/28* (2006.01)
  *F04B 35/04* (2006.01)
  *F04C 29/00* (2006.01)
  *F04B 49/06* (2006.01)
  *F04B 49/10* (2006.01)
  *F25B 49/02* (2006.01)
  *F04C 18/02* (2006.01)

(52) U.S. Cl.
  CPC .......... *F04C 18/0215* (2013.01); *F04C 28/28* (2013.01); *F04C 29/0085* (2013.01); *F25B 49/022* (2013.01); *G01R 31/028* (2013.01); *G01R 31/343* (2013.01); *F04B 2203/0201* (2013.01); *F04B 2203/0202* (2013.01); *F04C 18/02* (2013.01); *F04C 2240/808* (2013.01); *F04C 2240/81* (2013.01); *F04C 2270/03* (2013.01); *F04C 2270/07* (2013.01); *F04C 2270/19* (2013.01); *F04C 2270/22* (2013.01); *F04C 2270/60* (2013.01); *F04C 2270/80* (2013.01); *F04C 2270/86* (2013.01); *F04C 2270/90* (2013.01)

(56) References Cited

U.S. PATENT DOCUMENTS

| | | |
|---|---|---|
| 2,631,050 A | 3/1953 | Haeberlein |
| 2,804,839 A | 9/1957 | Hallinan |
| 2,961,606 A | 11/1960 | Mead |
| 2,962,702 A | 11/1960 | Derr et al. |
| 2,978,879 A | 4/1961 | Heidorn |
| 3,027,865 A | 4/1962 | Kautz et al. |
| 3,047,696 A | 7/1962 | Heidorn |
| 3,082,951 A | 3/1963 | Kayan |
| 3,107,843 A | 10/1963 | Finn |
| 3,170,304 A | 2/1965 | Hale |
| 3,232,519 A | 2/1966 | Long |
| 3,278,111 A | 10/1966 | Parker |
| 3,327,197 A | 6/1967 | Marquis |
| 3,339,164 A | 8/1967 | Landis et al. |
| 3,400,374 A | 9/1968 | Schumann |
| 3,513,662 A | 5/1970 | Golber |
| 3,581,281 A | 5/1971 | Martin et al. |
| 3,585,451 A | 6/1971 | Day, III |
| 3,653,783 A | 4/1972 | Sauder |
| 3,660,718 A | 5/1972 | Pinckaers |
| 3,665,339 A | 5/1972 | Liu |
| 3,665,399 A | 5/1972 | Zehr et al. |
| 3,697,953 A | 10/1972 | Schoenwitz |
| 3,707,851 A | 1/1973 | McAshan, Jr. |
| 3,729,949 A | 5/1973 | Talbot |
| 3,735,377 A | 5/1973 | Kaufman |
| 3,742,302 A | 6/1973 | Neill |
| 3,742,303 A | 6/1973 | Dageford |
| 3,767,328 A | 10/1973 | Ladusaw |
| 3,777,240 A | 12/1973 | Neill |
| 3,783,681 A | 1/1974 | Hirt et al. |
| 3,820,074 A | 6/1974 | Toman |
| 3,882,305 A | 5/1975 | Johnstone |
| 3,924,972 A | 12/1975 | Szymaszek |
| 3,927,712 A | 12/1975 | Nakayama |
| 3,935,519 A | 1/1976 | Pfarrer et al. |
| 3,950,962 A | 4/1976 | Odashima |
| 3,960,011 A | 6/1976 | Renz et al. |
| 3,978,382 A | 8/1976 | Pfarrer et al. |
| 3,998,068 A | 12/1976 | Chirnside |
| 4,006,460 A | 2/1977 | Hewitt et al. |
| 4,014,182 A | 3/1977 | Granryd |
| 4,018,584 A | 4/1977 | Mullen |
| 4,019,172 A | 4/1977 | Srodes |
| 4,024,725 A | 5/1977 | Uchida et al. |
| 4,027,289 A | 5/1977 | Toman |
| 4,034,570 A | 7/1977 | Anderson et al. |
| 4,038,061 A | 7/1977 | Anderson et al. |
| 4,045,973 A | 9/1977 | Anderson et al. |
| 4,046,532 A | 9/1977 | Nelson |
| RE29,450 E | 10/1977 | Goldsby et al. |
| 4,060,716 A | 11/1977 | Pekrul et al. |
| 4,066,869 A | 1/1978 | Apaloo et al. |
| 4,090,248 A | 5/1978 | Swanson et al. |
| 4,102,150 A | 7/1978 | Kountz |
| 4,102,394 A | 7/1978 | Botts |
| 4,104,888 A | 8/1978 | Reedy et al. |
| 4,105,063 A | 8/1978 | Bergt |
| 4,112,703 A | 9/1978 | Kountz |
| 4,132,086 A | 1/1979 | Kountz |
| 4,136,730 A | 1/1979 | Kinsey |
| 4,137,057 A | 1/1979 | Piet et al. |
| 4,137,725 A | 2/1979 | Martin |
| 4,142,375 A | 3/1979 | Abe et al. |
| 4,143,707 A | 3/1979 | Lewis et al. |
| 4,146,085 A | 3/1979 | Wills |
| RE29,966 E | 4/1979 | Nussbaum |
| 4,151,725 A | 5/1979 | Kountz et al. |
| 4,153,003 A | 5/1979 | Willis |
| 4,156,350 A | 5/1979 | Elliott et al. |
| 4,161,106 A | 7/1979 | Savage et al. |
| 4,165,619 A | 8/1979 | Girard |
| 4,171,622 A | 10/1979 | Yamaguchi et al. |
| 4,173,871 A | 11/1979 | Brooks |
| 4,178,988 A | 12/1979 | Cann et al. |
| RE30,242 E | 4/1980 | del Toro et al. |
| 4,197,717 A | 4/1980 | Schumacher |
| 4,205,381 A | 5/1980 | Games et al. |
| 4,209,994 A | 7/1980 | Mueller et al. |
| 4,211,089 A | 7/1980 | Mueller et al. |
| 4,217,761 A | 8/1980 | Cornaire et al. |
| 4,220,010 A | 9/1980 | Mueller et al. |
| 4,227,862 A | 10/1980 | Andrew et al. |
| 4,232,530 A | 11/1980 | Mueller |
| 4,233,818 A | 11/1980 | Lastinger |
| 4,236,379 A | 12/1980 | Mueller |
| 4,244,182 A | 1/1981 | Behr |
| 4,246,763 A | 1/1981 | Mueller et al. |
| 4,248,051 A | 2/1981 | Darcy et al. |
| 4,251,988 A | 2/1981 | Allard et al. |
| 4,257,795 A | 3/1981 | Shaw |
| 4,259,847 A | 4/1981 | Pearse, Jr. |
| 4,267,702 A | 5/1981 | Houk |
| 4,270,174 A | 5/1981 | Karlin et al. |
| 4,271,898 A | 6/1981 | Freeman |
| 4,281,358 A | 7/1981 | Plouffe et al. |
| 4,284,849 A | 8/1981 | Anderson et al. |
| 4,286,438 A | 9/1981 | Clarke |
| 4,290,480 A | 9/1981 | Sulkowski |
| 4,296,727 A | 10/1981 | Bryan |
| 4,301,660 A | 11/1981 | Mueller et al. |
| 4,306,293 A | 12/1981 | Marathe |
| 4,307,775 A | 12/1981 | Saunders et al. |
| 4,308,725 A | 1/1982 | Chiyoda |
| 4,311,188 A | 1/1982 | Kojima et al. |
| 4,319,461 A | 3/1982 | Shaw |
| 4,321,529 A | 3/1982 | Simmonds et al. |
| 4,325,223 A | 4/1982 | Cantley |
| 4,328,678 A | 5/1982 | Kono et al. |
| 4,328,680 A | 5/1982 | Stamp, Jr. et al. |
| 4,333,316 A | 6/1982 | Stamp, Jr. et al. |
| 4,333,317 A | 6/1982 | Sawyer |
| 4,336,001 A | 6/1982 | Andrew et al. |
| 4,338,790 A | 7/1982 | Saunders et al. |
| 4,338,791 A | 7/1982 | Stamp, Jr. et al. |
| 4,345,162 A | 8/1982 | Hammer et al. |
| 4,346,755 A | 8/1982 | Alley et al. |
| 4,350,021 A | 9/1982 | Lundstrom |
| 4,350,023 A | 9/1982 | Kuwabara et al. |
| 4,351,163 A | 9/1982 | Johannsen |
| 4,356,703 A | 11/1982 | Vogel |

(56) References Cited

U.S. PATENT DOCUMENTS

| | | |
|---|---|---|
| 4,361,273 A | 11/1982 | Levine et al. |
| 4,365,983 A | 12/1982 | Abraham et al. |
| 4,370,098 A | 1/1983 | McClain et al. |
| 4,372,119 A | 2/1983 | Gillbrand et al. |
| 4,376,926 A | 3/1983 | Senor |
| 4,381,549 A | 4/1983 | Stamp, Jr. et al. |
| 4,382,367 A | 5/1983 | Roberts |
| 4,384,462 A | 5/1983 | Overman et al. |
| 4,387,368 A | 6/1983 | Day, III et al. |
| 4,387,578 A | 6/1983 | Paddock |
| 4,390,058 A | 6/1983 | Otake et al. |
| 4,390,321 A | 6/1983 | Langlois et al. |
| 4,390,922 A | 6/1983 | Pelliccia |
| 4,395,886 A | 8/1983 | Mayer |
| 4,395,887 A | 8/1983 | Sweetman |
| 4,399,548 A | 8/1983 | Castleberry |
| 4,402,054 A | 8/1983 | Osborne et al. |
| 4,406,133 A | 9/1983 | Saunders et al. |
| 4,407,138 A | 10/1983 | Mueller |
| 4,408,660 A | 10/1983 | Sutoh et al. |
| 4,412,788 A | 11/1983 | Shaw et al. |
| 4,415,896 A | 11/1983 | Allgood |
| 4,418,388 A | 11/1983 | Allgor et al. |
| 4,420,947 A | 12/1983 | Yoshino |
| 4,425,010 A | 1/1984 | Bryant et al. |
| 4,429,578 A | 2/1984 | Darrel et al. |
| 4,432,232 A | 2/1984 | Brantley et al. |
| 4,434,390 A | 2/1984 | Elms |
| 4,441,329 A | 4/1984 | Dawley |
| 4,448,038 A | 5/1984 | Barbier |
| 4,449,375 A | 5/1984 | Briccetti |
| 4,451,929 A | 5/1984 | Yoshida |
| 4,460,123 A | 7/1984 | Beverly |
| 4,463,571 A | 8/1984 | Wiggs |
| 4,463,574 A | 8/1984 | Spethmann et al. |
| 4,463,576 A | 8/1984 | Burnett et al. |
| 4,465,229 A | 8/1984 | Kompelien |
| 4,467,230 A | 8/1984 | Rovinsky |
| 4,467,385 A | 8/1984 | Bandoli et al. |
| 4,467,613 A | 8/1984 | Behr et al. |
| 4,470,092 A | 9/1984 | Lombardi |
| 4,470,266 A | 9/1984 | Briccetti et al. |
| 4,474,024 A | 10/1984 | Eplett et al. |
| 4,474,542 A | 10/1984 | Kato et al. |
| 4,479,389 A | 10/1984 | Anderson, III et al. |
| 4,484,452 A | 11/1984 | Houser, Jr. |
| 4,489,551 A | 12/1984 | Watanabe et al. |
| 4,490,986 A | 1/1985 | Paddock |
| 4,494,383 A | 1/1985 | Nagatomo et al. |
| 4,495,779 A | 1/1985 | Tanaka et al. |
| 4,496,296 A | 1/1985 | Arai et al. |
| 4,497,031 A | 1/1985 | Froehling et al. |
| 4,498,310 A | 2/1985 | Imanishi et al. |
| 4,499,739 A | 2/1985 | Matsuoka et al. |
| 4,502,084 A | 2/1985 | Hannett |
| 4,502,833 A | 3/1985 | Hibino et al. |
| 4,502,842 A | 3/1985 | Currier et al. |
| 4,502,843 A | 3/1985 | Martin |
| 4,505,125 A | 3/1985 | Baglione |
| 4,506,518 A | 3/1985 | Yoshikawa et al. |
| 4,507,934 A | 4/1985 | Tanaka et al. |
| 4,510,547 A | 4/1985 | Rudich, Jr. |
| 4,510,576 A | 4/1985 | MacArthur et al. |
| 4,512,161 A | 4/1985 | Logan et al. |
| 4,516,407 A | 5/1985 | Watabe |
| 4,517,468 A | 5/1985 | Kemper et al. |
| 4,520,674 A | 6/1985 | Canada et al. |
| 4,523,435 A | 6/1985 | Lord |
| 4,523,436 A | 6/1985 | Schedel et al. |
| 4,527,247 A | 7/1985 | Kaiser et al. |
| 4,527,399 A | 7/1985 | Lord |
| 4,535,607 A | 8/1985 | Mount |
| 4,538,420 A | 9/1985 | Nelson |
| 4,538,422 A | 9/1985 | Mount et al. |
| 4,539,820 A | 9/1985 | Zinsmeyer |
| 4,540,040 A | 9/1985 | Fukumoto et al. |
| 4,545,210 A | 10/1985 | Lord |
| 4,545,214 A | 10/1985 | Kinoshita |
| 4,548,549 A | 10/1985 | Murphy et al. |
| 4,549,403 A | 10/1985 | Lord et al. |
| 4,549,404 A | 10/1985 | Lord |
| 4,550,770 A | 11/1985 | Nussdorfer et al. |
| 4,553,400 A | 11/1985 | Branz |
| 4,555,057 A | 11/1985 | Foster |
| 4,555,910 A | 12/1985 | Sturges |
| 4,557,317 A | 12/1985 | Harmon, Jr. |
| 4,558,181 A | 12/1985 | Blanchard et al. |
| 4,561,260 A | 12/1985 | Nishi et al. |
| 4,563,624 A | 1/1986 | Yu |
| 4,563,877 A | 1/1986 | Harnish |
| 4,563,878 A | 1/1986 | Baglione |
| 4,567,733 A | 2/1986 | Mecozzi |
| 4,568,909 A | 2/1986 | Whynacht |
| 4,574,871 A | 3/1986 | Parkinson et al. |
| 4,575,318 A | 3/1986 | Blain |
| 4,577,977 A | 3/1986 | Pejsa |
| 4,580,947 A | 4/1986 | Shibata et al. |
| 4,583,373 A | 4/1986 | Shaw |
| 4,589,060 A | 5/1986 | Zinsmeyer |
| 4,593,367 A | 6/1986 | Slack et al. |
| 4,598,764 A | 7/1986 | Beckey |
| 4,602,484 A | 7/1986 | Bendikson |
| 4,603,556 A | 8/1986 | Suefuji et al. |
| 4,604,036 A | 8/1986 | Sutou et al. |
| 4,611,470 A | 9/1986 | Enstrom |
| 4,612,775 A | 9/1986 | Branz et al. |
| 4,614,089 A | 9/1986 | Dorsey |
| 4,617,804 A | 10/1986 | Fukushima et al. |
| 4,620,286 A | 10/1986 | Smith et al. |
| 4,620,424 A | 11/1986 | Tanaka et al. |
| 4,621,502 A | 11/1986 | Ibrahim et al. |
| 4,627,245 A | 12/1986 | Levine |
| 4,627,483 A | 12/1986 | Harshbarger, III et al. |
| 4,627,484 A | 12/1986 | Harshbarger, Jr. et al. |
| 4,630,572 A | 12/1986 | Evans |
| 4,630,670 A | 12/1986 | Wellman et al. |
| 4,642,034 A | 2/1987 | Terauchi |
| 4,642,782 A | 2/1987 | Kemper et al. |
| 4,644,479 A | 2/1987 | Kemper et al. |
| 4,646,532 A | 3/1987 | Nose |
| 4,648,044 A | 3/1987 | Hardy et al. |
| 4,649,515 A | 3/1987 | Thompson et al. |
| 4,649,710 A | 3/1987 | Inoue et al. |
| 4,653,280 A | 3/1987 | Hansen et al. |
| 4,653,285 A | 3/1987 | Pohl |
| 4,655,688 A | 4/1987 | Bohn et al. |
| 4,660,386 A | 4/1987 | Hansen et al. |
| 4,662,184 A | 5/1987 | Pohl et al. |
| 4,674,292 A | 6/1987 | Ohya et al. |
| 4,677,830 A | 7/1987 | Sumikawa et al. |
| 4,680,940 A | 7/1987 | Vaughn |
| 4,682,473 A | 7/1987 | Rogers, III |
| 4,684,060 A | 8/1987 | Adams et al. |
| 4,685,615 A | 8/1987 | Hart |
| 4,686,835 A | 8/1987 | Alsenz |
| 4,689,967 A | 9/1987 | Han et al. |
| 4,697,431 A | 10/1987 | Alsenz |
| 4,698,978 A | 10/1987 | Jones |
| 4,698,981 A | 10/1987 | Kaneko et al. |
| 4,701,824 A | 10/1987 | Beggs et al. |
| 4,703,325 A | 10/1987 | Chamberlin et al. |
| 4,706,152 A | 11/1987 | DeFilippis et al. |
| 4,706,469 A | 11/1987 | Oguni et al. |
| 4,712,648 A | 12/1987 | Mattes et al. |
| 4,713,717 A | 12/1987 | Pejouhy et al. |
| 4,715,190 A | 12/1987 | Han et al. |
| 4,715,792 A | 12/1987 | Nishizawa et al. |
| 4,716,582 A | 12/1987 | Blanchard et al. |
| 4,716,957 A | 1/1988 | Thompson et al. |
| 4,720,980 A | 1/1988 | Howland |
| 4,722,018 A | 1/1988 | Pohl |
| 4,722,019 A | 1/1988 | Pohl |
| 4,724,678 A | 2/1988 | Pohl |
| 4,735,054 A | 4/1988 | Beckey |

(56) References Cited

U.S. PATENT DOCUMENTS

| | | | |
|---|---|---|---|
| 4,735,060 A | 4/1988 | Alsenz |
| 4,744,223 A | 5/1988 | Umezu |
| 4,745,765 A | 5/1988 | Pettitt |
| 4,745,766 A | 5/1988 | Bahr |
| 4,745,767 A | 5/1988 | Ohya et al. |
| 4,750,332 A | 6/1988 | Jenski et al. |
| 4,750,672 A | 6/1988 | Beckey et al. |
| 4,751,501 A | 6/1988 | Gut |
| 4,751,825 A | 6/1988 | Voorhis et al. |
| 4,754,410 A | 6/1988 | Leech et al. |
| 4,755,957 A | 7/1988 | White et al. |
| 4,765,150 A | 8/1988 | Persem |
| 4,768,346 A | 9/1988 | Mathur |
| 4,768,348 A | 9/1988 | Noguchi |
| 4,783,752 A | 11/1988 | Kaplan et al. |
| 4,787,213 A | 11/1988 | Gras et al. |
| 4,790,142 A | 12/1988 | Beckey |
| 4,796,142 A | 1/1989 | Libert |
| 4,796,466 A | 1/1989 | Farmer |
| 4,798,055 A | 1/1989 | Murray et al. |
| 4,805,118 A | 2/1989 | Rishel |
| 4,807,445 A | 2/1989 | Matsuoka et al. |
| 4,820,130 A | 4/1989 | Eber et al. |
| 4,829,779 A | 5/1989 | Munson et al. |
| 4,831,560 A | 5/1989 | Zaleski |
| 4,831,832 A | 5/1989 | Alsenz |
| 4,831,833 A | 5/1989 | Duenes et al. |
| 4,835,706 A | 5/1989 | Asahi |
| 4,835,980 A | 6/1989 | Oyanagi et al. |
| 4,838,037 A | 6/1989 | Wood |
| 4,841,734 A | 6/1989 | Torrence |
| 4,843,575 A | 6/1989 | Crane |
| 4,845,956 A | 7/1989 | Berntsen et al. |
| 4,848,099 A | 7/1989 | Beckey et al. |
| 4,848,100 A | 7/1989 | Barthel et al. |
| 4,850,198 A | 7/1989 | Helt et al. |
| 4,850,204 A | 7/1989 | Bos et al. |
| 4,852,363 A | 8/1989 | Kampf et al. |
| 4,853,693 A | 8/1989 | Eaton-Williams |
| 4,856,286 A | 8/1989 | Sulfstede et al. |
| 4,858,676 A | 8/1989 | Bolfik et al. |
| 4,866,635 A | 9/1989 | Kahn et al. |
| 4,866,944 A | 9/1989 | Yamazaki |
| 4,869,073 A | 9/1989 | Kawai et al. |
| 4,873,836 A | 10/1989 | Thompson |
| 4,875,589 A | 10/1989 | Lacey et al. |
| 4,877,382 A | 10/1989 | Caillat et al. |
| 4,878,355 A | 11/1989 | Beckey et al. |
| 4,881,184 A | 11/1989 | Abegg, III et al. |
| 4,882,747 A | 11/1989 | Williams |
| 4,882,908 A | 11/1989 | White |
| 4,884,412 A | 12/1989 | Sellers et al. |
| 4,885,707 A | 12/1989 | Nichol et al. |
| 4,885,914 A | 12/1989 | Pearman |
| 4,887,436 A | 12/1989 | Enomoto et al. |
| 4,887,857 A | 12/1989 | VanOmmeren |
| 4,889,280 A | 12/1989 | Grald et al. |
| 4,893,480 A | 1/1990 | Matsui et al. |
| 4,899,551 A | 2/1990 | Weintraub |
| 4,903,500 A | 2/1990 | Hanson |
| 4,903,759 A * | 2/1990 | Lapeyrouse ......... F24F 11/0009 165/11.1 |
| 4,904,993 A | 2/1990 | Sato |
| 4,909,041 A | 3/1990 | Jones |
| 4,909,076 A | 3/1990 | Busch et al. |
| 4,910,966 A | 3/1990 | Levine et al. |
| 4,913,625 A | 4/1990 | Gerlowski |
| 4,916,633 A | 4/1990 | Tychonievich et al. |
| 4,916,909 A | 4/1990 | Mathur et al. |
| 4,916,912 A | 4/1990 | Levine et al. |
| 4,918,690 A | 4/1990 | Markkula, Jr. et al. |
| 4,918,932 A | 4/1990 | Gustafson et al. |
| 4,924,404 A | 5/1990 | Reinke, Jr. |
| 4,924,418 A | 5/1990 | Bachman et al. |
| 4,928,750 A | 5/1990 | Nurczyk |
| 4,932,588 A | 6/1990 | Fedter et al. |
| 4,939,909 A | 7/1990 | Tsuchiyama et al. |
| 4,943,003 A | 7/1990 | Shimizu et al. |
| 4,944,160 A | 7/1990 | Malone et al. |
| 4,945,491 A | 7/1990 | Rishel |
| 4,948,040 A | 8/1990 | Kobayashi et al. |
| 4,949,550 A | 8/1990 | Hanson |
| 4,953,784 A | 9/1990 | Yasufuku et al. |
| 4,959,970 A | 10/1990 | Meckler |
| 4,964,060 A | 10/1990 | Hartsog |
| 4,964,125 A | 10/1990 | Kim |
| 4,966,006 A | 10/1990 | Thuesen et al. |
| 4,967,567 A | 11/1990 | Proctor et al. |
| 4,970,496 A | 11/1990 | Kirkpatrick |
| 4,974,427 A | 12/1990 | Diab |
| 4,974,665 A | 12/1990 | Zillner, Jr. |
| 4,975,024 A | 12/1990 | Heckel |
| 4,977,751 A | 12/1990 | Hanson |
| 4,985,857 A | 1/1991 | Bajpai et al. |
| 4,987,748 A | 1/1991 | Meckler |
| 4,990,057 A | 2/1991 | Rollins |
| 4,990,893 A | 2/1991 | Kiluk |
| 4,991,770 A | 2/1991 | Bird et al. |
| 5,000,009 A | 3/1991 | Clanin |
| 5,005,365 A | 4/1991 | Lynch |
| 5,009,074 A | 4/1991 | Goubeaux et al. |
| 5,009,075 A | 4/1991 | Okoren |
| 5,009,076 A | 4/1991 | Winslow |
| 5,012,629 A | 5/1991 | Rehman et al. |
| 5,018,357 A | 5/1991 | Livingstone et al. |
| 5,018,665 A | 5/1991 | Sulmone |
| RE33,620 E | 6/1991 | Persem |
| 5,022,234 A | 6/1991 | Goubeaux et al. |
| 5,039,009 A | 8/1991 | Baldwin et al. |
| 5,042,264 A | 8/1991 | Dudley |
| 5,051,720 A | 9/1991 | Kittirutsunetorn |
| 5,056,036 A | 10/1991 | Van Bork |
| 5,056,329 A | 10/1991 | Wilkinson |
| 5,058,388 A | 10/1991 | Shaw et al. |
| 5,062,278 A | 11/1991 | Sugiyama |
| 5,065,593 A | 11/1991 | Dudley et al. |
| 5,067,099 A | 11/1991 | McCown et al. |
| RE33,775 E | 12/1991 | Behr et al. |
| 5,070,468 A | 12/1991 | Niinomi et al. |
| 5,071,065 A | 12/1991 | Aalto et al. |
| 5,073,091 A | 12/1991 | Burgess et al. |
| 5,073,862 A | 12/1991 | Carlson |
| 5,076,067 A | 12/1991 | Prenger et al. |
| 5,076,494 A | 12/1991 | Ripka |
| 5,077,983 A | 1/1992 | Dudley |
| 5,083,438 A | 1/1992 | McMullin |
| 5,086,385 A | 2/1992 | Launey et al. |
| 5,088,297 A | 2/1992 | Maruyama et al. |
| 5,094,086 A | 3/1992 | Shyu |
| 5,095,712 A | 3/1992 | Narreau |
| 5,095,715 A | 3/1992 | Dudley |
| 5,099,654 A | 3/1992 | Baruschke et al. |
| 5,102,316 A | 4/1992 | Caillat et al. |
| 5,103,391 A | 4/1992 | Barrett |
| 5,107,500 A | 4/1992 | Wakamoto et al. |
| 5,109,222 A | 4/1992 | Welty |
| 5,109,676 A | 5/1992 | Waters et al. |
| 5,109,700 A | 5/1992 | Hicho |
| 5,109,916 A | 5/1992 | Thompson |
| 5,115,406 A | 5/1992 | Zatezalo et al. |
| 5,115,643 A | 5/1992 | Hayata et al. |
| 5,115,644 A | 5/1992 | Alsenz |
| 5,115,967 A | 5/1992 | Wedekind |
| 5,118,260 A | 6/1992 | Fraser, Jr. |
| 5,119,466 A | 6/1992 | Suzuki |
| 5,119,637 A | 6/1992 | Bard et al. |
| 5,121,610 A | 6/1992 | Atkinson et al. |
| 5,123,017 A | 6/1992 | Simpkins et al. |
| 5,123,252 A | 6/1992 | Hanson |
| 5,123,253 A | 6/1992 | Hanson et al. |
| 5,123,255 A | 6/1992 | Ohizumi |
| 5,125,067 A | 6/1992 | Erdman |
| RE34,001 E | 7/1992 | Wrobel |
| 5,127,232 A | 7/1992 | Paige et al. |

(56) References Cited

U.S. PATENT DOCUMENTS

| | | |
|---|---|---|
| 5,131,237 A | 7/1992 | Valbjorn |
| 5,136,855 A | 8/1992 | Lenarduzzi |
| 5,141,407 A | 8/1992 | Ramsey et al. |
| 5,142,877 A | 9/1992 | Shimizu |
| 5,150,584 A | 9/1992 | Tomasov et al. |
| 5,156,539 A | 10/1992 | Anderson et al. |
| 5,167,494 A | 12/1992 | Inagaki et al. |
| 5,170,935 A | 12/1992 | Federspiel et al. |
| 5,170,936 A | 12/1992 | Kubo et al. |
| 5,181,389 A | 1/1993 | Hanson et al. |
| 5,186,014 A | 2/1993 | Runk |
| 5,197,666 A | 3/1993 | Wedekind |
| 5,199,855 A | 4/1993 | Nakajima et al. |
| 5,200,872 A | 4/1993 | D'Entremont et al. |
| 5,200,987 A | 4/1993 | Gray |
| 5,201,862 A | 4/1993 | Pettitt |
| 5,203,178 A | 4/1993 | Shyu |
| 5,203,179 A | 4/1993 | Powell |
| 5,209,076 A | 5/1993 | Kauffman et al. |
| 5,209,400 A | 5/1993 | Winslow et al. |
| 5,219,041 A | 6/1993 | Greve |
| 5,224,354 A | 7/1993 | Ito et al. |
| 5,224,835 A | 7/1993 | Oltman |
| 5,226,472 A | 7/1993 | Benevelli et al. |
| 5,228,300 A | 7/1993 | Shim |
| 5,228,304 A | 7/1993 | Ryan |
| 5,228,307 A | 7/1993 | Koce |
| 5,230,223 A | 7/1993 | Hullar et al. |
| 5,231,844 A | 8/1993 | Park |
| 5,233,841 A | 8/1993 | Jyrek |
| 5,235,526 A | 8/1993 | Saffell |
| 5,237,830 A | 8/1993 | Grant |
| 5,241,664 A | 8/1993 | Ohba et al. |
| 5,241,833 A | 9/1993 | Ohkoshi |
| 5,243,827 A | 9/1993 | Hagita et al. |
| 5,243,829 A | 9/1993 | Bessler |
| 5,245,833 A | 9/1993 | Mei et al. |
| 5,248,244 A | 9/1993 | Ho et al. |
| 5,251,453 A | 10/1993 | Stanke et al. |
| 5,251,454 A | 10/1993 | Yoon |
| 5,255,977 A | 10/1993 | Eimer et al. |
| 5,257,506 A | 11/1993 | DeWolf et al. |
| 5,262,704 A | 11/1993 | Farr |
| 5,265,434 A | 11/1993 | Alsenz |
| 5,269,458 A | 12/1993 | Sol |
| 5,271,556 A | 12/1993 | Helt et al. |
| 5,274,571 A | 12/1993 | Hesse et al. |
| 5,276,630 A | 1/1994 | Baldwin et al. |
| 5,279,458 A | 1/1994 | DeWolf et al. |
| 5,282,728 A | 2/1994 | Swain |
| 5,284,026 A | 2/1994 | Powell |
| 5,289,362 A | 2/1994 | Liebl et al. |
| 5,290,154 A | 3/1994 | Kotlarek et al. |
| 5,291,752 A | 3/1994 | Alvarez et al. |
| 5,299,504 A | 4/1994 | Abele |
| 5,303,112 A | 4/1994 | Zulaski et al. |
| 5,303,560 A | 4/1994 | Hanson et al. |
| 5,311,451 A | 5/1994 | Barrett |
| 5,311,562 A | 5/1994 | Palusamy et al. |
| 5,316,448 A | 5/1994 | Ziegler et al. |
| 5,320,506 A | 6/1994 | Fogt |
| 5,333,460 A | 8/1994 | Lewis et al. |
| 5,335,507 A | 8/1994 | Powell |
| 5,336,058 A | 8/1994 | Yokoyama |
| 5,347,476 A | 9/1994 | McBean, Sr. |
| 5,351,037 A | 9/1994 | Martell et al. |
| 5,362,206 A | 11/1994 | Westerman et al. |
| 5,362,211 A | 11/1994 | Iizuka et al. |
| 5,368,446 A | 11/1994 | Rode |
| 5,369,958 A | 12/1994 | Kasai et al. |
| 5,381,669 A | 1/1995 | Bahel et al. |
| 5,381,692 A | 1/1995 | Winslow et al. |
| 5,388,176 A | 2/1995 | Dykstra et al. |
| 5,395,042 A | 3/1995 | Riley et al. |
| 5,410,230 A | 4/1995 | Bessler et al. |
| 5,414,792 A | 5/1995 | Shorey |
| 5,415,008 A | 5/1995 | Bessler |
| 5,416,781 A | 5/1995 | Ruiz |
| 5,423,190 A | 6/1995 | Friedland |
| 5,423,192 A | 6/1995 | Young et al. |
| 5,426,952 A | 6/1995 | Bessler |
| 5,431,026 A | 7/1995 | Jaster |
| 5,432,500 A | 7/1995 | Scripps |
| 5,435,145 A | 7/1995 | Jaster |
| 5,435,148 A | 7/1995 | Sandofsky et al. |
| 5,440,890 A | 8/1995 | Bahel et al. |
| 5,440,891 A | 8/1995 | Hindmon, Jr. et al. |
| 5,440,895 A | 8/1995 | Bahel et al. |
| 5,446,677 A | 8/1995 | Jensen et al. |
| 5,450,359 A | 9/1995 | Sharma et al. |
| 5,452,291 A | 9/1995 | Eisenhandler et al. |
| 5,454,229 A | 10/1995 | Hanson et al. |
| 5,457,965 A | 10/1995 | Blair et al. |
| 5,460,006 A | 10/1995 | Torimitsu |
| 5,467,011 A | 11/1995 | Hunt |
| 5,467,264 A | 11/1995 | Rauch et al. |
| 5,469,045 A | 11/1995 | Dove et al. |
| 5,475,986 A | 12/1995 | Bahel et al. |
| 5,478,212 A | 12/1995 | Sakai et al. |
| 5,481,481 A | 1/1996 | Frey et al. |
| 5,481,884 A | 1/1996 | Scoccia |
| 5,483,141 A | 1/1996 | Uesugi |
| 5,491,978 A | 2/1996 | Young et al. |
| 5,495,722 A | 3/1996 | Manson et al. |
| 5,499,512 A | 3/1996 | Jurewicz et al. |
| 5,509,786 A | 4/1996 | Mizutani et al. |
| 5,511,387 A | 4/1996 | Tinsler |
| 5,512,883 A | 4/1996 | Lane, Jr. |
| 5,515,267 A | 5/1996 | Alsenz |
| 5,515,692 A | 5/1996 | Sterber et al. |
| 5,519,301 A | 5/1996 | Yoshida et al. |
| 5,528,908 A | 6/1996 | Bahel et al. |
| 5,532,534 A | 7/1996 | Baker et al. |
| 5,533,347 A | 7/1996 | Ott et al. |
| 5,535,136 A | 7/1996 | Standifer |
| 5,535,597 A | 7/1996 | An |
| 5,546,015 A | 8/1996 | Okabe |
| 5,546,073 A | 8/1996 | Duff et al. |
| 5,546,756 A | 8/1996 | Ali |
| 5,546,757 A | 8/1996 | Whipple, III |
| 5,548,966 A | 8/1996 | Tinsler |
| 5,555,195 A | 9/1996 | Jensen et al. |
| 5,562,426 A | 10/1996 | Watanabe et al. |
| 5,563,490 A | 10/1996 | Kawaguchi et al. |
| 5,564,280 A | 10/1996 | Schilling et al. |
| 5,566,084 A | 10/1996 | Cmar |
| 5,570,085 A | 10/1996 | Bertsch |
| 5,570,258 A | 10/1996 | Manning |
| 5,572,643 A | 11/1996 | Judson |
| 5,577,905 A | 11/1996 | Momber et al. |
| 5,579,648 A | 12/1996 | Hanson et al. |
| 5,581,229 A | 12/1996 | Hunt |
| 5,586,445 A | 12/1996 | Bessler |
| 5,586,446 A | 12/1996 | Torimitsu |
| 5,590,830 A | 1/1997 | Kettler et al. |
| 5,592,058 A | 1/1997 | Archer et al. |
| 5,592,824 A | 1/1997 | Sogabe et al. |
| 5,596,507 A | 1/1997 | Jones et al. |
| 5,600,960 A | 2/1997 | Schwedler et al. |
| 5,602,749 A | 2/1997 | Vosburgh |
| 5,602,757 A | 2/1997 | Haseley et al. |
| 5,602,761 A | 2/1997 | Spoerre et al. |
| 5,610,339 A | 3/1997 | Haseley et al. |
| 5,611,674 A | 3/1997 | Bass et al. |
| 5,613,841 A | 3/1997 | Bass et al. |
| 5,615,071 A | 3/1997 | Higashikata et al. |
| 5,616,829 A | 4/1997 | Balaschak et al. |
| 5,623,834 A | 4/1997 | Bahel et al. |
| 5,628,201 A | 5/1997 | Bahel et al. |
| 5,630,325 A | 5/1997 | Bahel et al. |
| 5,635,896 A | 6/1997 | Tinsley et al. |
| 5,641,270 A | 6/1997 | Sgourakes et al. |
| 5,643,482 A | 7/1997 | Sandelman et al. |
| 5,650,936 A | 7/1997 | Loucks et al. |

(56) References Cited

U.S. PATENT DOCUMENTS

| | | |
|---|---|---|
| 5,655,379 A | 8/1997 | Jaster et al. |
| 5,655,380 A | 8/1997 | Calton |
| 5,656,765 A | 8/1997 | Gray |
| 5,656,767 A | 8/1997 | Garvey, III et al. |
| 5,666,815 A | 9/1997 | Aloise |
| 5,682,949 A | 11/1997 | Ratcliffe et al. |
| 5,684,463 A | 11/1997 | Diercks et al. |
| 5,689,963 A | 11/1997 | Bahel et al. |
| 5,691,692 A | 11/1997 | Herbstritt |
| 5,694,010 A | 12/1997 | Oomura et al. |
| 5,696,501 A | 12/1997 | Ouellette et al. |
| 5,699,670 A | 12/1997 | Jurewicz et al. |
| 5,706,007 A | 1/1998 | Fragnito et al. |
| 5,707,210 A | 1/1998 | Ramsey et al. |
| 5,711,785 A | 1/1998 | Maxwell |
| 5,713,724 A | 2/1998 | Centers et al. |
| 5,714,931 A | 2/1998 | Petite et al. |
| 5,715,704 A | 2/1998 | Cholkeri et al. |
| 5,718,822 A | 2/1998 | Richter |
| 5,724,571 A | 3/1998 | Woods |
| 5,729,474 A | 3/1998 | Hildebrand et al. |
| 5,737,931 A | 4/1998 | Ueno et al. |
| 5,741,120 A | 4/1998 | Bass et al. |
| 5,743,109 A | 4/1998 | Schulak |
| 5,745,114 A | 4/1998 | King et al. |
| 5,749,238 A | 5/1998 | Schmidt |
| 5,751,916 A | 5/1998 | Kon et al. |
| 5,752,385 A | 5/1998 | Nelson |
| 5,754,450 A | 5/1998 | Solomon et al. |
| 5,754,732 A | 5/1998 | Vlahu |
| 5,757,664 A | 5/1998 | Rogers et al. |
| 5,757,892 A | 5/1998 | Blanchard et al. |
| 5,761,083 A | 6/1998 | Brown, Jr. et al. |
| 5,764,509 A | 6/1998 | Gross et al. |
| 5,772,214 A | 6/1998 | Stark |
| 5,772,403 A | 6/1998 | Allison et al. |
| 5,782,101 A | 7/1998 | Dennis |
| 5,784,232 A | 7/1998 | Farr |
| 5,790,898 A | 8/1998 | Kishima et al. |
| 5,795,381 A | 8/1998 | Holder |
| 5,798,941 A | 8/1998 | McLeister |
| 5,802,860 A | 9/1998 | Barrows |
| 5,805,856 A | 9/1998 | Hanson |
| 5,807,336 A | 9/1998 | Russo et al. |
| 5,808,441 A | 9/1998 | Nehring |
| 5,810,908 A | 9/1998 | Gray et al. |
| 5,812,061 A | 9/1998 | Simons |
| 5,825,597 A | 10/1998 | Young |
| 5,827,963 A | 10/1998 | Selegatto et al. |
| 5,839,094 A | 11/1998 | French |
| 5,839,291 A | 11/1998 | Chang |
| 5,841,654 A | 11/1998 | Verissimo et al. |
| 5,857,348 A | 1/1999 | Conry |
| 5,860,286 A | 1/1999 | Tulpule |
| 5,861,807 A | 1/1999 | Leyden et al. |
| 5,867,998 A | 2/1999 | Guertin |
| 5,869,960 A | 2/1999 | Brand |
| 5,873,257 A | 2/1999 | Peterson |
| 5,875,430 A | 2/1999 | Koether |
| 5,875,638 A | 3/1999 | Tinsler |
| 5,884,494 A | 3/1999 | Okoren et al. |
| 5,887,786 A | 3/1999 | Sandelman |
| 5,900,801 A | 5/1999 | Heagle et al. |
| 5,904,049 A | 5/1999 | Jaster et al. |
| 5,918,200 A | 6/1999 | Tsutsui et al. |
| 5,924,295 A | 7/1999 | Park |
| 5,924,486 A | 7/1999 | Ehlers et al. |
| 5,926,103 A | 7/1999 | Petite |
| 5,926,531 A | 7/1999 | Petite |
| 5,930,773 A | 7/1999 | Crooks et al. |
| 5,934,087 A | 8/1999 | Watanabe et al. |
| 5,939,974 A | 8/1999 | Heagle et al. |
| 5,946,922 A | 9/1999 | Viard et al. |
| 5,947,693 A | 9/1999 | Yang |
| 5,947,701 A | 9/1999 | Hugenroth |
| 5,949,677 A | 9/1999 | Ho |
| 5,950,443 A | 9/1999 | Meyer et al. |
| 5,953,490 A | 9/1999 | Wiklund et al. |
| 5,956,658 A | 9/1999 | McMahon |
| 5,971,712 A | 10/1999 | Kann |
| 5,975,854 A | 11/1999 | Culp, III et al. |
| 5,984,645 A | 11/1999 | Cummings |
| 5,986,571 A | 11/1999 | Flick |
| 5,987,903 A | 11/1999 | Bathla |
| 5,988,986 A | 11/1999 | Brinken et al. |
| 5,995,347 A | 11/1999 | Rudd et al. |
| 5,995,351 A | 11/1999 | Katsumata et al. |
| 6,006,142 A | 12/1999 | Seem et al. |
| 6,006,171 A | 12/1999 | Vines et al. |
| 6,011,368 A | 1/2000 | Kalpathi et al. |
| 6,013,108 A | 1/2000 | Karolys et al. |
| 6,017,192 A | 1/2000 | Clack et al. |
| 6,020,702 A | 2/2000 | Farr |
| 6,023,420 A | 2/2000 | McCormick et al. |
| 6,026,651 A | 2/2000 | Sandelman |
| 6,028,522 A | 2/2000 | Petite |
| 6,035,653 A | 3/2000 | Itoh et al. |
| 6,035,661 A | 3/2000 | Sunaga et al. |
| 6,038,871 A | 3/2000 | Gutierrez et al. |
| 6,041,605 A | 3/2000 | Heinrichs |
| 6,041,609 A | 3/2000 | Hornsleth et al. |
| 6,041,856 A | 3/2000 | Thrasher et al. |
| 6,042,344 A | 3/2000 | Lifson |
| 6,044,062 A | 3/2000 | Brownrigg et al. |
| 6,047,557 A | 4/2000 | Pham et al. |
| 6,050,098 A | 4/2000 | Meyer et al. |
| 6,050,780 A | 4/2000 | Hasegawa et al. |
| 6,052,731 A | 4/2000 | Holdsworth et al. |
| 6,057,771 A | 5/2000 | Lakra |
| 6,065,946 A | 5/2000 | Lathrop |
| 6,068,447 A | 5/2000 | Foege |
| 6,070,110 A | 5/2000 | Shah et al. |
| 6,075,530 A | 6/2000 | Lucas et al. |
| 6,077,051 A | 6/2000 | Centers et al. |
| 6,081,750 A | 6/2000 | Hoffberg et al. |
| 6,082,495 A | 7/2000 | Steinbarger et al. |
| 6,082,971 A | 7/2000 | Gunn et al. |
| 6,085,530 A | 7/2000 | Barito |
| 6,088,659 A | 7/2000 | Kelley et al. |
| 6,088,688 A | 7/2000 | Crooks et al. |
| 6,092,370 A | 7/2000 | Tremoulet, Jr. et al. |
| 6,092,378 A | 7/2000 | Das et al. |
| 6,092,992 A | 7/2000 | Imblum et al. |
| 6,095,674 A | 8/2000 | Verissimo et al. |
| 6,098,893 A | 8/2000 | Berglund et al. |
| 6,102,665 A | 8/2000 | Centers et al. |
| 6,110,260 A | 8/2000 | Kubokawa |
| 6,119,949 A | 9/2000 | Lindstrom |
| 6,122,603 A | 9/2000 | Budike, Jr. |
| 6,125,642 A | 10/2000 | Seener et al. |
| 6,128,583 A | 10/2000 | Dowling |
| 6,128,953 A | 10/2000 | Mizukoshi |
| 6,129,527 A | 10/2000 | Donahoe et al. |
| 6,138,461 A | 10/2000 | Park et al. |
| 6,142,741 A | 11/2000 | Nishihata et al. |
| 6,144,888 A | 11/2000 | Lucas et al. |
| 6,145,328 A | 11/2000 | Choi |
| 6,147,601 A | 11/2000 | Sandelman et al. |
| 6,152,375 A | 11/2000 | Robison |
| 6,152,376 A | 11/2000 | Sandelman et al. |
| 6,153,942 A | 11/2000 | Roseman et al. |
| 6,153,993 A | 11/2000 | Oomura et al. |
| 6,154,488 A | 11/2000 | Hunt |
| 6,157,310 A | 12/2000 | Milne et al. |
| 6,158,230 A | 12/2000 | Katsuki |
| 6,160,477 A | 12/2000 | Sandelman et al. |
| 6,169,979 B1 | 1/2001 | Johnson |
| 6,172,476 B1 | 1/2001 | Tolbert, Jr. et al. |
| 6,174,136 B1 | 1/2001 | Kilayko et al. |
| 6,176,686 B1 | 1/2001 | Wallis et al. |
| 6,177,884 B1 | 1/2001 | Hunt et al. |
| 6,178,362 B1 | 1/2001 | Woolard et al. |
| 6,179,214 B1 | 1/2001 | Key et al. |
| 6,181,033 B1 | 1/2001 | Wright |

(56) References Cited

U.S. PATENT DOCUMENTS

| | | |
|---|---|---|
| 6,190,442 B1 | 2/2001 | Redner |
| 6,191,545 B1 | 2/2001 | Kawabata et al. |
| 6,192,282 B1 | 2/2001 | Smith et al. |
| 6,199,018 B1 | 3/2001 | Quist et al. |
| 6,211,782 B1 | 4/2001 | Sandelman et al. |
| 6,213,731 B1 | 4/2001 | Doepker et al. |
| 6,215,405 B1 | 4/2001 | Handley et al. |
| 6,216,956 B1 | 4/2001 | Ehlers et al. |
| 6,218,953 B1 | 4/2001 | Petite |
| 6,223,543 B1 | 5/2001 | Sandelman |
| 6,223,544 B1 | 5/2001 | Seem |
| 6,228,155 B1 | 5/2001 | Tai |
| 6,230,501 B1 | 5/2001 | Bailey, Sr. et al. |
| 6,233,327 B1 | 5/2001 | Petite |
| 6,234,019 B1 | 5/2001 | Caldeira |
| 6,240,733 B1 | 6/2001 | Brandon et al. |
| 6,240,736 B1 | 6/2001 | Fujita et al. |
| 6,244,061 B1 | 6/2001 | Takagi et al. |
| 6,249,516 B1 | 6/2001 | Brownrigg et al. |
| 6,260,004 B1 | 7/2001 | Hays et al. |
| 6,266,968 B1 | 7/2001 | Redlich |
| 6,268,664 B1 | 7/2001 | Rolls et al. |
| 6,272,868 B1 | 8/2001 | Grabon et al. |
| 6,276,901 B1 | 8/2001 | Farr et al. |
| 6,279,332 B1 | 8/2001 | Yeo et al. |
| 6,290,043 B1 | 9/2001 | Ginder et al. |
| 6,293,114 B1 | 9/2001 | Kamemoto |
| 6,293,767 B1 | 9/2001 | Bass |
| 6,302,654 B1 | 10/2001 | Millet et al. |
| 6,304,934 B1 | 10/2001 | Pimenta et al. |
| 6,324,854 B1 | 12/2001 | Jayanth |
| 6,327,541 B1 | 12/2001 | Pitchford et al. |
| 6,332,327 B1 | 12/2001 | Street et al. |
| 6,334,093 B1 | 12/2001 | More |
| 6,349,883 B1 | 2/2002 | Simmons et al. |
| 6,359,410 B1 | 3/2002 | Randolph |
| 6,360,551 B1 | 3/2002 | Renders |
| 6,366,889 B1 | 4/2002 | Zaloom |
| 6,375,439 B1 | 4/2002 | Missio |
| 6,378,315 B1 | 4/2002 | Gelber et al. |
| 6,381,971 B2 | 5/2002 | Honda |
| 6,385,510 B1 | 5/2002 | Hoog et al. |
| 6,389,823 B1 | 5/2002 | Loprete et al. |
| 6,390,779 B1 | 5/2002 | Cunkelman |
| 6,391,102 B1 | 5/2002 | Bodden et al. |
| 6,393,848 B2 | 5/2002 | Roh et al. |
| 6,397,606 B1 | 6/2002 | Roh et al. |
| 6,397,612 B1 | 6/2002 | Kernkamp et al. |
| 6,406,265 B1 | 6/2002 | Hahn et al. |
| 6,406,266 B1 | 6/2002 | Hugenroth et al. |
| 6,408,228 B1 | 6/2002 | Seem et al. |
| 6,408,258 B1 | 6/2002 | Richer |
| 6,412,293 B1 | 7/2002 | Pham et al. |
| 6,414,594 B1 | 7/2002 | Guerlain |
| 6,430,268 B1 | 8/2002 | Petite |
| 6,433,791 B2 | 8/2002 | Selli et al. |
| 6,437,691 B1 | 8/2002 | Sandelman et al. |
| 6,437,692 B1 | 8/2002 | Petite et al. |
| 6,438,981 B1 | 8/2002 | Whiteside |
| 6,442,953 B1 | 9/2002 | Trigiani et al. |
| 6,449,972 B2 | 9/2002 | Pham et al. |
| 6,450,771 B1 | 9/2002 | Centers et al. |
| 6,451,210 B1 | 9/2002 | Sivavec et al. |
| 6,453,687 B2 | 9/2002 | Sharood et al. |
| 6,454,177 B1 | 9/2002 | Sasao et al. |
| 6,454,538 B1 | 9/2002 | Witham et al. |
| 6,456,928 B1 | 9/2002 | Johnson |
| 6,457,319 B1 | 10/2002 | Ota et al. |
| 6,457,948 B1 | 10/2002 | Pham |
| 6,460,731 B2 | 10/2002 | Estelle et al. |
| 6,462,654 B1 | 10/2002 | Sandelman et al. |
| 6,463,747 B1 | 10/2002 | Temple |
| 6,466,971 B1 | 10/2002 | Humpleman et al. |
| 6,467,280 B2 | 10/2002 | Pham et al. |
| 6,471,486 B1 | 10/2002 | Centers et al. |
| 6,474,084 B2 | 11/2002 | Gauthier et al. |
| 6,484,520 B2 | 11/2002 | Kawaguchi et al. |
| 6,487,457 B1 | 11/2002 | Hull et al. |
| 6,490,506 B1 | 12/2002 | March |
| 6,492,923 B1 | 12/2002 | Inoue et al. |
| 6,497,554 B2 | 12/2002 | Yang et al. |
| 6,501,240 B2 | 12/2002 | Ueda et al. |
| 6,501,629 B1 | 12/2002 | Marriott |
| 6,502,409 B1 | 1/2003 | Gatling et al. |
| 6,505,087 B1 | 1/2003 | Lucas et al. |
| 6,505,475 B1 | 1/2003 | Zugibe et al. |
| 6,510,350 B1 | 1/2003 | Steen, III et al. |
| 6,522,974 B2 | 2/2003 | Sitton |
| 6,523,130 B1 | 2/2003 | Hickman et al. |
| 6,526,766 B1 | 3/2003 | Hiraoka et al. |
| 6,529,590 B1 | 3/2003 | Centers |
| 6,529,839 B1 | 3/2003 | Uggerud et al. |
| 6,533,552 B2 | 3/2003 | Centers et al. |
| 6,535,123 B2 | 3/2003 | Sandelman et al. |
| 6,535,270 B1 | 3/2003 | Murayama |
| 6,535,859 B1 | 3/2003 | Yablonowski et al. |
| 6,537,034 B2 | 3/2003 | Park et al. |
| 6,542,062 B1 | 4/2003 | Herrick |
| 6,549,135 B2 | 4/2003 | Singh et al. |
| 6,551,069 B2 | 4/2003 | Narney, II et al. |
| 6,553,774 B1 | 4/2003 | Ishio et al. |
| 6,558,126 B1 | 5/2003 | Hahn et al. |
| 6,560,976 B2 | 5/2003 | Jayanth |
| 6,571,280 B1 | 5/2003 | Hubacher |
| 6,571,566 B1 | 6/2003 | Temple et al. |
| 6,571,586 B1 | 6/2003 | Ritson et al. |
| 6,574,561 B2 | 6/2003 | Alexander et al. |
| 6,577,959 B1 | 6/2003 | Chajec et al. |
| 6,577,962 B1 | 6/2003 | Afshari |
| 6,578,373 B1 | 6/2003 | Barbier |
| 6,583,720 B1 | 6/2003 | Quigley |
| 6,589,029 B1 | 7/2003 | Heller |
| 6,591,620 B2 | 7/2003 | Kikuchi et al. |
| 6,595,475 B2 | 7/2003 | Svabek et al. |
| 6,595,757 B2 | 7/2003 | Shen |
| 6,598,056 B1 | 7/2003 | Hull et al. |
| 6,601,397 B2 | 8/2003 | Pham et al. |
| 6,604,093 B1 | 8/2003 | Etzion et al. |
| 6,609,070 B1 | 8/2003 | Lueck |
| 6,609,078 B2 | 8/2003 | Starling et al. |
| 6,615,594 B2 | 9/2003 | Jayanth et al. |
| 6,616,415 B1 | 9/2003 | Renken et al. |
| 6,618,578 B1 | 9/2003 | Petite |
| 6,618,709 B1 | 9/2003 | Sneeringer |
| 6,621,443 B1 | 9/2003 | Selli et al. |
| 6,622,925 B2 | 9/2003 | Carner et al. |
| 6,622,926 B1 | 9/2003 | Sartain et al. |
| 6,628,764 B1 | 9/2003 | Petite |
| 6,629,420 B2 | 10/2003 | Renders |
| 6,631,298 B1 | 10/2003 | Pagnano et al. |
| 6,636,893 B1 | 10/2003 | Fong |
| 6,643,567 B2 | 11/2003 | Kolk et al. |
| 6,644,848 B1 | 11/2003 | Clayton et al. |
| 6,647,735 B2 | 11/2003 | Street et al. |
| 6,658,373 B2 | 12/2003 | Rossi et al. |
| 6,662,584 B1 | 12/2003 | Whiteside |
| 6,662,653 B1 | 12/2003 | Scaliante et al. |
| 6,671,586 B2 | 12/2003 | Davis et al. |
| 6,672,846 B2 | 1/2004 | Rajendran et al. |
| 6,675,591 B2 | 1/2004 | Singh et al. |
| 6,679,072 B2 | 1/2004 | Pham et al. |
| 6,684,349 B2 | 1/2004 | Gullo et al. |
| 6,685,438 B2 | 2/2004 | Yoo et al. |
| 6,698,218 B2 | 3/2004 | Goth et al. |
| 6,701,725 B2 | 3/2004 | Rossi et al. |
| 6,708,083 B2 | 3/2004 | Orthlieb et al. |
| 6,708,508 B2 | 3/2004 | Demuth et al. |
| 6,709,244 B2 | 3/2004 | Pham |
| 6,711,470 B1 | 3/2004 | Hartenstein et al. |
| 6,711,911 B1 | 3/2004 | Grabon et al. |
| 6,717,513 B1 | 4/2004 | Sandelman et al. |
| 6,721,770 B1 | 4/2004 | Morton et al. |
| 6,725,182 B2 | 4/2004 | Pagnano et al. |
| 6,732,538 B2 | 5/2004 | Trigiani et al. |

(56) References Cited

U.S. PATENT DOCUMENTS

| | | |
|---|---|---|
| 6,745,107 B1 | 6/2004 | Miller |
| 6,747,557 B1 | 6/2004 | Petite et al. |
| 6,758,050 B2 | 7/2004 | Jayanth et al. |
| 6,758,051 B2 | 7/2004 | Jayanth et al. |
| 6,760,207 B2 | 7/2004 | Wyatt et al. |
| 6,772,096 B2 | 8/2004 | Murakami et al. |
| 6,772,598 B1 | 8/2004 | Rinehart |
| 6,775,995 B1 | 8/2004 | Bahel et al. |
| 6,784,807 B2 | 8/2004 | Petite et al. |
| 6,785,592 B1 | 8/2004 | Smith et al. |
| 6,786,473 B1 | 9/2004 | Alles |
| 6,799,951 B2 | 10/2004 | Lifson et al. |
| 6,804,993 B2 | 10/2004 | Selli |
| 6,811,380 B2 | 11/2004 | Kim |
| 6,813,897 B1 | 11/2004 | Bash et al. |
| 6,816,811 B2 | 11/2004 | Seem |
| 6,823,680 B2 | 11/2004 | Jayanth |
| 6,829,542 B1 | 12/2004 | Reynolds et al. |
| 6,832,120 B1 | 12/2004 | Frank et al. |
| 6,832,898 B2 | 12/2004 | Yoshida et al. |
| 6,836,737 B2 | 12/2004 | Petite et al. |
| 6,837,922 B2 | 1/2005 | Gorin |
| 6,839,790 B2 | 1/2005 | Barros De Almeida et al. |
| 6,854,345 B2 | 2/2005 | Alves et al. |
| 6,862,498 B2 | 3/2005 | Davis et al. |
| 6,868,678 B2 | 3/2005 | Mei et al. |
| 6,868,686 B2 | 3/2005 | Ueda et al. |
| 6,869,272 B2 | 3/2005 | Odachi et al. |
| 6,870,486 B2 | 3/2005 | Souza et al. |
| 6,885,949 B2 | 4/2005 | Selli |
| 6,889,173 B2 | 5/2005 | Singh |
| 6,891,838 B1 | 5/2005 | Petite et al. |
| 6,892,546 B2 | 5/2005 | Singh et al. |
| 6,897,772 B1 | 5/2005 | Scheffler et al. |
| 6,900,738 B2 | 5/2005 | Crichlow |
| 6,901,066 B1 | 5/2005 | Helgeson |
| 6,904,385 B1 | 6/2005 | Budike, Jr. |
| 6,914,533 B2 | 7/2005 | Petite |
| 6,914,893 B2 | 7/2005 | Petite |
| 6,922,155 B1 | 7/2005 | Evans et al. |
| 6,931,445 B2 | 8/2005 | Davis |
| 6,934,862 B2 | 8/2005 | Sharood et al. |
| 6,952,658 B2 | 10/2005 | Greulich et al. |
| 6,956,344 B2 | 10/2005 | Robertson et al. |
| 6,964,558 B2 | 11/2005 | Hahn et al. |
| 6,966,759 B2 | 11/2005 | Hahn et al. |
| 6,968,295 B1 | 11/2005 | Carr |
| 6,973,410 B2 | 12/2005 | Seigel |
| 6,973,793 B2 | 12/2005 | Douglas et al. |
| 6,973,794 B2 | 12/2005 | Street et al. |
| 6,976,366 B2 | 12/2005 | Starling et al. |
| 6,978,225 B2 | 12/2005 | Retlich et al. |
| 6,981,384 B2 | 1/2006 | Dobmeier et al. |
| 6,983,321 B2 | 1/2006 | Trinon et al. |
| 6,983,889 B2 | 1/2006 | Alles |
| 6,986,469 B2 | 1/2006 | Gauthier et al. |
| 6,987,450 B2 | 1/2006 | Marino et al. |
| 6,990,821 B2 | 1/2006 | Singh et al. |
| 6,992,452 B1 | 1/2006 | Sachs et al. |
| 6,996,441 B1 | 2/2006 | Tobias |
| 6,997,390 B2 | 2/2006 | Alles |
| 6,998,807 B2 | 2/2006 | Phillips et al. |
| 6,998,963 B2 | 2/2006 | Flen et al. |
| 6,999,996 B2 | 2/2006 | Sunderland |
| 7,000,422 B2 | 2/2006 | Street et al. |
| 7,003,378 B2 | 2/2006 | Poth |
| 7,009,510 B1 | 3/2006 | Douglass et al. |
| 7,010,925 B2 | 3/2006 | Sienel et al. |
| 7,019,667 B2 | 3/2006 | Petite et al. |
| 7,024,665 B2 | 4/2006 | Ferraz et al. |
| 7,024,870 B2 | 4/2006 | Singh et al. |
| 7,030,752 B2 | 4/2006 | Tyroler |
| 7,031,880 B1 | 4/2006 | Seem et al. |
| 7,035,693 B2 | 4/2006 | Cassiolato et al. |
| 7,039,532 B2 | 5/2006 | Hunter |
| 7,042,180 B2 | 5/2006 | Terry et al. |
| 7,042,350 B2 | 5/2006 | Patrick et al. |
| 7,043,339 B2 | 5/2006 | Maeda et al. |
| 7,043,459 B2 | 5/2006 | Peevey |
| 7,047,753 B2 | 5/2006 | Street et al. |
| 7,053,766 B2 | 5/2006 | Fisler et al. |
| 7,053,767 B2 | 5/2006 | Petite et al. |
| 7,054,271 B2 | 5/2006 | Brownrigg et al. |
| 7,062,580 B2 | 6/2006 | Donaires |
| 7,062,830 B2 | 6/2006 | Alles |
| 7,063,537 B2 | 6/2006 | Selli et al. |
| 7,072,797 B2 | 7/2006 | Gorinevsky |
| 7,075,327 B2 | 7/2006 | Dimino et al. |
| 7,079,810 B2 | 7/2006 | Petite et al. |
| 7,079,967 B2 | 7/2006 | Rossi et al. |
| 7,082,380 B2 | 7/2006 | Wiebe et al. |
| 7,089,125 B2 | 8/2006 | Sonderegger |
| 7,091,847 B2 | 8/2006 | Capowski et al. |
| 7,092,767 B2 | 8/2006 | Pagnano et al. |
| 7,092,794 B1 | 8/2006 | Hill et al. |
| 7,096,153 B2 | 8/2006 | Guralnik et al. |
| 7,102,490 B2 | 9/2006 | Flen et al. |
| 7,103,511 B2 | 9/2006 | Petite |
| 7,110,843 B2 | 9/2006 | Pagnano et al. |
| 7,110,898 B2 | 9/2006 | Montijo et al. |
| 7,113,376 B2 | 9/2006 | Nomura et al. |
| 7,114,343 B2 | 10/2006 | Kates |
| 7,123,020 B2 | 10/2006 | Hill et al. |
| 7,123,458 B2 | 10/2006 | Mohr et al. |
| 7,124,728 B2 | 10/2006 | Carey et al. |
| 7,126,465 B2 | 10/2006 | Faltesek |
| 7,130,170 B2 | 10/2006 | Wakefield et al. |
| 7,130,832 B2 | 10/2006 | Bannai et al. |
| 7,134,295 B2 | 11/2006 | Maekawa |
| 7,137,550 B1 | 11/2006 | Petite |
| 7,142,125 B2 | 11/2006 | Larson et al. |
| 7,145,438 B2 | 12/2006 | Flen et al. |
| 7,145,462 B2 | 12/2006 | Dewing et al. |
| 7,159,408 B2 | 1/2007 | Sadegh et al. |
| 7,162,884 B2 | 1/2007 | Alles |
| 7,163,158 B2 | 1/2007 | Rossi et al. |
| 7,171,372 B2 | 1/2007 | Daniel et al. |
| 7,174,728 B2 | 2/2007 | Jayanth |
| 7,180,412 B2 | 2/2007 | Bonicatto et al. |
| 7,184,861 B2 | 2/2007 | Petite |
| 7,188,482 B2 | 3/2007 | Sadegh et al. |
| 7,188,779 B2 | 3/2007 | Alles |
| 7,201,006 B2 | 4/2007 | Kates |
| 7,207,496 B2 | 4/2007 | Alles |
| 7,209,840 B2 | 4/2007 | Petite et al. |
| 7,212,887 B2 | 5/2007 | Shah et al |
| 7,222,493 B2 | 5/2007 | Jayanth et al. |
| 7,224,740 B2 | 5/2007 | Hunt |
| 7,225,193 B2 | 5/2007 | Mets et al. |
| 7,227,450 B2 | 6/2007 | Garvy et al. |
| 7,228,691 B2 | 6/2007 | Street et al. |
| 7,230,528 B2 | 6/2007 | Kates |
| 7,234,313 B2 | 6/2007 | Bell et al. |
| 7,236,765 B2 | 6/2007 | Bonicatto et al. |
| 7,244,294 B2 | 7/2007 | Kates |
| 7,246,014 B2 | 7/2007 | Forth et al. |
| 7,255,285 B2 | 8/2007 | Troost et al. |
| 7,257,501 B2 | 8/2007 | Zhan et al. |
| 7,260,505 B2 | 8/2007 | Felke et al. |
| 7,261,762 B2 | 8/2007 | Kang et al. |
| 7,263,073 B2 | 8/2007 | Petite et al. |
| 7,263,446 B2 | 8/2007 | Morin et al. |
| 7,266,812 B2 | 9/2007 | Pagnano |
| 7,270,278 B2 | 9/2007 | Street et al. |
| 7,274,995 B2 | 9/2007 | Zhan et al. |
| 7,275,377 B2 | 10/2007 | Kates |
| 7,286,945 B2 | 10/2007 | Zhan et al. |
| 7,290,398 B2 | 11/2007 | Wallace et al. |
| 7,290,989 B2 | 11/2007 | Jayanth |
| 7,295,128 B2 | 11/2007 | Petite |
| 7,295,896 B2 | 11/2007 | Norbeck |
| 7,317,952 B2 | 1/2008 | Bhandiwad et al. |
| 7,328,192 B1 | 2/2008 | Stengard et al. |
| 7,330,886 B2 | 2/2008 | Childers et al. |

(56) References Cited

U.S. PATENT DOCUMENTS

| | | |
|---|---|---|
| 7,331,187 B2 | 2/2008 | Kates |
| 7,336,168 B2 | 2/2008 | Kates |
| 7,337,191 B2 | 2/2008 | Haeberle et al. |
| 7,343,750 B2 | 3/2008 | Lifson et al. |
| 7,343,751 B2 | 3/2008 | Kates |
| 7,346,463 B2 | 3/2008 | Petite et al. |
| 7,346,472 B1 | 3/2008 | Moskowitz et al. |
| 7,349,824 B2 | 3/2008 | Seigel |
| 7,350,112 B2 | 3/2008 | Fox et al. |
| 7,351,274 B2 | 4/2008 | Helt et al. |
| 7,352,545 B2 | 4/2008 | Wyatt et al. |
| 7,363,200 B2 | 4/2008 | Lu |
| 7,376,712 B1 | 5/2008 | Granatelli et al. |
| 7,377,118 B2 | 5/2008 | Esslinger |
| 7,383,030 B2 | 6/2008 | Brown et al. |
| 7,383,158 B2 | 6/2008 | Krocker et al. |
| 7,392,661 B2 | 7/2008 | Alles |
| 7,397,907 B2 | 7/2008 | Petite |
| 7,400,240 B2 | 7/2008 | Shrode et al. |
| 7,412,842 B2 | 8/2008 | Pham |
| 7,414,525 B2 | 8/2008 | Costea et al. |
| 7,421,351 B2 | 9/2008 | Navratil |
| 7,421,374 B2 | 9/2008 | Zhan et al. |
| 7,421,850 B2 | 9/2008 | Street et al. |
| 7,424,343 B2 | 9/2008 | Kates |
| 7,424,345 B2 | 9/2008 | Norbeck |
| 7,424,527 B2 | 9/2008 | Petite |
| 7,432,824 B2 | 10/2008 | Flen et al. |
| 7,433,854 B2 | 10/2008 | Joseph et al. |
| 7,434,742 B2 | 10/2008 | Mueller et al. |
| 7,437,150 B1 | 10/2008 | Morelli et al. |
| 7,440,560 B1 | 10/2008 | Barry |
| 7,440,767 B2 | 10/2008 | Ballay et al. |
| 7,443,313 B2 | 10/2008 | Davis et al. |
| 7,444,251 B2 | 10/2008 | Nikovski et al. |
| 7,445,665 B2 | 11/2008 | Hsieh et al. |
| 7,447,603 B2 | 11/2008 | Bruno |
| 7,447,609 B2 | 11/2008 | Guralnik et al. |
| 7,451,606 B2 | 11/2008 | Harrod |
| 7,454,439 B1 | 11/2008 | Gansner et al. |
| 7,458,223 B2 | 12/2008 | Pham |
| 7,468,661 B2 | 12/2008 | Petite et al. |
| 7,469,546 B2 | 12/2008 | Kates |
| 7,474,992 B2 | 1/2009 | Ariyur |
| 7,480,501 B2 | 1/2009 | Petite |
| 7,483,810 B2 | 1/2009 | Jackson et al. |
| 7,484,376 B2 | 2/2009 | Pham |
| 7,490,477 B2 | 2/2009 | Singh et al. |
| 7,491,034 B2 | 2/2009 | Jayanth |
| 7,503,182 B2 | 3/2009 | Bahel et al. |
| 7,510,126 B2 | 3/2009 | Rossi et al. |
| 7,523,619 B2 | 4/2009 | Kojima et al. |
| 7,528,711 B2 | 5/2009 | Kates |
| 7,533,070 B2 | 5/2009 | Guralnik et al. |
| 7,537,172 B2 | 5/2009 | Rossi et al. |
| 7,552,030 B2 | 6/2009 | Guralnik et al. |
| 7,555,364 B2 | 6/2009 | Poth et al. |
| 7,574,333 B2 | 8/2009 | Lu |
| 7,580,812 B2 | 8/2009 | Ariyur et al. |
| 7,594,407 B2 | 9/2009 | Singh et al. |
| 7,596,959 B2 | 10/2009 | Singh et al. |
| 7,606,683 B2 | 10/2009 | Bahel et al. |
| 7,631,508 B2 | 12/2009 | Braun et al. |
| 7,636,901 B2 | 12/2009 | Munson et al. |
| 7,644,591 B2 | 1/2010 | Singh et al. |
| 7,648,077 B2 | 1/2010 | Rossi et al. |
| 7,648,342 B2 | 1/2010 | Jayanth |
| 7,650,425 B2 | 1/2010 | Davis et al. |
| 7,660,700 B2 | 2/2010 | Moskowitz et al. |
| 7,660,774 B2 | 2/2010 | Mukherjee et al. |
| 7,664,613 B2 | 2/2010 | Hansen |
| 7,665,315 B2 | 2/2010 | Singh et al. |
| 7,686,872 B2 | 3/2010 | Kang |
| 7,693,809 B2 | 4/2010 | Gray |
| 7,697,492 B2 | 4/2010 | Petite |
| 7,703,694 B2 | 4/2010 | Mueller et al. |
| 7,704,052 B2 | 4/2010 | Iimura et al. |
| 7,706,320 B2 | 4/2010 | Davis et al. |
| 7,724,131 B2 | 5/2010 | Chen |
| 7,726,583 B2 | 6/2010 | Maekawa |
| 7,734,451 B2 | 6/2010 | MacArthur et al. |
| 7,738,999 B2 | 6/2010 | Petite |
| 7,739,378 B2 | 6/2010 | Petite |
| 7,742,393 B2 | 6/2010 | Bonicatto et al. |
| 7,752,853 B2 | 7/2010 | Singh et al. |
| 7,752,854 B2 | 7/2010 | Singh et al. |
| 7,756,086 B2 | 7/2010 | Petite et al. |
| 7,791,468 B2 | 9/2010 | Bonicatto et al. |
| 7,844,366 B2 | 11/2010 | Singh |
| 7,845,179 B2 | 12/2010 | Singh et al. |
| 7,848,827 B2 | 12/2010 | Chen |
| 7,848,900 B2 | 12/2010 | Steinberg et al. |
| 7,877,218 B2 | 1/2011 | Bonicatto et al. |
| 7,885,959 B2 | 2/2011 | Horowitz et al. |
| 7,885,961 B2 | 2/2011 | Horowitz et al. |
| 7,905,098 B2 | 3/2011 | Pham |
| 7,908,116 B2 | 3/2011 | Steinberg et al. |
| 7,908,117 B2 | 3/2011 | Steinberg et al. |
| 7,922,914 B1 | 4/2011 | Verdegan et al. |
| 7,937,623 B2 | 5/2011 | Ramacher et al. |
| 7,941,294 B2 | 5/2011 | Shahi et al. |
| 7,949,494 B2 | 5/2011 | Moskowitz et al. |
| 7,949,615 B2 | 5/2011 | Ehlers et al. |
| 7,963,454 B2 | 6/2011 | Sullivan et al. |
| 7,966,152 B2 | 6/2011 | Stluka et al. |
| 7,967,218 B2 | 6/2011 | Alles |
| 7,978,059 B2 | 7/2011 | Petite et al. |
| 7,987,679 B2 | 8/2011 | Tanaka et al. |
| 7,996,045 B1 | 8/2011 | Bauer et al. |
| 7,999,668 B2 | 8/2011 | Cawthorne et al. |
| 8,000,314 B2 | 8/2011 | Brownrigg et al. |
| 8,002,199 B2 | 8/2011 | Habegger |
| 8,005,640 B2 | 8/2011 | Chiefetz et al. |
| 8,010,237 B2 | 8/2011 | Cheung et al. |
| 8,013,732 B2 | 9/2011 | Petite et al. |
| 8,019,567 B2 | 9/2011 | Steinberg et al. |
| 8,029,608 B1 | 10/2011 | Breslin |
| 8,031,650 B2 | 10/2011 | Petite et al. |
| 8,034,170 B2 | 10/2011 | Kates |
| 8,036,844 B2 | 10/2011 | Ling et al. |
| 8,040,231 B2 | 10/2011 | Kuruvila et al. |
| 8,041,539 B2 | 10/2011 | Guralnik et al. |
| 8,046,107 B2 | 10/2011 | Zugibe et al. |
| 8,061,417 B2 | 11/2011 | Gray |
| 8,064,412 B2 | 11/2011 | Petite |
| 8,065,886 B2 | 11/2011 | Singh et al. |
| 8,068,997 B2 | 11/2011 | Ling et al. |
| 8,090,477 B1 | 1/2012 | Steinberg |
| 8,090,559 B2 | 1/2012 | Parthasarathy et al. |
| 8,090,824 B2 | 1/2012 | Tran et al. |
| 8,095,337 B2 | 1/2012 | Kolbet et al. |
| 8,108,200 B2 | 1/2012 | Anne et al. |
| 8,125,230 B2 | 2/2012 | Bharadwaj et al. |
| 8,131,497 B2 | 3/2012 | Steinberg et al. |
| 8,131,506 B2 | 3/2012 | Steinberg et al. |
| 8,134,330 B2 | 3/2012 | Alles |
| 8,150,720 B2 | 4/2012 | Singh et al. |
| 8,156,208 B2 | 4/2012 | Bornhoevd et al. |
| 8,160,827 B2 | 4/2012 | Jayanth et al. |
| 8,170,968 B2 | 5/2012 | Colclough et al. |
| 8,171,136 B2 | 5/2012 | Petite |
| 8,175,846 B2 | 5/2012 | Khalak et al. |
| 8,180,492 B2 | 5/2012 | Steinberg |
| 8,182,579 B2 | 5/2012 | Woo et al. |
| 8,214,175 B2 | 7/2012 | Moskowitz et al. |
| 8,228,648 B2 | 7/2012 | Jayanth et al. |
| 8,239,922 B2 | 8/2012 | Sullivan et al. |
| 8,258,763 B2 | 9/2012 | Nakamura et al. |
| 8,279,565 B2 | 10/2012 | Hall et al. |
| 8,280,536 B1 | 10/2012 | Fadell et al. |
| 8,328,524 B2 | 12/2012 | Iimura et al. |
| 8,335,657 B2 | 12/2012 | Jayanth et al. |
| 8,380,556 B2 | 2/2013 | Singh et al. |
| 8,393,169 B2 | 3/2013 | Pham |

(56) References Cited

U.S. PATENT DOCUMENTS

| | | | |
|---|---|---|---|
| 9,168,315 B1 * | 10/2015 | Scaringe | F25B 49/02 |
| 9,310,439 B2 * | 4/2016 | Pham | G01R 31/343 |
| 2001/0005320 A1 | 6/2001 | Ueda et al. | |
| 2001/0025349 A1 | 9/2001 | Sharood et al. | |
| 2001/0054291 A1 | 12/2001 | Roh et al. | |
| 2001/0054293 A1 | 12/2001 | Gustafson et al. | |
| 2001/0054294 A1 | 12/2001 | Tsuboi | |
| 2002/0000092 A1 | 1/2002 | Sharood et al. | |
| 2002/0013679 A1 | 1/2002 | Petite | |
| 2002/0016639 A1 | 2/2002 | Smith et al. | |
| 2002/0017057 A1 | 2/2002 | Weder | |
| 2002/0018724 A1 | 2/2002 | Millet et al. | |
| 2002/0020175 A1 | 2/2002 | Street et al. | |
| 2002/0029575 A1 | 3/2002 | Okamoto | |
| 2002/0031101 A1 | 3/2002 | Petite et al. | |
| 2002/0035495 A1 | 3/2002 | Spira et al. | |
| 2002/0040280 A1 | 4/2002 | Morgan | |
| 2002/0064463 A1 | 5/2002 | Park et al. | |
| 2002/0067999 A1 | 6/2002 | Suitou et al. | |
| 2002/0082747 A1 | 6/2002 | Kramer | |
| 2002/0082924 A1 | 6/2002 | Koether | |
| 2002/0093259 A1 | 7/2002 | Sunaga et al. | |
| 2002/0095269 A1 | 7/2002 | Natalini et al. | |
| 2002/0103655 A1 | 8/2002 | Boies et al. | |
| 2002/0113877 A1 | 8/2002 | Welch | |
| 2002/0117992 A1 | 8/2002 | Hirono et al. | |
| 2002/0118106 A1 | 8/2002 | Brenn | |
| 2002/0127120 A1 | 9/2002 | Hahn et al. | |
| 2002/0138217 A1 | 9/2002 | Shen et al. | |
| 2002/0139128 A1 | 10/2002 | Suzuki et al. | |
| 2002/0143482 A1 | 10/2002 | Karanam et al. | |
| 2002/0152298 A1 | 10/2002 | Kikta et al. | |
| 2002/0157408 A1 | 10/2002 | Egawa et al. | |
| 2002/0157409 A1 | 10/2002 | Pham et al. | |
| 2002/0159890 A1 | 10/2002 | Kajiwara et al. | |
| 2002/0161545 A1 | 10/2002 | Starling et al. | |
| 2002/0163436 A1 | 11/2002 | Singh et al. | |
| 2002/0170299 A1 | 11/2002 | Jayanth et al. | |
| 2002/0173929 A1 | 11/2002 | Seigel | |
| 2002/0187057 A1 | 12/2002 | Loprete et al. | |
| 2002/0189267 A1 | 12/2002 | Singh et al. | |
| 2002/0193890 A1 | 12/2002 | Pouchak | |
| 2002/0198629 A1 | 12/2002 | Ellis | |
| 2003/0004660 A1 | 1/2003 | Hunter | |
| 2003/0004765 A1 | 1/2003 | Wiegand | |
| 2003/0005710 A1 | 1/2003 | Singh et al. | |
| 2003/0006884 A1 | 1/2003 | Hunt | |
| 2003/0014218 A1 | 1/2003 | Trigiani et al. | |
| 2003/0019221 A1 | 1/2003 | Rossi et al. | |
| 2003/0036810 A1 | 2/2003 | Petite | |
| 2003/0037555 A1 | 2/2003 | Street et al. | |
| 2003/0050737 A1 | 3/2003 | Osann | |
| 2003/0050824 A1 | 3/2003 | Suermondt et al. | |
| 2003/0051490 A1 | 3/2003 | Jayanth | |
| 2003/0055603 A1 | 3/2003 | Rossi et al. | |
| 2003/0055663 A1 | 3/2003 | Struble | |
| 2003/0063983 A1 | 4/2003 | Ancel et al. | |
| 2003/0070438 A1 | 4/2003 | Kikuchi et al. | |
| 2003/0070544 A1 | 4/2003 | Mulvaney et al. | |
| 2003/0074285 A1 | 4/2003 | Hoffman et al. | |
| 2003/0077179 A1 | 4/2003 | Collins et al. | |
| 2003/0078677 A1 | 4/2003 | Hull et al. | |
| 2003/0078742 A1 | 4/2003 | VanderZee et al. | |
| 2003/0089493 A1 | 5/2003 | Takano et al. | |
| 2003/0094004 A1 | 5/2003 | Pham et al. | |
| 2003/0108430 A1 | 6/2003 | Yoshida et al. | |
| 2003/0115890 A1 | 6/2003 | Jayanth et al. | |
| 2003/0135786 A1 | 7/2003 | Vollmar et al. | |
| 2003/0137396 A1 | 7/2003 | Durej et al. | |
| 2003/0150924 A1 | 8/2003 | Peter | |
| 2003/0150926 A1 | 8/2003 | Rosen | |
| 2003/0150927 A1 | 8/2003 | Rosen | |
| 2003/0171851 A1 | 9/2003 | Brickfield et al. | |
| 2003/0183085 A1 | 10/2003 | Alexander | |
| 2003/0191606 A1 | 10/2003 | Fujiyama et al. | |
| 2003/0199247 A1 | 10/2003 | Striemer | |
| 2003/0205143 A1 | 11/2003 | Cheng | |
| 2003/0213851 A1 | 11/2003 | Burd et al. | |
| 2003/0216837 A1 | 11/2003 | Reich et al. | |
| 2003/0216888 A1 | 11/2003 | Ridolfo | |
| 2003/0233172 A1 | 12/2003 | Granqvist et al. | |
| 2004/0016241 A1 | 1/2004 | Street et al. | |
| 2004/0016244 A1 | 1/2004 | Street et al. | |
| 2004/0016251 A1 | 1/2004 | Street et al. | |
| 2004/0016253 A1 | 1/2004 | Street et al. | |
| 2004/0019584 A1 | 1/2004 | Greening et al. | |
| 2004/0024495 A1 | 2/2004 | Sunderland | |
| 2004/0026522 A1 | 2/2004 | Keen et al. | |
| 2004/0037706 A1 | 2/2004 | Hahn et al. | |
| 2004/0042904 A1 | 3/2004 | Kim | |
| 2004/0047406 A1 | 3/2004 | Hunt | |
| 2004/0049715 A1 | 3/2004 | Jaw | |
| 2004/0059691 A1 | 3/2004 | Higgins | |
| 2004/0068390 A1 | 4/2004 | Saunders | |
| 2004/0078695 A1 | 4/2004 | Bowers et al. | |
| 2004/0079093 A1 | 4/2004 | Gauthier et al. | |
| 2004/0093879 A1 | 5/2004 | Street et al. | |
| 2004/0095237 A1 | 5/2004 | Chen et al. | |
| 2004/0111186 A1 | 6/2004 | Rossi et al. | |
| 2004/0117166 A1 | 6/2004 | Cassiolato | |
| 2004/0133314 A1 | 7/2004 | Ehlers et al. | |
| 2004/0133367 A1 | 7/2004 | Hart | |
| 2004/0140772 A1 | 7/2004 | Gullo et al. | |
| 2004/0140812 A1 | 7/2004 | Scallante et al. | |
| 2004/0144106 A1 | 7/2004 | Douglas et al. | |
| 2004/0153437 A1 | 8/2004 | Buchan | |
| 2004/0159113 A1 | 8/2004 | Singh et al. | |
| 2004/0159114 A1 | 8/2004 | Demuth et al. | |
| 2004/0183687 A1 | 9/2004 | Petite et al. | |
| 2004/0184627 A1 | 9/2004 | Kost et al. | |
| 2004/0184928 A1 | 9/2004 | Millet et al. | |
| 2004/0184929 A1 | 9/2004 | Millet et al. | |
| 2004/0184930 A1 | 9/2004 | Millet et al. | |
| 2004/0184931 A1 | 9/2004 | Millet et al. | |
| 2004/0187502 A1 | 9/2004 | Jayanth et al. | |
| 2004/0191073 A1 | 9/2004 | Iimura et al. | |
| 2004/0210419 A1 | 10/2004 | Wiebe et al. | |
| 2004/0213384 A1 | 10/2004 | Alles et al. | |
| 2004/0230582 A1 | 11/2004 | Pagnano et al. | |
| 2004/0230899 A1 | 11/2004 | Pagnano et al. | |
| 2004/0239266 A1 | 12/2004 | Lee et al. | |
| 2004/0258542 A1 | 12/2004 | Wiertz et al. | |
| 2004/0261431 A1 | 12/2004 | Singh et al. | |
| 2005/0040249 A1 | 2/2005 | Wacker et al. | |
| 2005/0043923 A1 | 2/2005 | Forster et al. | |
| 2005/0053471 A1 | 3/2005 | Hong et al. | |
| 2005/0056031 A1 | 3/2005 | Jeong | |
| 2005/0066675 A1 | 3/2005 | Manole et al. | |
| 2005/0073532 A1 | 4/2005 | Scott et al. | |
| 2005/0086341 A1 | 4/2005 | Enga et al. | |
| 2005/0100449 A1 | 5/2005 | Hahn et al. | |
| 2005/0103036 A1 | 5/2005 | Maekawa | |
| 2005/0125439 A1 | 6/2005 | Nourbakhsh et al. | |
| 2005/0126190 A1 | 6/2005 | Lifson et al. | |
| 2005/0131624 A1 | 6/2005 | Gaessler et al. | |
| 2005/0149570 A1 | 7/2005 | Sasaki et al. | |
| 2005/0154495 A1 | 7/2005 | Shah | |
| 2005/0159924 A1 | 7/2005 | Shah et al. | |
| 2005/0166610 A1 | 8/2005 | Jayanth | |
| 2005/0169636 A1 | 8/2005 | Aronson et al. | |
| 2005/0172647 A1 | 8/2005 | Thybo et al. | |
| 2005/0195775 A1 | 9/2005 | Petite et al. | |
| 2005/0198063 A1 | 9/2005 | Thomas et al. | |
| 2005/0201397 A1 | 9/2005 | Petite | |
| 2005/0204756 A1 | 9/2005 | Dobmeier et al. | |
| 2005/0207741 A1 | 9/2005 | Shah et al. | |
| 2005/0214148 A1 | 9/2005 | Ogawa et al. | |
| 2005/0222715 A1 | 10/2005 | Ruhnke et al. | |
| 2005/0228607 A1 | 10/2005 | Simons | |
| 2005/0229612 A1 | 10/2005 | Hrejsa et al. | |
| 2005/0229777 A1 | 10/2005 | Brown et al. | |
| 2005/0232781 A1 | 10/2005 | Herbert et al. | |
| 2005/0235660 A1 | 10/2005 | Pham | |
| 2005/0235661 A1 | 10/2005 | Pham | |

(56) References Cited

U.S. PATENT DOCUMENTS

| | | |
|---|---|---|
| 2005/0235662 A1 | 10/2005 | Pham |
| 2005/0235663 A1 | 10/2005 | Pham |
| 2005/0235664 A1 | 10/2005 | Pham |
| 2005/0247194 A1 | 11/2005 | Kang et al. |
| 2005/0251293 A1 | 11/2005 | Seigel |
| 2005/0252220 A1 | 11/2005 | Street et al. |
| 2005/0262856 A1 | 12/2005 | Street et al. |
| 2005/0262923 A1 | 12/2005 | Kates |
| 2006/0010898 A1 | 1/2006 | Suharno et al. |
| 2006/0015777 A1 | 1/2006 | Loda |
| 2006/0020426 A1 | 1/2006 | Singh |
| 2006/0021362 A1 | 2/2006 | Sadegh et al. |
| 2006/0032245 A1 | 2/2006 | Kates |
| 2006/0032246 A1 | 2/2006 | Kates |
| 2006/0032247 A1 | 2/2006 | Kates |
| 2006/0032248 A1 | 2/2006 | Kates |
| 2006/0032379 A1 | 2/2006 | Kates |
| 2006/0036349 A1 | 2/2006 | Kates |
| 2006/0041335 A9 | 2/2006 | Rossi et al. |
| 2006/0042276 A1 | 3/2006 | Doll et al. |
| 2006/0071089 A1 | 4/2006 | Kates |
| 2006/0074917 A1 | 4/2006 | Chand et al. |
| 2006/0097063 A1 | 5/2006 | Zeevi |
| 2006/0098576 A1 | 5/2006 | Brownrigg et al. |
| 2006/0117773 A1 | 6/2006 | Street et al. |
| 2006/0123807 A1 | 6/2006 | Sullivan et al. |
| 2006/0129339 A1 | 6/2006 | Bruno |
| 2006/0130500 A1 | 6/2006 | Gauthier et al. |
| 2006/0137368 A1 | 6/2006 | Kang et al. |
| 2006/0138866 A1 | 6/2006 | Bergmann et al. |
| 2006/0140209 A1 | 6/2006 | Cassiolato et al. |
| 2006/0151037 A1 | 7/2006 | Lepola et al. |
| 2006/0179854 A1 | 8/2006 | Esslinger |
| 2006/0185373 A1 | 8/2006 | Butler et al. |
| 2006/0196196 A1 | 9/2006 | Kates |
| 2006/0196197 A1 | 9/2006 | Kates |
| 2006/0201168 A1 | 9/2006 | Kates |
| 2006/0222507 A1 | 10/2006 | Jayanth |
| 2006/0229739 A1 | 10/2006 | Morikawa |
| 2006/0235650 A1 | 10/2006 | Vinberg et al. |
| 2006/0238388 A1 | 10/2006 | Jayanth |
| 2006/0242200 A1 | 10/2006 | Horowitz et al. |
| 2006/0244641 A1 | 11/2006 | Jayanth et al. |
| 2006/0256488 A1 | 11/2006 | Benzing et al. |
| 2006/0259276 A1 | 11/2006 | Rossi et al. |
| 2006/0271589 A1 | 11/2006 | Horowitz et al. |
| 2006/0271623 A1 | 11/2006 | Horowitz et al. |
| 2006/0280627 A1 | 12/2006 | Jayanth |
| 2007/0002505 A1 | 1/2007 | Watanabe et al. |
| 2007/0006124 A1 | 1/2007 | Ahmed et al. |
| 2007/0027735 A1 | 2/2007 | Rokos |
| 2007/0067512 A1 | 3/2007 | Donaires et al. |
| 2007/0089434 A1 | 4/2007 | Singh et al. |
| 2007/0089435 A1 | 4/2007 | Singh et al. |
| 2007/0089438 A1 | 4/2007 | Singh et al. |
| 2007/0089439 A1 | 4/2007 | Singh et al. |
| 2007/0089440 A1 | 4/2007 | Singh et al. |
| 2007/0101750 A1 | 5/2007 | Pham et al. |
| 2007/0159978 A1 | 7/2007 | Anglin et al. |
| 2007/0186569 A1 | 8/2007 | Street et al. |
| 2007/0204635 A1 | 9/2007 | Tanaka et al. |
| 2007/0204921 A1 | 9/2007 | Alles |
| 2007/0205296 A1 | 9/2007 | Bell et al. |
| 2007/0229305 A1 | 10/2007 | Bonicatto et al. |
| 2007/0239894 A1 | 10/2007 | Thind et al. |
| 2008/0000241 A1 | 1/2008 | Larsen et al. |
| 2008/0015797 A1 | 1/2008 | Kates |
| 2008/0016888 A1 | 1/2008 | Kates |
| 2008/0051945 A1 | 2/2008 | Kates |
| 2008/0058970 A1 | 3/2008 | Perumalsamy et al. |
| 2008/0078289 A1 | 4/2008 | Sergi et al. |
| 2008/0109185 A1 | 5/2008 | Cheung et al. |
| 2008/0114569 A1 | 5/2008 | Seigel |
| 2008/0121729 A1 | 5/2008 | Gray |
| 2008/0186898 A1 | 8/2008 | Petite |
| 2008/0209925 A1 | 9/2008 | Pham |
| 2008/0216494 A1 | 9/2008 | Pham et al. |
| 2008/0216495 A1 | 9/2008 | Kates |
| 2008/0223051 A1 | 9/2008 | Kates |
| 2008/0234869 A1 | 9/2008 | Yonezawa et al. |
| 2008/0315000 A1 | 12/2008 | Gorthala et al. |
| 2008/0319688 A1 | 12/2008 | Kim |
| 2009/0007777 A1 | 1/2009 | Cohen et al. |
| 2009/0030555 A1 | 1/2009 | Gray |
| 2009/0037142 A1 | 2/2009 | Kates |
| 2009/0038010 A1 | 2/2009 | Ma et al. |
| 2009/0055465 A1 | 2/2009 | DePue et al. |
| 2009/0057424 A1 | 3/2009 | Sullivan et al. |
| 2009/0057428 A1 | 3/2009 | Geadelmann et al. |
| 2009/0068947 A1 | 3/2009 | Petite |
| 2009/0071175 A1 | 3/2009 | Pham |
| 2009/0072985 A1 | 3/2009 | Patel et al. |
| 2009/0093916 A1 | 4/2009 | Parsonnet et al. |
| 2009/0094998 A1 | 4/2009 | McSweeney et al. |
| 2009/0096605 A1 | 4/2009 | Petite et al. |
| 2009/0099699 A1 | 4/2009 | Steinberg et al. |
| 2009/0106601 A1 | 4/2009 | Ngai et al. |
| 2009/0112672 A1 | 4/2009 | Flamig et al. |
| 2009/0119036 A1 | 5/2009 | Jayanth et al. |
| 2009/0125151 A1 | 5/2009 | Steinberg et al. |
| 2009/0140880 A1 | 6/2009 | Flen et al. |
| 2009/0151374 A1 | 6/2009 | Kasahara |
| 2009/0187281 A1 | 7/2009 | Kates |
| 2009/0215424 A1 | 8/2009 | Petite |
| 2009/0229469 A1 | 9/2009 | Campbell et al. |
| 2009/0241570 A1 | 10/2009 | Kuribayashi et al. |
| 2009/0296832 A1 | 12/2009 | Hunt |
| 2009/0324428 A1 | 12/2009 | Tolbert, Jr. et al. |
| 2010/0006042 A1 | 1/2010 | Pitonyak et al. |
| 2010/0011962 A1 | 1/2010 | Totsugi |
| 2010/0017465 A1 | 1/2010 | Brownrigg et al. |
| 2010/0039984 A1 | 2/2010 | Brownrigg |
| 2010/0044449 A1 | 2/2010 | Tessier |
| 2010/0070084 A1 | 3/2010 | Steinberg et al. |
| 2010/0070234 A1 | 3/2010 | Steinberg et al. |
| 2010/0070666 A1 | 3/2010 | Brindle |
| 2010/0078493 A1 | 4/2010 | Alles |
| 2010/0081357 A1 | 4/2010 | Alles |
| 2010/0081372 A1 | 4/2010 | Alles |
| 2010/0089076 A1 | 4/2010 | Schuster et al. |
| 2010/0102136 A1 | 4/2010 | Hadzidedic et al. |
| 2010/0168924 A1 | 7/2010 | Tessier et al. |
| 2010/0169030 A1 | 7/2010 | Parlos |
| 2010/0179703 A1 | 7/2010 | Singh et al. |
| 2010/0191487 A1 | 7/2010 | Rada et al. |
| 2010/0194582 A1 | 8/2010 | Petite |
| 2010/0214709 A1 | 8/2010 | Hall et al. |
| 2010/0217550 A1 | 8/2010 | Crabtree et al. |
| 2010/0250054 A1 | 9/2010 | Petite |
| 2010/0257410 A1 | 10/2010 | Cottrell et al. |
| 2010/0262299 A1 | 10/2010 | Cheung et al. |
| 2010/0265909 A1 | 10/2010 | Petite et al. |
| 2010/0280667 A1 | 11/2010 | Steinberg |
| 2010/0282857 A1 | 11/2010 | Steinberg |
| 2010/0287489 A1 | 11/2010 | Alles |
| 2010/0305718 A1 | 12/2010 | Clark et al. |
| 2010/0308119 A1 | 12/2010 | Steinberg et al. |
| 2010/0312881 A1 | 12/2010 | Davis et al. |
| 2010/0318227 A1 | 12/2010 | Steinberg et al. |
| 2010/0330985 A1 | 12/2010 | Addy |
| 2011/0004350 A1 | 1/2011 | Cheifetz et al. |
| 2011/0022429 A1 | 1/2011 | Yates et al. |
| 2011/0023045 A1 | 1/2011 | Yates et al. |
| 2011/0023945 A1 | 2/2011 | Hayashi et al. |
| 2011/0040785 A1 | 2/2011 | Steenberg et al. |
| 2011/0042541 A1 | 2/2011 | Spencer et al. |
| 2011/0045454 A1 | 2/2011 | McManus et al. |
| 2011/0054842 A1 | 3/2011 | Kates |
| 2011/0071960 A1 | 3/2011 | Singh |
| 2011/0077896 A1 | 3/2011 | Steinberg et al. |
| 2011/0083450 A1 | 4/2011 | Turner et al. |
| 2011/0102159 A1 | 5/2011 | Olson et al. |
| 2011/0103460 A1 | 5/2011 | Bonicatto |
| 2011/0106471 A1 | 5/2011 | Curtis et al. |

(56) References Cited

U.S. PATENT DOCUMENTS

| | | |
|---|---|---|
| 2011/0118905 A1 | 5/2011 | Mylaraswamy et al. |
| 2011/0121952 A1 | 5/2011 | Bonicatto et al. |
| 2011/0144932 A1 | 6/2011 | Alles |
| 2011/0166828 A1 | 7/2011 | Steinberg et al. |
| 2011/0181438 A1 | 7/2011 | Millstein et al. |
| 2011/0184563 A1 | 7/2011 | Foslien et al. |
| 2011/0185895 A1 | 8/2011 | Freen |
| 2011/0190910 A1 | 8/2011 | Lombard et al. |
| 2011/0212700 A1 | 9/2011 | Petite |
| 2011/0218957 A1 | 9/2011 | Coon et al. |
| 2011/0264324 A1 | 10/2011 | Petite et al. |
| 2011/0264409 A1 | 10/2011 | Jayanth et al. |
| 2011/0290893 A1 | 12/2011 | Steinberg |
| 2011/0307103 A1 | 12/2011 | Cheung et al. |
| 2011/0309953 A1 | 12/2011 | Petite et al. |
| 2011/0310929 A1 | 12/2011 | Petite et al. |
| 2011/0315019 A1 | 12/2011 | Lyon et al. |
| 2011/0320050 A1 | 12/2011 | Petite et al. |
| 2012/0005590 A1 | 1/2012 | Lombard et al. |
| 2012/0054242 A1 | 3/2012 | Ferrara et al. |
| 2012/0065783 A1 | 3/2012 | Fadell et al. |
| 2012/0065935 A1 | 3/2012 | Steinberg et al. |
| 2012/0066168 A1 | 3/2012 | Fadell et al. |
| 2012/0075092 A1 | 3/2012 | Petite et al. |
| 2012/0092154 A1 | 4/2012 | Petite |
| 2012/0125559 A1 | 5/2012 | Fadell et al. |
| 2012/0125592 A1 | 5/2012 | Fadell et al. |
| 2012/0126019 A1 | 5/2012 | Warren et al. |
| 2012/0126020 A1 | 5/2012 | Filson et al. |
| 2012/0126021 A1 | 5/2012 | Warren et al. |
| 2012/0128025 A1 | 5/2012 | Huppi et al. |
| 2012/0130546 A1 | 5/2012 | Matas et al. |
| 2012/0130547 A1 | 5/2012 | Fadell et al. |
| 2012/0130548 A1 | 5/2012 | Fadell et al. |
| 2012/0130679 A1 | 5/2012 | Fadell et al. |
| 2012/0131504 A1 | 5/2012 | Fadell et al. |
| 2012/0143528 A1 | 6/2012 | Kates |
| 2012/0179300 A1 | 7/2012 | Warren et al. |
| 2012/0186774 A1 | 7/2012 | Matsuoka et al. |
| 2012/0191257 A1 | 7/2012 | Corcoran et al. |
| 2012/0199660 A1 | 8/2012 | Warren et al. |
| 2012/0203379 A1 | 8/2012 | Sloo et al. |
| 2012/0221150 A1* | 8/2012 | Arensmeier ....... G05B 23/0224 700/276 |
| 2012/0229521 A1 | 9/2012 | Hales, IV et al. |
| 2012/0232969 A1 | 9/2012 | Fadell et al. |
| 2012/0233478 A1 | 9/2012 | Mucignat et al. |
| 2012/0239207 A1 | 9/2012 | Fadell et al. |
| 2012/0239221 A1 | 9/2012 | Mighdoll et al. |
| 2012/0245968 A1 | 9/2012 | Beaulieu et al. |
| 2012/0248210 A1 | 10/2012 | Warren et al. |
| 2012/0248211 A1 | 10/2012 | Warren et al. |
| 2012/0260804 A1 | 10/2012 | Kates |
| 2012/0265491 A1 | 10/2012 | Drummy |
| 2012/0265586 A1 | 10/2012 | Mammone |
| 2012/0271673 A1 | 10/2012 | Riley |
| 2012/0291629 A1 | 11/2012 | Tylutki et al. |
| 2012/0318135 A1 | 12/2012 | Hoglund et al. |
| 2012/0318137 A1 | 12/2012 | Ragland et al. |
| 2013/0066479 A1 | 3/2013 | Shetty et al. |
| 2013/0182285 A1 | 7/2013 | Matsuhara et al. |
| 2013/0287063 A1 | 10/2013 | Kates |
| 2014/0000290 A1 | 1/2014 | Kates |
| 2014/0000291 A1 | 1/2014 | Kates |
| 2014/0000292 A1 | 1/2014 | Kates |
| 2014/0000293 A1 | 1/2014 | Kates |
| 2014/0000294 A1 | 1/2014 | Kates |
| 2014/0012422 A1 | 1/2014 | Kates |
| 2014/0074730 A1 | 3/2014 | Arensmeier et al. |
| 2014/0262134 A1 | 9/2014 | Arensmeier et al. |
| 2014/0266755 A1* | 9/2014 | Arensmeier ......... F24F 11/0086 340/679 |

FOREIGN PATENT DOCUMENTS

| | | |
|---|---|---|
| CA | 2528778 A1 | 12/2004 |
| CA | 2567264 A1 | 7/2007 |
| CH | 173493 A | 11/1934 |
| CN | 1133425 A | 10/1996 |
| CN | 1169619 A | 1/1998 |
| CN | 1297522 A | 5/2001 |
| CN | 1356472 A | 7/2002 |
| CN | 1742427 A | 3/2006 |
| CN | 1922445 A | 2/2007 |
| CN | 101270908 A | 9/2008 |
| CN | 101361244 A | 2/2009 |
| CN | 101466193 A * | 6/2009 |
| CN | 101821693 A | 9/2010 |
| DE | 842351 C | 6/1952 |
| DE | 764179 C | 4/1953 |
| DE | 1144461 B | 2/1963 |
| DE | 1403516 A1 | 10/1968 |
| DE | 1403467 A1 | 10/1969 |
| DE | 3118638 A1 | 5/1982 |
| DE | 3133502 A1 | 6/1982 |
| DE | 3422398 A1 | 12/1985 |
| DE | 29723145 U1 | 4/1998 |
| EP | 0060172 A1 | 9/1982 |
| EP | 0085246 A1 | 8/1983 |
| EP | 0124603 A1 | 11/1984 |
| EP | 0254253 A2 | 1/1988 |
| EP | 0346152 A2 | 12/1989 |
| EP | 0351272 A1 | 1/1990 |
| EP | 0351833 A2 | 1/1990 |
| EP | 0355255 A2 | 2/1990 |
| EP | 0361394 A2 | 4/1990 |
| EP | 0398436 A1 | 11/1990 |
| EP | 0410330 A2 | 1/1991 |
| EP | 0419857 A2 | 4/1991 |
| EP | 0432085 A2 | 6/1991 |
| EP | 0453302 A1 | 10/1991 |
| EP | 0479421 A1 | 4/1992 |
| EP | 0557023 A1 | 8/1993 |
| EP | 0579374 A1 | 1/1994 |
| EP | 0660213 A2 | 6/1995 |
| EP | 0747598 A2 | 12/1996 |
| EP | 0877462 A2 | 11/1998 |
| EP | 0982497 A1 | 3/2000 |
| EP | 1008816 A2 | 6/2000 |
| EP | 1087142 A2 | 3/2001 |
| EP | 1087184 A2 | 3/2001 |
| EP | 1138949 A2 | 10/2001 |
| EP | 1139037 A1 | 10/2001 |
| EP | 1187021 A2 | 3/2002 |
| EP | 1209427 A1 | 5/2002 |
| EP | 1241417 A1 | 9/2002 |
| EP | 1245912 A2 | 10/2002 |
| EP | 1245913 A1 | 10/2002 |
| EP | 1393034 A1 | 3/2004 |
| EP | 1435002 A1 | 7/2004 |
| EP | 1487077 A2 | 12/2004 |
| EP | 2180270 A1 | 4/2010 |
| FR | 2472862 A1 | 7/1981 |
| FR | 2582430 A1 | 11/1986 |
| FR | 2589561 A1 | 5/1987 |
| FR | 2628558 A1 | 9/1989 |
| FR | 2660739 A1 | 10/1991 |
| GB | 2062919 A | 5/1981 |
| GB | 2064818 A | 6/1981 |
| GB | 2075774 A | 11/1981 |
| GB | 2116635 A | 9/1983 |
| GB | 2229295 A | 9/1990 |
| JP | 56010639 A | 2/1981 |
| JP | 59145392 A | 8/1984 |
| JP | 61046485 A | 3/1986 |
| JP | 62116844 A | 5/1987 |
| JP | 63061783 A | 3/1988 |
| JP | 63302238 A | 12/1988 |
| JP | 01014554 A | 1/1989 |
| JP | 02110242 A | 4/1990 |
| JP | 02294580 A | 12/1990 |
| JP | 04080578 A | 3/1992 |

(56) References Cited

FOREIGN PATENT DOCUMENTS

| | | |
|---|---|---|
| JP | 06058273 A | 3/1994 |
| JP | 08021675 A | 1/1996 |
| JP | 08087229 A | 4/1996 |
| JP | 08284842 A | 10/1996 |
| JP | H08261541 A | 10/1996 |
| JP | 2000350490 A | 12/2000 |
| JP | 2002155868 A | 5/2002 |
| JP | 2003018883 A | 1/2003 |
| JP | 2003176788 A | 6/2003 |
| JP | 2004316504 A | 11/2004 |
| JP | 2005188790 A | 7/2005 |
| JP | 2005241089 A | 9/2005 |
| JP | 2005345096 A | 12/2005 |
| JP | 2006046219 A | 2/2006 |
| JP | 2006046519 A | 2/2006 |
| JP | 2006274807 A | 10/2006 |
| JP | 2009002651 A | 1/2009 |
| JP | 2009229184 A * | 10/2009 |
| JP | 2010048433 A | 3/2010 |
| KR | 10-1998-0036844 A | 8/1998 |
| KR | 1020000000261 | 1/2000 |
| KR | 1020000025265 | 5/2000 |
| KR | 1020020041977 | 6/2002 |
| KR | 20030042857 A | 6/2003 |
| KR | 1020040021281 | 3/2004 |
| KR | 1020060020353 | 3/2006 |
| WO | WO-8601262 A1 | 2/1986 |
| WO | WO-8703988 A1 | 7/1987 |
| WO | WO-8705097 A1 | 8/1987 |
| WO | WO-8802527 A1 | 4/1988 |
| WO | WO-8806703 A1 | 9/1988 |
| WO | WO-9718636 A2 | 5/1997 |
| WO | WO-9748161 A1 | 12/1997 |
| WO | WO-9917066 A1 | 4/1999 |
| WO | WO-9961847 A1 | 12/1999 |
| WO | WO-9965681 A1 | 12/1999 |
| WO | WO-0021047 A1 | 4/2000 |
| WO | WO-0051223 A1 | 8/2000 |
| WO | WO-0169147 A1 | 9/2001 |
| WO | WO-0214968 A1 | 2/2002 |
| WO | WO-0249178 A2 | 6/2002 |
| WO | WO-02075227 A1 | 9/2002 |
| WO | WO-02/090840 A2 | 11/2002 |
| WO | WO-02/090913 A1 | 11/2002 |
| WO | WO-02090914 A1 | 11/2002 |
| WO | WO-03031996 A1 | 4/2003 |
| WO | WO-03090000 A1 | 10/2003 |
| WO | WO-2004049088 A1 | 6/2004 |
| WO | WO-2005022049 A2 | 3/2005 |
| WO | WO-2005065355 A2 | 7/2005 |
| WO | WO-2005073686 A1 | 8/2005 |
| WO | WO-2005108882 A2 | 11/2005 |
| WO | WO-2006023075 A2 | 3/2006 |
| WO | WO-2006025880 A1 | 3/2006 |
| WO | WO-2006091521 A2 | 8/2006 |
| WO | WO-2008010988 A1 | 1/2008 |
| WO | WO-2008144864 A1 | 12/2008 |
| WO | WO-2009058356 A1 | 5/2009 |
| WO | WO-2009061370 A1 | 5/2009 |
| WO | WO-2010138831 A2 | 12/2010 |
| WO | WO-2011069170 A1 | 6/2011 |
| WO | WO-2012092625 A2 | 7/2012 |
| WO | WO-2012118550 A1 | 9/2012 |

OTHER PUBLICATIONS

Office Action regarding Australian Patent Application No. 2014229103, dated Apr. 28, 2016.
Office Action regarding U.S. Appl. No. 14/617,451, dated Jun. 2, 2016.
Office Action regarding U.S. Appl. No. 14/193,568, dated Jun. 1, 2016.
Office Action regarding U.S. Appl. No. 14/080,473, dated Jun. 6, 2016.
Interview Summary regarding U.S. Appl. No. 14/209,415, dated Jun. 20, 2016.
Search Report regarding European Patent Application No. 13841699.5, dated Jun. 30, 2016.
U.S. Appl. No. 12/943,626, filed Nov. 10, 2010, E. Todd Clark.
U.S. Appl. No. 13/269,188, filed Oct. 7, 2011, Lawrence Kates.
U.S. Appl. No. 13/369,067, filed Feb. 8, 2012, Lawrence Kates.
U.S. Appl. No. 13/407,180, filed Feb. 28, 2012, Jeffrey N. Arensmeier.
U.S. Appl. No. 13/770,123, filed Feb. 19, 2013, Nagaraj Jayanth.
U.S. Appl. No. 13/770,479, filed Feb. 19, 2013, Nagaraj Jayanth.
U.S. Appl. No. 13/784,890, filed Mar. 5, 2013, Hung M. Pham.
U.S. Appl. No. 14/033,604, filed Sep. 23, 2013, Hung M. Pham.
U.S. Appl. No. 14/080,473, filed Nov. 14, 2013, Hung M. Pham.
U.S. Appl. No. 14/193,568, filed Feb. 28, 2014, Hung M. Pham.
U.S. Appl. No. 14/208,636, filed Mar. 13, 2014, Hung M. Pham.
U.S. Appl. No. 14/209,415, filed Mar. 13, 2014, Jeffrey N. Arensmeier.
U.S. Appl. No. 14/212,632, filed Mar. 14, 2014, Jeffrey N. Arensmeier.
U.S. Appl. No. 14/244,967, filed Apr. 4, 2014, Fadi M. Alsaleem.
U.S. Appl. No. 14/255,519, filed Apr. 17, 2014, Hung M. Pham.
U.S. Appl. No. 14/300,782, filed Jun. 10, 2014, Jeffrey N. Arensmeier.
U.S. Appl. No. 14/607,782, filed Jan. 28, 2015, Fadi M. Alsaleem.
U.S. Appl. No. 14/617,451, filed Feb. 10, 2015, Frank S. Wallis.
U.S. Appl. No. 14/727,756, filed Jun. 1, 2015, Lawrence Kates.
U.S. Appl. No. 14/841,058, filed Aug. 31, 2015, Hung M. Pham.
U.S. Appl. No. 14/949,090, filed Nov. 23, 2015, Nagaraj Jayanth.
U.S. Appl. No. 15/096,186, filed Apr. 11, 2016, Lawrence Kates.
"A Practical Example of a Building's Automatic Control," cited in First Office Action from the Patent Office of the People's Republic of China dated Jun. 29, 2007, regarding Application No. 200510005907.8, including translation by CCPIT Patent and Trademark Law Office.
"Manual for Freezing and Air Conditioning Technology," Fan Jili, Liaoning Science and Technology Press, Sep. 1995 (cited in First Office Action issued by the Chinese Patent Office regarding Application No. 200780030810.X dated Dec. 25, 2009).
"Product Performance Introduction of York Company," cited in First Office Action from the Patent Office of the People's Republic of China dated Jun. 29, 2007 regarding Application No. 200510005907.8, including translation by CCPIT Patent and Trademark Law Office.
"Small-type Freezing and Air Conditioning Operation," Chinese State Economy and Trading Committee, China Meteorological Press, Mar. 2003 (cited in First Office Action issued by the Chinese Patent Office regarding Application No. 200780030810.X dated Dec. 25, 2009).
Advisory Action regarding U.S. Appl. No. 12/261,643, dated Nov. 22, 2013.
Building Environmental Control (BEC) Installation and Operation Manual, Computer Process Controls, Jan. 5, 1998.
Examiner's First Report on Australian Patent Application No. 2008319275, dated Jan. 31, 2011.
Examiner's Report No. 2 regarding Australian Patent Application No. 2008325240, dated Mar. 5, 2012.
Final Office Action regarding U.S. Appl. No. 13/770,123, dated Nov. 15, 2013.
Final Office Action regarding U.S. Appl. No. 12/261,643, dated Jun. 27, 2012.
Final Office Action regarding U.S. Appl. No. 12/261,643, dated Sep. 16, 2013.
Final Office Action regarding U.S. Appl. No. 12/261,643, dated Jul. 7, 2011.
First Examination Report regarding Australian Patent Application No. 2012241185, dated Sep. 27, 2013.
First Office Action from the State Intellectual Property Office of the People's Republic of China regarding Chinese Patent Application No. 200890100287.3, issued Oct. 25, 2010. Translation provided by Unitalen Attorneys at Law.
First Office Action issued by the Chinese Patent Office regarding Application No. 200780030810.X dated Dec. 25, 2009.

(56) References Cited

OTHER PUBLICATIONS

International Preliminary Report on Patentability for International Application No. PCT/US2008/012362, dated May 4, 2010.
International Preliminary Report on Patentability for International Application No. PCT/US2008/012364, dated May 4, 2010.
International Search Report for International Application No. PCT/US2008/012362, dated Feb. 12, 2009.
International Search Report for International Application No. PCT/US2008/012364 dated Mar. 13, 2009.
Non-Final Office Action regarding U.S. Appl. No. 13/770,123, dated Jul. 3, 2013.
Non-Final Office Action regarding U.S. Appl. No. 12/261,643, dated Jan. 27, 2011.
Non-Final Office Action regarding U.S. Appl. No. 13/176,021, dated May 8, 2012.
Non-Final Office Action regarding U.S. Appl. No. 12/261,643, dated Mar. 12, 2013.
Notice of Allowance regarding U.S. Appl. No. 12/261,677, dated Dec. 15, 2011.
Office Action regarding U.S. Appl. No. 12/261,643, dated Nov. 2, 2011.
Office Action regarding U.S. Appl. No. 12/261,643, dated Feb. 15, 2012.
Office Action regarding U.S. Appl. No. 12/261,677, dated Aug. 4, 2011.
Official Action regarding Australian Patent Application No. 2008325240, dated Jan. 19, 2011.
Refrigeration Monitor and Case Control Installation and Operation Manual, Computer Process Controls, Aug. 12, 1999.
Second Office action issued by the Chinese Patent Office dated Jun. 19, 2009 regarding Application No. 200510005907.8, translation provided by CCPIT Patent and Trademark Law Office.
Second Office Action regarding Chinese Patent Application No. 200890100287.3, dated Jan. 27, 2011. English translation provided by Unitalen Attorneys at Law.
Written Opinion of the International Searching Authority regarding Application No. PCT/US2013/061389, mailed Jan. 22, 2014.
Honeywell, Alerts and Delta T Diagnostics with Prestige® 2.0 IAQ Thermostat, 69-2678-02, Sep. 2011.
Honeywell, RedLINK™ Wireless Comfort Systems brochure, 50-1194, Sep. 2011.
Honeywell, Prestige System Installation Guide, THX9321/9421 Prestige® IAQ and RF EIM, 64-2490-03, Jul. 2011.
Home Comfort Zones, Save Energy with MyTemp™ Zone Control, Dec. 2009.
Home Comfort Zones, MyTemp Room-by-Room Zone Control, Nov. 2009.
Li et al., "Development, Evaluation, and Demonstration of a Virtual Refrigerant Charge Sensor," Jan. 2009, HVAC&R Research, Oct. 27, 2008, 21 pages.
Home Comfort Zones, MyTemp User Manual v4.3, May 2008.
Home Comfort Zones, Smart Controller™ MyTemp™ Room by Room Temperature Control and Energy Management, User Manual, Aug. 2007.
Torcellini, P., et al., "Evaluation of the Energy Performance and Design Process of the Thermal Test Facility at the National Renewable Energy Laboratory", dated Feb. 2005.
Cost Cutting Techniques Used by the Unscrupulous, http://www.kellyshvac.com/howto.html, Oct. 7, 2004, 3 pages.
About CABA: CABA eBulletin, http://www.caba.org/aboutus/ebulletin/issue17/domosys.html, 2 pages.
The LS2000 Energy Management System, User Guide, http://www.surfnetworks.com/htmlmanuals/IonWorksEnergyManagement-LS2000-Load-Shed -System-by-Surf-Networks,Inc.html, Sep. 2004, 20 pages.
Case Studies: Automated Meter Reading and Load Shed System, http://groupalpha.corn/CaseStudies2.html, Aug. 23, 2004, 1 page.
Nickles, Donald, "Broadband Communications Over Power Transmission Lines," A Guest Lecture From the Dr. Shreekanth Mandaynam Engineering Frontiers Lecture Series, May 5, 2004, 21 pages.
Jeffus, Larry, "Refrigeration and Air Conditioning: An Introduction to HVAC/R," Appendix C, pp. 1060-1063, Copyright 2004.
Jeffus, Larry, "Refrigeration and Air Conditioning: An Introduction to HVAC/R," Section II, Chapter 4, pp. 176-201, Copyright 2004.
Jeffus, Larry, "Refrigeration and Air Conditioning: An Introduction to HVAC/R," Section II, Chapter 5, pp. 239-245, Copyright 2004.
Jeffus, Larry, "Refrigeration and Air Conditioning: An Introduction to HVAC/R," Section II, Chapter 6, p. 322, Copyright 2004.
Jeffus, Larry, "Refrigeration and Air Conditioning: An Introduction to HVAC/R," Section IV, Chapter 9, pp. 494-504, Copyright 2004.
HVAC Service Assistant, ACRx Efficiency and Capacity Estimating Technology, Field Diagnostics, 2004.
Reh, F. John, "Cost Benefit Analysis", http://management.about.com/cs/money/a/CostBenefit.htm, Dec. 8, 2003.
Udelhoven, Darrell, "Air Conditioning System Sizing for Optimal Efficiency," http://www.udarrell.com/ airconditioning-sizing.html, Oct. 6, 2003, 7 pages.
Texas Instruments, Inc., Product catalog for "TRF690 1 Single-Chip RF Transceiver," Copyright 2001-2003, Revised Oct. 2003, 27 pages.
Advanced Utility Metering: Period of Performance, Subcontractor Report, National Renewable Energy Laboratory, Sep. 2003, 59 pages.
Honeywell, Advanced Portable A/C Diagnostics, The HVAC Service Assistant, 2003.
Vandenbrink et al.,"Design of a Refrigeration Cycle Evaporator Unit," Apr. 18, 2003.
Udelhoven, Darrell, "Air Conditioner EER, SEER Ratings, BTUH Capacity Ratings, & Evaporator Heat Load," http://www.udarrell.com/air-conditioner-capacity-seer.html, Apr. 3, 2003, 15 pages.
The Honeywell HVAC Service Assistant, A Tool for Reducing Electrical Power Demand and Energy Consumption, Field Diagnostics, 2003.
Trane EarthWise™ CenTra Vac™ Water-Cooled Liquid Chillers 165-3950 Tons 50 and 60 Hz; CTV PRC007-EN; Oct. 2002; 56 pages.
Honeywell, HVAC Service Assistant, TRGpro PalmTM OS Interface and HVAC Service Assistant A7075A1000, 2002.
"Air Conditioning Equipment and Diagnostic Primer," Field Diagnostic Services, Inc., Sep. 9, 2002.
Udelhoven, Darrell, "Optimizing Air Conditioning Efficiency TuneUp Optimizing the Condensor Output, Seer, Air, HVAC Industry," http://www.udarrell.com/air-conditioning-efficiency.html, Jul. 19, 2002, 13 pages.
Honeywell, A7075A1000 HVAC Service Assistant, 2001.
LIPA Launches Free, First-in-Nation Internet-Based Air Conditioner Control Program to Help LIPA and Its Customers Conserve Electricity & Save Money, Apr. 19, 2001, http://www.lipower.org/newscmter/pr/2001/april19_01.html, 3 pages.
K. A. Manske et al.; Evaporative Condenser Control in Industrial Refrigeration Systems; University of Wisconsin—Madison, Mechanical Engineering Department; International Journal of Refrigeration, vol. 24, No. 7; pp. 676-691; 2001, 21 pages.
Flow & Level Measurement: Mass Flowmeters, http://www.omega.com/literature/transactions/volume4/T9904-10-Mass.html, 2001, 19 pages.
Frequently Asked Questions, http://www.lipaedge.com/faq.asp, Copyright © 2001, 5 pages.
Translation of claims and Abstract of KR Patent Laying-Open No. 2000-0000261.
BChydro, "Power Factor". Guides to Energy Management: The GEM Series, Oct. 1999.
Liao et al., A Correlation of Optimal Heat Rejection Pressures in Transcritical Carbon Dioxide Cycles, Applied Thermal Engineering 20 (2000), Jul. 25, 1999, 831-841.
Low-Cost Multi-Service Home Gateway Creates New Business Opportunities, Coactive Networks, Copyright 1998-1999, 7 pages.

(56) References Cited

OTHER PUBLICATIONS

Pin, C. et al., "Predictive Models as Means to Quantify the Interactions of Spoilage Organisms," International Journal of Food Microbiology, vol. 41, No. 1, 1998, pp. 59-72, XP-002285119.
Watt, James; Development of Empirical Temperature and Humidity-Based Degraded-Condition Indicators for Low-Tonnage Air Conditioners; ESL-TH-97/12-03; Dec. 1997.
Texas Instruments, Inc. Mechanical Data for "PT (S-PQFP-G48) Plastic Quad Flatpack," Revised Dec. 1996, 2 pages.
Honeywell, Excel 5000® System, Excel Building Supervisor, 74-2033-1, Copyright © 1996, Rev. 6-96, 12 pages.
UltraSite User's Guide, Computer Process Controls, Apr. 1, 1996.
Honeywell, Excel 5000® System, Excel Building Supervisor—Integrated, 74-2034, Copyright ® 1994, Rev. 11-94, 12 pages.
Tamarkin, Tom D., "Automatic Meter Reading," Public Power magazine, vol. 50, No. 5, Sep.-Oct. 1992, http://www.energycite.com/news/amr.html, 6 pages.
Palani, M. et al, The Effect of Reducted Evaporator Air Flow on the Performance of a Residential Central Air Conditioner, ESL-HH-92-05-04, Energy Systems Laboratory, Mechanical Engineering Department, Texas A&M University, Eighth Symposium on Improving Building System in Hot and Humid Climates, May 13-14, 1992.
Palani, M. et al, Monitoring the Performance of a Residential Central Air Conditioner under Degraded Conditions on a Test Bench, ESL-TR-92/05-05, May 1992.
European Search Report for EP 82306809.3; Apr. 28, 1983; 1 Page.
European Search Report for EP 91 30 3518; Jul. 22, 1991; 1 Page.
European Search Report for EP 93 30 4470; Oct. 26, 1993; 1 Page.
International Search Report; International Application No. PCT/IB96/01435; May 23, 1997; 1 Page.
European Search Report for EP 96 30 4219; Dec. 1, 1998; 2 Pages.
International Search Report; International Application No. PCT/US98/18710; Jan. 26, 1999; 1 Page.
European Search Report for EP 94 30 3484; Apr. 3, 1997; 1 Page.
European Search Report for EP 98 30 3525; May 28, 1999; 2 Pages.
European Search Report for EP 99 30 6052; Dec. 28, 1999; 3 Pages.
European Search Report for EP 01 30 7547; Feb. 20, 2002; 1 Page.
European Search Report for Application No. EP 01 30 1752, dated Mar. 26, 2002.
European Search Report for EP 02 25 0266; May 17, 2002; 3 Pages.
International Search Report, International Application No. PCT/US02/13456, dated Aug. 22, 2002, 2 Pages.
International Search Report for PCT/US02/13459; ISA/US; date mailed Sep. 19, 2002.
European Search Report for Application No. EP 02 25 1531, dated Sep. 30, 2002.
Office Action regarding U.S. Appl. No. 09/977,552, dated Jan. 14, 2003.
Written Opinion regarding PCT/US02/13459, dated Apr. 23, 2003.
Final Office Action regarding U.S. Appl. No. 09/977,552, dated Jun. 18, 2003.
International Preliminary Examination Report regarding PCT/US02/13456, dated Sep. 15, 2003.
Office Action regarding U.S. Appl. No. 10/061,964, dated Oct. 3, 2003.
Response to Rule 312 Communication regarding U.S. Appl. No. 09/977,552, dated Oct. 31, 2003.
Office Action regarding U.S. Appl. No. 09/977,552, dated Dec. 3, 2003.
Final Office Action regarding U.S. Appl. No. 10/061,964, dated Mar. 8, 2004.
Final Office Action regarding U.S. Appl. No. 09/977,552, dated Apr. 26, 2004.
Office Action regarding U.S. Appl. No. 10/286,419, dated Jun. 10, 2004.
European Search Report for EP 02 72 9050, Jun. 17, 2004, 2 pages.
Supplementary European Search Report for EP 02 73 1544, Jun. 18, 2004, 2 Pages.
Notice of Allowance regarding U.S. Appl. No. 10/061,964, dated Jul. 19, 2004.
International Search Report, International Application No. PCT/US04/13384; Dated Aug. 1, 2004; 1 Page.
International Search Report, International Application No. PCT/US2004/027654, dated Aug. 25, 2004, 4 Pages.
Office Action regarding U.S. Appl. No. 10/675,137, dated Sep. 7, 2004.
Office Action regarding U.S. Appl. No. 09/977,552, dated Oct. 18, 2004.
Notice of Allowance and Notice of Allowability regarding U.S. Appl. No. 10/286,419, dated Dec. 2, 2004.
Office Action regarding U.S. Appl. No. 10/675,137, dated Feb. 4, 2005.
European Search Report regarding Application No. EP02729051, dated Feb. 17, 2005.
Office Action regarding U.S. Appl. No. 10/698,048, dated Mar. 21, 2005.
Office Action dated May 4, 2005 from Related U.S. Appl. No. 10/916,223 (Kates.003A).
Final Office Action regarding U.S. Appl. No. 09/977,552, dated May 13, 2005.
Office Action regarding U.S. Appl. No. 10/675,137, dated Jun. 29, 2005.
Restriction Requirement regarding U.S. Appl. No. 10/940,877, dated Jul. 25, 2005.
Notice of Allowance for U.S. Appl. No. 10/698,048, dated Sep. 1, 2005.
International Search Report for International Application No. PCT/US2005/11154, dated Oct. 19, 2005.
Office Action dated Oct. 27, 2005 from Related U.S. Appl. No. 10/916,223 (Kates.003A).
Office Action dated Nov. 8, 2005 from Related U.S. Appl. No. 10/916,222.
Office Action dated Nov. 9, 2005 from Related U.S. Appl. No. 11/130,562 (Kates.003A).
Office Action dated Nov. 9, 2005 from Related U.S. Appl. No. 11/130,601 (Kates.020A).
Office Action dated Nov. 9, 2005 from Related U.S. Appl. No. 11/130,871 (Kates.002A).
Advisory Action Before the Filing of an Appeal Brief regarding U.S. Appl. No. 09/977,552, dated Nov. 10, 2005.
Office Action regarding U.S. Appl. No. 10/940,877, dated Nov. 14, 2005.
Notice of Allowance and Notice of Allowability regarding U.S. Appl. No. 10/675,137, dated Dec. 16, 2005.
First Examination Communication regarding European Application No. EP02729051.9, dated Dec. 23, 2005.
Office Action dated Jan. 6, 2006 from Related U.S. Appl. No. 11/130,562 (Kates.021A).
Office Action dated Jan. 6, 2006 from Related U.S. Appl. No. 10/916,222.
Office Action dated Jan. 18, 2006 from Related U.S. Appl. No. 11/130,601 (Kates.020A).
Examiner's First Report on Australian Patent Application No. 2002259066, dated Mar. 1, 2006.
International Search Report for International Application No. PCT/US04/43859, dated Mar. 2, 2006.
Office Action dated Mar. 30, 2006 from Related U.S. Appl. No. 11/130,569 (Kates.022A).
Office Action dated Apr. 19, 2006 from Related U.S. Appl. No. 10/916,223 (Kates.003A).
Final Office Action regarding U.S. Appl. No. 10/940,877, dated May 2, 2006.
Office Action dated Jun. 22, 2009 from Related U.S. Appl. No. 12/050,821.
Second Examination Communication regarding European Application No. EP02729051.9, dated Jul. 3, 2006.
Office Action dated Jul. 11, 2006 from Related U.S. Appl. No. 11/130,562 (Kates.021A).
Office Action dated Jul. 11, 2006 from Related U.S. Appl. No. 10/916,222.

(56) References Cited

OTHER PUBLICATIONS

Office Action regarding U.S. Appl. No. 09/977,552, dated Jul. 12, 2006.
Notice of Allowance dated Jul. 13, 2006 from Related U.S. Appl. No. 11/130,601 (Kates.020A).
Office Action dated Jul. 27, 2006 from Related U.S. Appl. No. 11/130,871 (Kates.002A).
Office Action regarding U.S. Appl. No. 11/120,166, dated Oct. 2, 2006.
Office Action regarding U.S. Appl. No. 10/940,877, dated Oct. 27, 2006.
Office Action dated Nov. 14, 2006 from Related U.S. Appl. No. 11/130,569 (Kates.022A).
Office Action dated Nov. 16, 2006 from Related U.S. Appl. No. 10/916,223 (Kates.003A).
Office Action dated Jan. 23, 2007 from Related U.S. Appl. No. 10/916,222.
Election/Restriction Requirement regarding U.S. Appl. No. 09/977,552, dated Jan. 25, 2007.
Office Action dated Feb. 1, 2007 from Related U.S. Appl. No. 11/130,562 (Kates.021A).
First Office Action received from the Chinese Patent Office dated Feb. 2, 2007 regarding Application No. 200480011463.2, translated by CCPIT Patent and Trademark Law Office.
Notice of Allowance dated Feb. 12, 2007 from Related U.S. Appl. No. 11/130,871 (Kates.002A).
International Search Report, International Application No. PCT/US2006/040964, dated Feb. 15, 2007, 2 Pages.
Examiner Interview Summary regarding U.S. Appl. No. 10/940,877, dated Mar. 2, 2007.
Office Action regarding U.S. Appl. No. 11/120,166, dated Apr. 12, 2007.
Office Action Communication regarding U.S. Appl. No. 09/977,552, dated Apr. 18, 2007.
Office Action regarding U.S. Appl. No. 10/940,877, dated May 21, 2007.
Notice of Allowance dated May 29, 2007 from Related U.S. Appl. No. 11/130,569 (Kates.022A).
First Office Action from the Patent Office of the People's Republic of China dated Jun. 8, 2007, Application No. 200480027753.6 and Translation provided by CCPIT.
Notice of Allowance dated Jun. 11, 2007 from Related U.S. Appl. No. 10/916,222.
Office Action dated Jun. 27, 2007 from Related U.S. Appl. No. 11/417,557 (Kates.012DV1).
First Office Action from the Patent Office of the People's Republic of China regarding Application No. 200510005907.8, dated Jun. 29, 2007.
Office Action dated Jul. 11, 2007 from Related U.S. Appl. No. 11/417,609 (Kates.012DV1).
Office Action dated Jul. 11, 2007 from Related U.S. Appl. No. 11/417,701 (Kates.021DV1).
Final Office Action regarding U.S. Appl. No. 09/977,552, dated Jul. 23, 2007.
Notice of Allowance dated Jul. 25, 2007 from Related U.S. Appl. No. 10/916,223 (Kates.003A).
Office Action dated Aug. 17, 2007 from Related U.S. Appl. No. 11/417,609.
Office Action dated Aug. 17, 2007 from Related U.S. Appl. No. 11/417,701.
Office Action dated Aug. 21, 2007 from Related U.S. Appl. No. 11/417,557.
Office Action dated Sep. 18, 2007 from Related U.S. Appl. No. 11/130,562.
Office Action regarding U.S. Appl. No. 11/098,582, dated Sep. 21, 2007.
International Search Report and Written Opinion of the International Searching Authority regarding International Application No. PCT/US06/33702, dated Sep. 26, 2007.
International Search Report, Int'l. App. No. PCT/US 06/05917, dated Sep. 26, 2007.
Written Opinion of the International Searching Authority, Int'l. App. No. PCT/US 06/05917, dated Sep. 26, 2007.
Office Action regarding U.S. Appl. No. 11/120,166, dated Oct. 2, 2007.
International Search Report for International Application No. PCT/US2007/016135 dated Oct. 22, 2007.
Notice of Allowance dated Oct. 26, 2007 from Related U.S. Appl. No. 10/916,223.
Final Office Action regarding U.S. Appl. No. 10/940,877, dated Nov. 13, 2007.
Notice of Allowance dated Dec. 3, 2007 from Related U.S. Appl. No. 11/130,562.
Notice of Allowance dated Dec. 21, 2007 from Related U.S. Appl. No. 11/417,609.
Office Action regarding U.S. Appl. No. 09/977,552, dated Jan. 11, 2008.
International Search Report for International Application No. PCT/US07/019563, dated Jan. 15, 2008, 3 Pages.
Written Opinion of the International Searching Authority regarding International Application No. PCT/US2007/019563, dated Jan. 15, 2008.
Office Action dated Feb. 15, 2008 from Related U.S. Appl. No. 11/417,557.
Examiner Interview Summary regarding U.S. Appl. No. 10/940,877, dated Mar. 25, 2008.
Office Action regarding U.S. Appl. No. 11/337,918, dated Mar. 25, 2008.
Office Action regarding U.S. Appl. No. 11/098,575, dated Mar. 26, 2008.
Office Action regarding U.S. Appl. No. 11/256,641, dated Apr. 29, 2008.
Office Action regarding U.S. Appl. No. 11/120,166, dated Jun. 5, 2008.
Office Action regarding U.S. Appl. No. 10/940,877, dated Jun. 5, 2008.
Office Action dated Jul. 1, 2008 from Related U.S. Appl. No. 11/927,425.
Office Action regarding U.S. Appl. No. 11/098,582, dated Jul. 7, 2008.
Office Action dated Jul. 16, 2008 from Related U.S. Appl. No. 11/417,701.
Office Action dated Jul. 24, 2008 from Related U.S. Appl. No. 11/417,557.
International Search Report from PCT /US2008/060900, Aug. 4, 2008, 6 pages.
First Office Action issued by the Chinese Patent Office for Application No. 200480015875.3, dated Sep. 5, 2008.
Office Action regarding U.S. Appl. No. 11/098,575, dated Sep. 9, 2008.
Examiner Interview regarding U.S. Appl. No. 11/256,641, dated Sep. 16, 2008.
Final Office Action regarding U.S. Appl. No. 09/977,552, dated Oct. 22, 2008.
Office Action regarding U.S. Appl. No. 11/337,918, dated Oct. 28, 2008.
Notice of Allowance dated Nov. 3, 2008 from Related U.S. Appl. No. 11/417,701.
Non-Final Office Action regarding U.S. Appl. No. 11/214,179, dated Nov. 5, 2008.
Examiner Interview Summary regarding U.S. Appl. No. 10/940,877, dated Dec. 8, 2008.
International Search Report for International Application No. PCT/US2008/009618, dated Dec. 8, 2008.
Office Action regarding U.S. Appl. No. 10/940,877, dated Dec. 8, 2008.
Written Opinion of International Searching Authority for International Application No. PCT/US2008/009618, dated Dec. 8, 2008.
First Official Report regarding Australian Patent Application No. 2007214381, dated Dec. 12, 2008.
Office Action regarding U.S. Appl. No. 11/120,166, dated Dec. 15, 2008.

(56) References Cited

OTHER PUBLICATIONS

Office Action for U.S. Appl. No. 11/497,644, dated Dec. 19, 2008.
Office Action for U.S. Appl. No. 11/394,380, dated Jan. 6, 2009.
Office Action dated Jan. 18, 2006 from Related U.S. Appl. No. 11/130,871 (Kates.002A).
Office Action regarding U.S. Appl. No. 11/098,575, dated Jan. 29, 2009.
Interview Summary regarding U.S. Appl. No. 11/214,179, dated Jan. 30, 2009.
Final Office Action regarding U.S. Appl. No. 11/256,641, dated Feb. 2, 2009.
Office Action dated Feb. 3, 2009 from Related U.S. Appl. No. 11/866,295.
Office Action dated Feb. 13, 2009 from Related U.S. Appl. No. 12/033,765.
Office Action dated Feb. 13, 2009 from Related U.S. Appl. No. 12/050,821.
Notice of Allowance and Fees Due and Notice of Allowability regarding U.S. Appl. No. 11/098,582, dated Feb. 24, 2009.
International Preliminary Report on Patentability regarding International Application No. PCT/US2007/019563 dated Mar. 10, 2009.
Final Office Action regarding U.S. Appl. No. 10/940,877, dated Apr. 27, 2009.
Office Action dated May 6, 2009 from Related U.S. Appl. No. 11/830,729.
Notice of Allowance and Fees Due and Notice of Allowability regarding U.S. Appl. No. 11/256,641, dated May 19, 2009.
Final Office Action regarding U.S. Appl. No. 11/214,179, dated May 29, 2009.
Office Action dated Jun. 17, 2009 from Related U.S. Appl. No. 12/033,765.
Office Action dated Jun. 19, 2009 from Related U.S. Appl. No. 11/866,295.
Third Office Action issued by the Chinese Patent Office on Jun. 19, 2009 regarding Application No. 200580013451.8, translated by CCPIT Patent and Trademark Law Office.
Second Office Action received from the Chinese Patent Office dated Jun. 26, 2009 regarding Application No. 200480011463.2, translated by CCPIT Patent and Trademark Law Office.
Office Action for U.S. Appl. No. 11/497,644, dated Jul. 10, 2009.
Office Action regarding U.S. Appl. No. 11/098,575, dated Jul. 13, 2009.
Office Action regarding U.S. Appl. No. 11/120,166, dated Jul. 20, 2009.
Notice of Panel Decision from Pre-Appeal Brief Review regarding U.S. Appl. No. 09/977,552, dated Aug. 4, 2009.
Office Action regarding U.S. Appl. No. 11/098,582, dated Aug. 4, 2009.
Office Action regarding U.S. Appl. No. 11/337,918, dated Aug. 17, 2009.
Advisory Action regarding U.S. Appl. No. 11/214,179, dated Aug. 28, 2009.
Notice of Allowance regarding U.S. Appl. No. 10/940,877, dated Sep. 4, 2009.
Office Action regarding U.S. Appl. No. 11/394,380, dated Sep. 25, 2009.
Advisory Action Before the Filing of an Appeal Brief regarding U.S. Appl. No. 11/098,575, dated Sep. 28, 2009.
Office Action for U.S. Appl. No. 11/497,579, dated Oct. 27, 2009.
Examination Report received from Australian Government IP Australia dated Oct. 29, 2009 regarding patent application No. 2008202088.
Second Official Report regarding Australian Patent Application No. 2007214381, dated Oct. 30, 2009.
Advisory Action Before the Filing of an Appeal Brief regarding U.S. Appl. No. 11/098,575, dated Nov. 16, 2009.
Supplementary European Search Report regarding Application No. PCT/US2006/005917, dated Nov. 23, 2009.
Examiner-Initiated Interview Summary regarding U.S. Appl. No. 11/214,179, dated Dec. 11, 2009.
Examiner's Answer regarding U.S. Appl. No. 09/977,552, dated Dec. 17, 2009.
Non-Final Office Action for U.S. Appl. No. 11/098,575 dated Jan. 27, 2010.
Office Action regarding U.S. Appl. No. 11/497,644, dated Jan. 29, 2010.
Restriction Requirement regarding U.S. Appl. No. 11/214,179, dated Feb. 2, 2010.
Final Office action regarding U.S. Appl. No. 11/337,918, dated Feb. 4, 2010.
Office Action regarding U.S. Appl. No. 11/120,166, dated Feb. 17, 2010.
Office Action regarding U.S. Appl. No. 11/098,582 dated Mar. 3, 2010.
International Preliminary Report on Patentability for International Application No. PCT/US2008/009618, dated Mar. 24, 2010.
Interview Summary regarding U.S. Appl. No. 11/098,582, dated Apr. 27, 2010.
Interview Summary regarding U.S. Appl. No. 11/497,644, dated May 4, 2010.
Final Office Action regarding U.S. Appl. No. 11/497,579, dated May 14, 2010.
Non-Final Office Action regarding U.S. Appl. No. 11/214,179, dated Jun. 8, 2010.
Office Action regarding U.S. Appl. No. 11/497,644, dated Jun. 14, 2010.
Supplementary European Search Report regarding European Application No. EP06790063, dated Jun. 15, 2010.
Final Office Action regarding U.S. Appl. No. 11/098,575, dated Jun. 17, 2010.
Interview Summary regarding U.S. Appl. No. 11/497,579, dated Jul. 15, 2010.
Second Office Action regarding Chinese Patent Application No. 200780030810X, dated Aug. 4, 2010. English translation provided by Unitalen Attorneys at Law.
Non-Final Office Action mailed Aug. 13, 2010 for U.S. Appl. No. 12/054,011.
Office Action regarding U.S. Appl. No. 11/850,846, dated Aug. 13, 2010.
Office Action regarding U.S. Appl. No. 11/776,879, dated Sep. 17, 2010.
Notice of Allowance and Fees Due and Notice of Allowability regarding U.S. Appl. No. 11/098,582, dated Sep. 24, 2010.
First Office Action regarding Chinese Patent Application No. 200780032977.X, dated Sep. 27, 2010. English translation provided by Unitalen Attorneys at Law.
Final Office Action mailed Dec. 7, 2010 for U.S. Appl. No. 12/054,011.
Final Office Action regarding U.S. Appl. No. 11/497,644, dated Dec. 22, 2010.
First Office Action regarding Chinese Patent Application No. 201010117657.8, dated Dec. 29, 2010. English translation provided by Unitalen Attorneys at Law.
International Search Report regarding Application No. PCT/US2010/036601, mailed Dec. 29, 2010.
Written Opinion of the International Searching Authority regarding Application No. PCT/US2010/036601, mailed Dec. 29, 2010.
Non-Final Office Action regarding U.S. Appl. No. 11/214,179, dated Jan. 24, 2011.
Final Office Action regarding U.S. Appl. No. 11/337,918, dated Feb. 17, 2011.
Non-Final Office Action mailed Mar. 3, 2011 for U.S. Appl. No. 12/054,011.
Notice of Allowance regarding U.S. Appl. No. 12/685,424, dated Apr. 25, 2011.
First Office Action regarding Chinese Application No. 200880106319.5, dated May 25, 2011. English translation provided by Unitalen Attorneys at Law.
Communication from European Patent Office concerning Substantive Examination regarding European Patent Application No. 06790063.9, dated Jun. 6, 2011.
International Search Report regarding Application No. PCT/US2010/056315, mailed Jun. 28, 2011.

(56) References Cited

OTHER PUBLICATIONS

Final Office Action for U.S. Appl. No. 12/054,011, dated Jun. 30, 2011.
Final Office Action regarding U.S. Appl. No. 11/214,179, dated Jul. 21, 2011.
Third Office Action regarding Chinese Application No. 2005100059078 from the State Intellectual Property Office of People's Republic of China, dated Aug. 24, 2011. Translation provided by Unitalen Attorneys at Law.
Non-Final Office Action for U.S. Appl. No. 12/054,011, dated Oct. 20, 2011.
Notice of Allowance and Fees Due, Interview Summary and Notice of Allowability regarding U.S. Appl. No. 11/214,179, dated Nov. 23, 2011.
Examiner's First Report on Australian Patent Application No. 2007292917 dated Jan. 10, 2012.
Non-Final Office Action in U.S. Appl. No. 12/685,375, mailed Jan. 19, 2012.
Issue Notification regarding U.S. Appl. No. 11/214,179, dated Mar. 14, 2012.
Office Action regarding U.S. Appl. No. 13/303,286, dated Mar. 26, 2012.
Non-Final Office Action for U.S. Appl. No. 12/054,011, dated Apr. 10, 2012.
Non-Final office Action regarding U.S. Appl. No. 11/850,846, dated Apr. 24, 2012.
First Office Action regarding Chinese Patent Application No. 200910211779.0, dated May 3, 2012. English translation provided by Unitalen Attorneys at Law.
International Preliminary Report on Patentability regarding Application No. PCT/US2010/056315, mailed May 24, 2012.
Non-Final Office Action regarding U.S. Appl. No. 13/435,543, dated Jun. 21, 2012.
Notice of Allowance regarding U.S. Appl. No. 11/776,879, dated Jul. 9, 2012.
Notice of Allowance regarding U.S. Appl. No. 13/303,286, dated Jul. 19, 2012.
Non-Final Office Action for U.S. Appl. No. 12/685,375, mailed Aug. 6, 2012.
Final Office Action for U.S. Appl. No. 11/850,846, mailed Aug. 13, 2012.
Non-Final Office Action regarding U.S. Appl. No. 12/955,355, dated Sep. 11, 2012.
Notice of Allowance and Fee(s) Due regarding U.S. Appl. No. 12/789,562, dated Oct. 26, 2012.
European Search Report for Application No. EP 12 182 243.1, dated Oct. 29, 2012.
Extended European Search Report regarding Application No. 12182243.1-2311, dated Oct. 29, 2012.
Non-Final Office Action for U.S. Appl. No. 13/030,549, dated Nov. 5, 2012.
Record of Oral Hearing regarding U.S. Appl. No. 09/977,552, dated Nov. 29, 2012.
Non-Final Office Action regarding U.S. Appl. No. 12/943,626, dated Dec. 20, 2012.
First Examination Report regarding Australian Patent Application No. 2010319488, dated Jan. 10, 2013.
Second Office Action regarding Chinese Patent Application No. 200910211779.0, dated Feb. 4, 2013. English translation provided by Unitalen Attorneys at Law.
International Search Report regarding Application No. PCT/US2013/021161, mailed May 8, 2013.
Written Opinion of the International Searching Authority regarding Application No. PCT/US2013/021161, mailed May 8, 2013.
Non-Final Office Action in U.S. Appl. No. 11/850,846, mailed May 24, 2013.
Non-Final Office Action in U.S. Appl. No. 13/784,890, mailed Jun. 11, 2013.
First Office Action regarding Canadian Patent Application No. 2,777,349, dated Jul. 19, 2013.

Third Office Action regarding Chinese Patent Application No. 200910211779.0, dated Sep. 4, 2013. English translation provided by Unitalen Attorneys at Law.
Notice of Grounds for Refusal regarding Korean Patent Application No. 10-2009-7000850, mailed Oct. 4, 2013. English translation provided by Y.S. Chang & Associates.
First Office Action regarding Chinese Patent Application No. 201110349785.X, dated Nov. 21, 2013, and Search Report. English translation provided by Unitalen Attorneys at Law.
Non-Final Office Action regarding U.S. Appl. No. 13/932,611, mailed Nov. 25, 2013.
Office Action regarding U.S. Appl. No. 13/737,566, dated Dec. 20, 2013.
Final Office Action regarding U.S. Appl. No. 13/784,890, mailed Dec. 30, 2013.
Fourth Office Action regarding Chinese Patent Application No. 200910211779.0, dated Jan. 6, 2014. English translation provided by Unitalen Attorneys at Law.
European Search Report regarding Application No. 07811712.4-1608 / 2069638 PCT/US2007019563, dated Jan. 7, 2014.
Non-Final Office Action regarding U.S. Appl. No. 13/770,479, dated Jan. 16, 2014.
Final Office Action regarding U.S. Appl. No. 11/850,846, mailed Jan. 17, 2014.
International Search Report for PCT/US2012/026973, Sep. 3, 2012, 5 pages.
International Search Report for PCT/US2013/061389, Jan. 22, 2014, 7 pages.
Non Final Office Action from related U.S. Appl. No. 13/269,188 dated Oct. 4, 2013; 11 pages.
Restriction from related U.S. Appl. No. 13/269,188 dated Apr. 9, 2013; 5 pages.
Non Final Office Action from related U.S. Appl. No. 13/269,188 dated Aug. 14, 2012; 9 pages.
Non Final Office Action from related U.S. Appl. No. 13/269,188 dated Jul. 17, 2014; 10 pages.
Non Final Office Action from related U.S. Appl. No. 13/269,188 dated Feb. 20, 2014; 9 pages.
Final Office Action from related U.S. Appl. No. 13/269,188 dated May 23, 2013; 11 pages.
Non Final Office Action from related U.S. Appl. No. 13/767,479 dated Oct. 24, 2013; 8 pages.
Final Office Action from related U.S. Appl. No. 13/767,479 dated Mar. 14, 2014; 6 pages.
Non Final Office Action from related U.S. Appl. No. 13/835,742 dated Oct. 7, 2013; 9 pages.
Notice of Allowance from related Application No. 13/835,742 dated Jan. 31, 2014; 7 pages.
Notice of Allowance from related U.S. Appl. No. 13/835,742 dated Jun. 2, 2014; 8 pages.
Non Final Office Action from related U.S. Appl. No. 13/835,810 dated Nov. 15, 2013; 9 pages.
Notice of Allowance from related U.S. Appl. No. 13/835,810 dated Mar. 20, 2014; 9 pages.
Non Final Office Action from related U.S. Appl. No. 13/835,621 dated Oct. 30, 2013; 8 pages.
Non Final Office Action from related U.S. Appl. No. 13/835,621 dated Apr. 2, 2014; 11 pages.
Non Final Office Action from related U.S. Appl. No. 13/836,043 dated Oct. 23, 2013; 8 pages.
Final Office Action from related U.S. Appl. No. 13/836,043 dated Mar. 12, 2014; 5 pages.
Non Final Office Action from related U.S. Appl. No. 13/836,043 dated Jul. 11, 2014; 5 pages.
Non Final Office Action from related U.S. Appl. No. 13/836,244 dated Oct. 15, 2013; 11 pages.
Non Final Office Action from related U.S. Appl. No. 13/836,244 dated Feb. 20, 2014; 10 pages.
Notice of Allowance from related U.S. Appl. No. 13/836,244 dated Jul. 2, 2014; 8 pages.
Non Final Office Action from related U.S. Appl. No. 13/836,453 dated Aug. 20, 2013; 8 pages.

(56) References Cited

OTHER PUBLICATIONS

Notice of Allowance from related U.S. Appl. No. 13/836,453 dated Jan. 14, 2014; 8 pages.
Notice of Allowance from related U.S. Appl. No. 13/836,453 dated Apr. 21, 2014; 8 pages.
Non Final Office Action from related U.S. Appl. No. 13/369,067 dated Jan. 16, 2014; 16 pages.
Final Office Action from related U.S. Appl. No. 13/369,067 dated May 1, 2014; 19 pages.
Non Final Office Action from related U.S. Appl. No. 13/767,479 dated Jul. 23, 2014; 9 pages.
Final Office Action regarding U.S. Appl. No. 13/932,611, mailed May 28, 2014.
Supplementary European Search Report regarding Application No. EP 07 81 1712, dated Jan. 7, 2014.
Notice of Allowance and Fees Due regarding U.S. Appl. No. 12/261,643, dated Jun. 23, 2014.
Extended European Search Report regarding Application No. 07796879.0-1602 / 2041501 PCT/US2007016135, dated Jul. 14, 2014.
Interview Summary from related U.S. Appl. No. 12/054,011 dated Jan. 30, 2012.
Written Opinion from related PCT Application No. PCT/US2014/028074 mailed Jun. 19, 2014.
Advisory Action from related U.S. Appl. No. 13/784,890 dated Mar. 14, 2014.
International Search Report from related PCT Application No. PCT/US2014/028074 mailed Jun. 19, 2014.
Examiner's Answer from related U.S. Appl. No. 13/784,890 dated Jul. 3, 2014.
Notice of Allowance for related U.S. Appl. No. 13/835,810 dated Aug. 5, 2014.
Non Final Office Action for related U.S. Appl. No. 13/369,067 dated Aug. 12, 2014.
Notice of Allowance from related U.S. Appl. No. 13/836,453 dated Aug. 4, 2014.
Non Final Office Action for related U.S. Appl. No. 13/835,621 dated Aug. 8, 2014.
Non-Final Office Action for U.S. Appl. No. 11/776,879, dated Mar. 16, 2012.
European Search Report for Application No. EP 04 81 5853, dated Jul. 17, 2007, 2 Pages.
European Search Report for Application No. EP 06 02 6263, dated Jul. 17, 2007, 4 Pages.
First Office Action issued by the Chinese Patent Office on May 30, 2008 regarding Application No. 200580013451.8, 8 Pages.
Second Office Action issued by the Chinese Patent Office on Mar. 6, 2009 regarding Application No. 200580013451.8, 7 Pages.
Ultrasite User's Guide RMCC Supplement, Computer Process Controls, Jun. 9, 1997.
Ultrasite User's Guide BCU Supplement, Computer Process Controls, Sep. 4, 1997.
Ultrasite User's Guide BEC Supplement, Computer Process Controls, Oct. 6, 1997.
Building Control Unit (BCU) Installation and Operation Manual, Computer Process Controls, Jan. 28, 1998, 141 pages.
Einstein RX-300 Refrigeration Controller Installation and Operation Manual, Computer Process Controls, Apr. 1, 1998, 329 pages.
Ultrasite 32 User's Guide, Computer Process Controls, Sep. 28, 1999.
Notification of First Office Action from the State Intellectual Property Office of People's Republic of China regarding Chinese Patent Application No. 200880122964.6, dated Nov. 5, 2012. Translation provided by Unitalen Attorneys at Law.
Patent Examination Report No. 3 regarding Australian Patent Application No. 2008325240, dated Jul. 19, 2012.
International Search Report and Written Opinion of the ISA regarding International Application No. PCT/US2014/032927, ISA/KR dated Aug. 21, 2014.
Notice of Allowance and Fees Due regarding U.S. Appl. No. 12/943,626, dated Jun. 19, 2014.
Fourth Office Action from the State Intellectual Property Office of People's Republic of China regarding Chinese Patent Applicaiton No. 200510005907.8, dated Dec. 8, 2011. Translation provided by Unitalen Attorneys at Law.
European Search Report regarding Application No. 04022784.5-2315 / 1500821, dated Aug. 14, 2012.
Notice of Allowance and Fees Due regarding U.S. Appl. No. 13/737,566, dated Jun. 18, 2014.
Non-Final Office Action regarding U.S. Appl. No. 13/770,123, dated Jun. 11, 2014.
Notice of Allowance for related U.S. Appl. No. 13/836,043, dated Oct. 9, 2014.
Notice of Allowance for related U.S. Appl. No. 13/836,244, dated Oct. 30, 2014.
Office Action for related U.S. Appl. No. 13/269,188, dated Oct. 6, 2014.
Office Action for related U.S. Appl. No. 13/767,479, dated Oct. 21, 2014.
International Search Report and Written Opinion for related PCT Application No. PCT/US2014/028859, dated Aug. 22, 2014.
Non Final Office Action for Application No. 13/407,180, dated Dec. 2, 2014.
Notice of Allowance and Fees Due regarding U.S. Appl. No. 13/737,566, dated Sep. 24, 2014.
Second Office Action from the State Intellectual Property Office of People's Republic of China regarding Chinese Patent Application No. 201110349785.X, dated Jul. 25, 2014. Translation provided by Unitalen Attorneys at Law.
Examiner's Report No. 1 regarding Australian Patent Application No. 2013202431, dated Nov. 25, 2014.
Patent Examination Report for Austrialian Application No. 2012223466 dated Jan. 6, 2015.
Notice of Allowance for U.S. Appl. No. 13/835,742 dated Dec. 24, 2014.
Notice of Allowance for U.S. Appl. No. 13/835,810 date Jan. 2, 2015.
Notice of Allowance for U.S. Appl. No. 13/836,453 dated Dec. 24, 2014.
Office Action for U.S. Appl. No. 13/835,621 dated Dec. 29, 2014.
Final Office Action for U.S. Appl. No. 13/770,123 dated Dec. 22, 2014.
Notice of Allowance for U.S. Appl. No. 13/836,043 dated Feb. 4, 2015.
Office Action for U.S. Appl. No. 13/767,479 dated Feb. 6, 2015.
Office Action for U.S. Appl. No. 13/269,188 dated Feb. 10, 2015.
Office Action for Canadian Application No. 2,828,740 dated Jan. 12, 2015.
Third Chinese Office Action regarding Application No. 201110349785.X, dated Jan. 30, 2015. Translation provided by Unitalen Attorneys at Law.
Non-Final Office Action regarding U.S. Appl. No. 13/932,611, dated Jan. 30, 2015.
Notice of Allowance regarding U.S. Appl. No. 13/835,621, dated Mar. 10, 2015.
Interview Summary regarding U.S. Appl. No. 13/269,188, mailed Mar. 18, 2015.
Final Office Action and Interview Summary regarding U.S. Appl. No. 13/407,180, mailed Mar. 13, 2015.
Office Action regarding U.S. Appl. No. 13/770,479, mailed Mar. 16, 2015.
Office Action regarding U.S. Appl. No. 13/770,123, mailed Apr. 2, 2015.
Notice of Allowance regarding U.S. Appl. No. 13/767,479, dated Mar. 31, 2015.
Office Action from U.S. Appl. No. 13/369,067 dated Apr. 3, 2015.
Haiad et al., "EER & SEER as Predictors of Seasonal Energy Performance ", Oct. 2004, Southern California Edison, http://www.doe2.com/download/DEER/SEER%2BProgThermostats/EER-SEER_CASE_ProjectSummary_Oct2004_V6a.pdf.
Notice of Allowance regarding U.S. Appl. No. 13/835,742, mailed Apr. 17, 2015.

(56) References Cited

OTHER PUBLICATIONS

Notice of Allowance regarding U.S. Appl. No. 13/836,453, mailed Apr. 15, 2015.
Advisory Action regarding U.S. Appl. No. 13/269,188, dated Apr. 13, 2015.
U.S. Office Action regarding U.S. Appl. No. 13/269,188, dated May 8, 2015.
U.S. Office Action regarding U.S. Appl. No. 14/212,632, dated May 15, 2015.
First Chinese Office Action regarding Application No. 201380005300.2, dated Apr. 30, 2015. Translation provided by Unitalen Attorneys at Law.
Advisory Action and Interview Summary regarding U.S. Appl. No. 13/407,180, dated May 27, 2015.
Interview Summary regarding U.S. Appl. No. 13/407,180, dated Jun. 11, 2015.
Interview Summary regarding U.S. Appl. No. 13/770,479, dated Jun. 16, 2015.
Extended European Search Report regarding European Application No. 08845689.2-1608/2207964, dated Jun. 19, 2015.
Extended European Search Report regarding European Application No. 08848538.8-1608 / 2220372, dated Jun. 19, 2015.
Notice of Allowance regarding U.S. Appl. No. 13/932,611, dated Jul. 6, 2015.
Restriction Requirement regarding U.S. Appl. No. 14/244,967, dated Jul. 14, 2015.
Interview Summary regarding U.S. Appl. No. 13/369,067, dated Jul. 16, 2015.
Applicant-Initiated Interview Summary and Advisory Action regarding U.S. Appl. No. 13/369,067, dated Jul. 23, 2015.
Faramarzi et al., "Performance Evaluation of Rooftop Air Conditioning Units at High Ambient Temperatures," 2004 ACEEE Summer Study on Energy Efficiency in Buildings—http://aceee.org/files/proceedings/2004/data/papers/SS04_Panel3_Paper05.pdf.
Notice of Allowance regarding U.S. Appl. No. 12/261,643, mailed Jul. 29, 2015.
Notice of Allowance regarding U.S. Appl. No. 13/770,123, dated Aug. 13, 2015.
Notice of Allowance and Interview Summary regarding U.S. Appl. No. 13/269,188, dated Aug. 26, 2015.
Office Action regarding Indian Patent Application No. 733/KOLNP/2009, dated Aug. 12, 2015.
Applicant-Initiated Interview Summary regarding U.S. Appl. No. 14/212,632, dated Sep. 2, 2015.
Notice of Allowance regarding U.S. Appl. No. 13/369,067, dated Sep. 2, 2015.
Notice of Allowance regarding U.S. Appl. No. 13/407,180, dated Sep. 4, 2015.
Final Office Action regarding U.S. Appl. No. 13/770,479, dated Sep. 4, 2015.
Office Action regarding U.S. Appl. No. 14/209,415, dated Sep. 10, 2015.
Search Report regarding European Patent Application No. 13736303.2-1806, dated Sep. 17, 2015.
First Office Action regarding Chinese Patent Application No. 201280010796.8, dated Sep. 14, 2015. Translation provided by Unitalen Attorneys At Law.
Notice of Allowance regarding U.S. Appl. No. 13/770,123, dated Oct. 1, 2015.
Office Action regarding Australian Patent Application No. 2013323760, dated Sep. 25, 2015.
Office Action and Interview Summary regarding U.S. Appl. No. 14/244,967, dated Oct. 7, 2015.
Office Action regarding U.S. Appl. No. 14/255,519, dated Nov. 9, 2015.
Office Action regarding U.S. Appl. No. 14/212,632, dated Nov. 19, 2015.
Interview Summary regarding U.S. Appl. No. 13/770,479, dated Nov. 25, 2015.
Office Action regarding Chinese Patent Application No. 201380049458.X, dated Nov. 13, 2015. Translation provided by Unitalen Attorneys at Law.
Search Report regarding European Patent Application No. 08251185.8-1605 / 2040016, dated Dec. 4, 2015.
Interview Summary regarding U.S. Appl. No. 12/054,011, dated Jan. 30, 2013.
Office Action regarding U.S. Appl. No. 14/193,568, dated Nov. 3, 2015.
Office Action regarding Chinese Patent Application No. 201380005300.2, dated Jan. 4, 2016. Translation provided by Unitalen Attorneys at Law.
Office Action regarding Australian Patent Application No. 2015207920, dated Dec. 4, 2015.

* cited by examiner

US 9,762,168 B2

COMPRESSOR HAVING A CONTROL AND DIAGNOSTIC MODULE

CROSS-REFERENCE TO RELATED APPLICATIONS

The present application is a continuation of U.S. patent application Ser. No. 14/033,604 (now U.S. Pat. No. 9,310, 439), filed on Sep. 23, 2013, which claims the benefit of U.S. Provisional Application No. 61/705,373, filed on Sep. 25, 2012. The entire disclosures of the above applications are incorporated herein by reference.

FIELD

The present disclosure relates to compressors and, more particularly, to systems and methods of control and diagnostics for a compressor with a run capacitor.

BACKGROUND

The statements in this section merely provide background information related to the present disclosure and may not constitute prior art.

Compressors are used in a variety of industrial and residential applications to circulate refrigerant within a refrigeration, heat pump, HVAC, or chiller system (generically "refrigeration systems") to provide a desired heating or cooling effect. A compressor may include an electric motor to provide torque to drive the compressor to compress vapor refrigerant. The electric motor may be powered by an alternating current (AC) or direct current (DC) power supply. In the case of an AC power supply, single or poly-phase AC may be delivered to windings of the electric motor.

For a single-phase power supply, the refrigeration system may include a run capacitor used to initially store and supply power to the compressor. The run capacitor, however, may become faulty either with capacitance degradation or complete loss of capacitance (i.e., an open circuit condition). For example, capacitance degradation or complete loss of capacitance may occur after a period of use due to aging or overheating. A run capacitor with degraded capacitance may cause the compressor to perform below a desired capacity and/or efficiency performance standard. A run capacitor with zero capacitance may cause a start circuit for the compressor to be open, which could result in, for example, a locked rotor trip of a corresponding motor protector circuit shortly after motor start-up. In such case, the electric motor may not provide the compressor with enough torque to rotate, resulting in no cooling production and in an interruption in operation and use of the refrigeration system. Accordingly, a system designed to predict a run capacitor fault, such as capacitance degradation or complete loss of capacitance, is desired.

SUMMARY

A system is provided comprising a power supply that generates an alternating current power for powering a compressor with a capacitor, a voltage sensor that measures a plurality of voltage values based on the alternating current power, a current sensor that measures a plurality of current values based on the alternating current power, and a controller. The controller communicates with the voltage sensor and the current sensor and determines a power factor value based on at least one of the plurality of voltage values and at least one of the plurality of current values. The controller also determines a fault in the capacitor based on the power factor and at least one of the plurality of current values.

A method is provided comprising generating, with a power supply, an alternating current power for powering a compressor with a capacitor, measuring, with a voltage sensor, a plurality of voltage values based on the alternating current power, and measuring, with a current sensor, a plurality of current values based on the alternating current power. The method also comprises determining, with a controller in communication with the voltage sensor and the current sensor, a power factor value based on at least one of the plurality of voltage values and at least one of the plurality of current values, determining, with the controller, a fault in the capacitor based on the power factor and at least one of the plurality of current values; and communicating the fault in the capacitor from the controller to at least one of a user, a service person, a system controller, a remote server, a thermostat, a mobile device, and an email address.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

Figure 1:
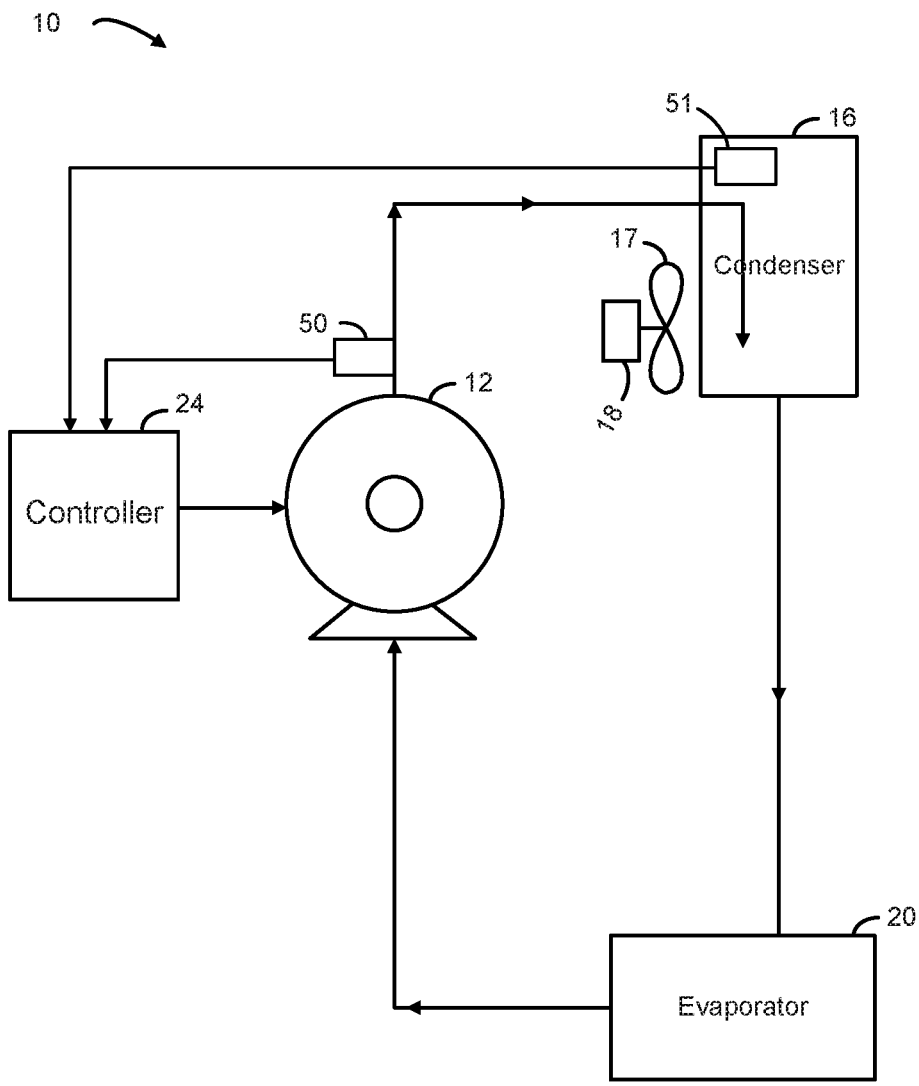
FIG. 1 is a schematic illustration of a refrigeration system.

With reference to FIG. 1, an exemplary refrigeration system 10 may include a compressor 12. Compressor 12 may be a reciprocating compressor, a scroll type compressor, or another type of compressor. Compressor 12 may be equipped with an electric motor to compress refrigerant vapor that is delivered to a condenser 16 where the refrigerant vapor is liquefied at high pressure, thereby rejecting heat to the outside air. Condenser 16 may include a condenser fan 17, driven by an electric motor 18 that circulates air across coils of the condenser 16. The liquid refrigerant exiting the condenser 16 is delivered to an evaporator 20. As hot air moves across the evaporator, the liquid turns into gas, thereby removing heat from the air and cooling a refrigerated space. This low pressure gas is delivered to the compressor 12 and again compressed to a high pressure gas to start the refrigeration cycle again. While the refrigeration system 10 is shown with one compressor 12, a condenser 16, and an evaporator 20 in FIG. 1, the refrigeration system 10 may be configured with any number of compressors 12, condensers 18, evaporators 20, or other refrigeration system components.

Compressor 12 may be equipped with a controller 24. As described herein, controller 24 may monitor electric power delivered to compressor 12 and to the electric motor 18 that drives the condenser fan 17 with one or more voltage sensors and one or more current sensors. Based on electrical power measurements over time, such as electric current (I) and voltage (V), controller 24 may determine and monitor apparent power, actual power, power consumption, and power factor calculations for the electric motor of the compressor 12 over time.

Controller 24 may monitor and control operation of compressor 12 based on the electric current (I) and voltage (V) measurements and based on other compressor and refrigeration system data received from other compressor or refrigeration system sensors.

Controller 24 may activate or deactivate compressor 12 based on data received from the one or more voltage sensors and the one or more current sensors. For example, controller 24 may deactivate compressor 12 based on an excessive current or voltage condition, a deficient current or voltage condition, a current or voltage imbalance condition, or a loss of phase or current delay condition (if poly-phase electric power is used).

Controller 24 may be used and configured to control the overall operation of the refrigeration system 10. Controller 24 may monitor refrigeration system operating conditions, such as condenser temperatures and pressures, and evaporator temperatures and pressures, as well as environmental conditions, such as ambient temperature, to determine refrigeration system load and demand. For example, controller 24 may receive a compressor discharge temperature value from a compressor discharge temperature sensor 50. Alternatively, a compressor discharge pressure sensor may be used. Additionally, controller 24 may receive a condenser temperature value from a condenser temperature sensor 51 located at condenser 16. Alternatively, a condenser pressure sensor may be used. In addition, refrigeration system 10 may include multiple controllers working together to control refrigeration system. For example, controller 24 may be an outdoor unit controller located at an outdoor unit that includes the compressor 12, condenser 16, and condenser fan 17 with electric motor 18. In such case, controller 24 may communicate with, for example, an indoor unit controller and/or an indoor thermostat, which may monitor indoor conditions, such as an indoor temperature, and communicate activation or deactivation commands, or capacity demand instructions, to controller 24. Controller 24 may receive the commands or instructions and appropriately control the components of the outdoor unit, i.e., compressor 12 and condenser fan 17 with electric motor 18, based on the received commands or instructions. Controller 24 may adjust set-points based on operating conditions to maximize efficiency of refrigeration system 10 or may receive appropriate instructions from an indoor unit controller or indoor thermostat to adjust set-points to maximize efficiency. Controller 24 may also monitor a temperature of supply air and a temperature of return air of an indoor unit of the refrigeration system 10. Alternatively, an indoor unit controller or indoor thermostat may monitor the temperature of supply air and the temperature of return air of the indoor unit and may communicate such data to controller 24. Controller 24 may evaluate efficiency based on electric power measurements and calculations as described below.

Figure 2:
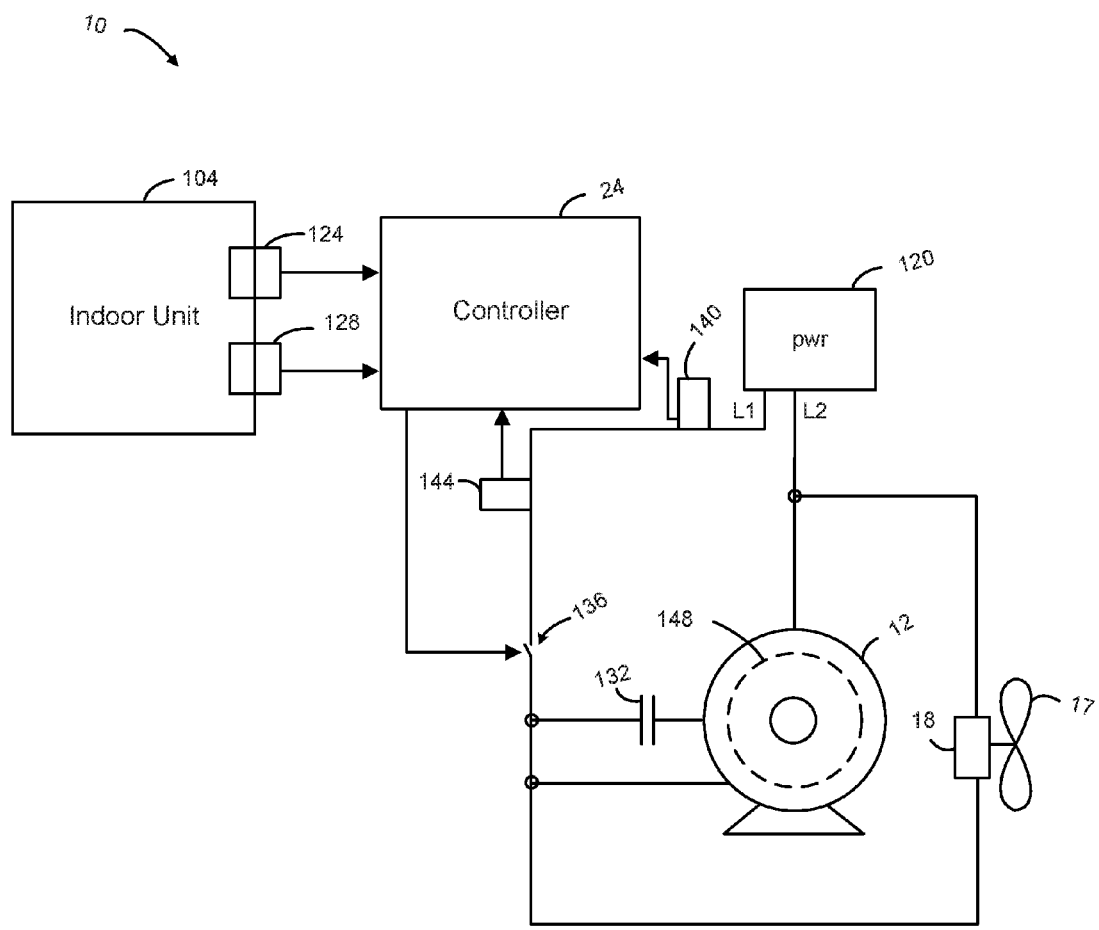
FIG. 2 is a block diagram of a refrigeration system.

With reference to FIG. 2, a block diagram of the refrigeration system 10 is shown in an HVAC application. For example, the refrigeration system 10 may be installed in an HVAC application wherein an indoor unit 104 includes evaporator 20 (FIG. 1) and an air handler unit and is located within a building, such as an office, retail store, or home, and wherein an outdoor unit includes compressor 12, condenser 16, and condenser fan 17 with electric motor 18. The refrigeration system 10 includes an alternating current (AC) power supply 120 that supplies electric power to an electric motor 148 of compressor 12 and to electric motor 18 for driving condenser fan 17. The indoor unit 104 supplies conditioned air (supply air) through a duct system. The air passes through the duct system and returns (return air) to the indoor unit 104. The indoor unit 104 includes a supply air temperature sensor 124 and a return air temperature sensor 128. The supply air temperature sensor 124 senses a supply air temperature supplied by the indoor unit 104 and communicates the supply air temperature to controller 24. Similarly, the return air temperature sensor 128 monitors a return air temperature returned to the indoor unit 104 and communicates the return air temperature to controller 24. As discussed above, the supply air temperature sensor 124 and the return air temperature sensor 128 may also communicate supply air temperature and return air temperature data to an indoor unit controller and/or indoor thermostat, which may, in turn, communicate the supply air temperature and return air temperature data to controller 24.

The power supply 120 is electrically coupled to the compressor 12 and condenser fan 17 via electrical terminals L1 and L2. In this way, the power supply 120 supplies power to the electric motor 148 of the compressor 12 and to the electric motor 18 of the condenser fan 17. The compressor 12 may also be electrically coupled to a run capacitor 132 and a contactor switch 136. The run capacitor 132 is arranged between the power supply 120 and the compressor 12. The run capacitor 132 stores power supplied by the power supply 120, when the refrigeration system 10 is powered on. When the refrigeration system 10 is powered on, the contactor switch 136 is electrically or mechanically closed by controller 24 to allow current to flow to the compressor 12. When the contactor switch 136 is closed, power is supplied to the condenser fan 17 and to the run capacitor 132. The run capacitor 132 stores power supplied by the power supply 120. The run capacitor 132 then provides initial power to the compressor 12 by supplying the stored power to the compressor 12.

Figure 2A:
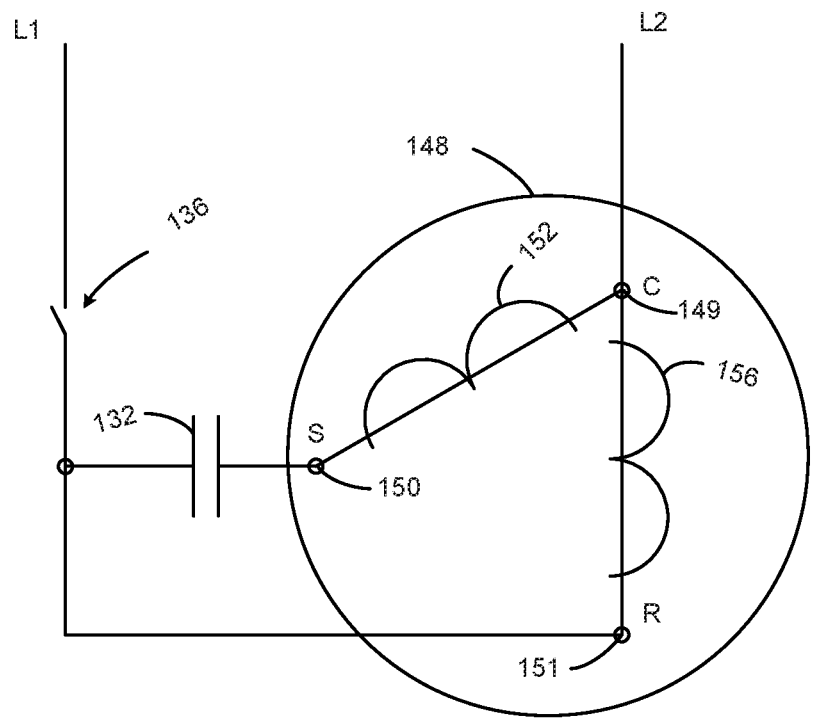
FIG. 2a is a schematic illustration of a compressor motor.

Referring now to FIG. 2*a*, a schematic of the compressor motor 148 is shown. The compressor motor 148 includes a stator with a plurality of windings, including a start winding 152 and a run winding 156. The start winding 152 is connected between a start point (S) 150 and a common point (C) 149. The run winding 156 is connected between a run point (R) 151 and the common point (C) 149. The start point (S) 150 and the run point (R) 151 are each connected to electrical terminal L1. The common point (C) 149 is connected to electrical terminal L2. The compressor motor 148 may also include a rotor (not shown). Current through the windings causes the rotor to rotate and the compressor motor 148 to run. For example, when the refrigeration system 10 is powered on, current through the start winding 152 energizes the stator. The stator energy then causes the rotor to turn. The compressor motor 148 is powered by the turning rotor. The current through the run winding 156 maintains power to the stator through a power cycle. The run capacitor 132 is electrically coupled in series with the start winding 152, for example, between the start point (S) 150 and electrical terminal L1. In this way, the run capacitor 132 stores power supplied by the power supply 120 and provides an initial current to the stator through the start winding 152.

With reference again to FIG. 2, the refrigeration system 10 also includes a voltage sensor 140 and a current sensor 144. The voltage sensor 140 senses a voltage value of power being supplied to the compressor 12 and condenser fan 17 and communicates the voltage value to the controller 24. For example, the voltage sensor 140 may measure voltage on the incoming power line connected to electrical terminal L1 or across the run capacitor 132. The current sensor 144 senses a current value of line power being supplied to the compressor 12 and the electric motor 18 of the condenser fan 17 and communicates the current value to the controller 24. The current sensor 144 can also be located at the run capacitor 132 to sense current through the run capacitor 132 in series with the start winding 152 (FIG. 2).

The controller 24 receives sample current and voltage measurements periodically over each cycle of AC power to determine multiple instantaneous current and voltage measurements. For example, controller 24 may receive current and voltage measurements twenty times per cycle or approximately once every millisecond in the case of alternating current with a frequency of sixty hertz. From these actual current and voltage measurements, the controller 24 may calculate additional power related data such as true and apparent power, power consumption over time, and power factor.

Based on actual current and voltage measurements, the controller 24 may determine a root mean square (RMS) value for voltage and current. The controller 24 may calculate an RMS voltage value by squaring each of the sampled voltage measurements, averaging the squared measurements, and calculating the square root of the average. Likewise, the controller 24 may calculate an RMS current value by squaring each of the sampled current measurements, averaging the squared measurements, and calculating the square root of the average.

From RMS voltage and RMS current calculations, the controller 24 may calculate apparent power (S) according to the following equation:

$$S = V_{RMS} \cdot I_{RMS}, \quad (1)$$

where VRMS is the calculated RMS of voltage over at least one cycle of AC and where IRMS is the calculated RMS of current over at least one cycle of AC. Apparent power may be calculated in units of Volt-Amps (VA) or kilo-Volt-Amps (kVA).

For three-phase power, the controller 24 may calculate apparent power for each phase of AC power. The controller 24 may calculate total apparent power ($S_{Total}$) for an electric motor of compressor 12 based on apparent power calculations for each of the phases, according to the following equation:

$$S_{Total} = V_{RMS(1)} \cdot I_{RMS(1)} + V_{RMS(2)} \cdot I_{RMS(2)} + V_{RMS(3)} \cdot I_{RMS(3)}, \quad (2)$$

where $V_{RMS(1)}$, $V_{RMS(2)}$, and $V_{RMS(3)}$ are the calculated RMS voltage over a cycle of AC for the first, second, and third phase of AC, respectively, and where $I_{RMS(1)}$, $I_{RMS(2)}$, and $I_{RMS(3)}$ are the calculated RMS current over a cycle of AC for the first, second, and third phase of AC, respectively. Apparent power is calculated in units of Volt-Amps (VA) or kilo-Volt-Amps (kVA).

Active power (P), in units of watts (W) or kilo-watts (kW) may be calculated as an integral of the product of instantaneous currents and voltages over a cycle of AC, according to the following equation:

$$P = \frac{1}{T} \int_0^T (v(t)i(t))\,dt, \quad (3)$$

where v(t) is instantaneous voltage at time t, in units of volts; where i(t) is instantaneous current at time t, in units of amps; and where T is the period of the line cycle frequency (for example, 16.3 milliseconds for 60 hertz power).

Based on the actual instantaneous electrical current and voltage measurements sampled over a cycle of the AC power, controller 24 may calculate (P) as the sum of the products of instantaneous voltage and current samples for each sample interval (e.g., one millisecond), over one cycle of AC. Thus, P may be calculated by controller 24 according to the following equation:

$$P @ \frac{1}{T} \sum_{k=1}^{k=\frac{T}{Dt}} v(k)i(k)Dt, \quad (4)$$

where v(k) is the instantaneous voltage measurement for the kth sample; i(k) is the instantaneous current measurement for the kth sample; T is the period; and Δt is the sampling interval (e.g., 1 millisecond).

In a poly-phase system, P may be calculated for each phase of electric power. For example, in a three-phase system, the controller 24 may calculate a total active power ($P_{Total}$) by adding the active power for each phase, according to the following equation:

$$P_{Total} = P_{(1)} = P_{(2)} = P_{(3)}, \quad (5)$$

where $P_{(1)}$, $P_{(2)}$, and $P_{(3)}$ are the active power for the first, second, and third phase of AC, respectively.

Based on the active power calculations, the controller 24 may calculate energy consumption by calculating an average of active power for each unit of time and integrating over a certain time period such as days, months or years. Energy consumption may be calculated by the controller 24 in units of watt-hours (WH) or kilo-watt-hours (kWH).

Further, based on the active power calculation and the apparent power calculation, the controller 24 may calculate the power factor (PF) according to the following equation:

$$PF = \frac{P}{S}, \quad (6)$$

where P is active power in units of watts (W) or kilo-watts (kW); and where S is apparent power in units of volt-amps (VA) or kilo-volt-amps (kVA). Generally, PF is the ratio of the power consumed to the power drawn. The controller 24 may calculate PF for each phase of electric power. The controller 24 may also calculate a total PF as a ratio of total actual power to total apparent power, according to the following equation:

$$PF_{Total} = \frac{P_{Total}}{S_{Total}}, \quad (7)$$

where $P_{total}$ and $S_{Total}$ are calculated according to formulas 2 and 5 above.

Alternatively, the controller 24 may calculate power factor by comparing the zero crossings of the voltage and current waveforms. The processor may use the angular difference between the zero crossings as an estimate of PF. The controller 24 may monitor voltage and current measurements to determine voltage and current waveforms for AC power. Based on the measurements, the controller 24 may determine where each waveform crosses the zero axis. By comparing the two zero crossings, the controller 24 may determine an angular difference between the voltage waveform and the current waveform. The current waveform may lag the voltage waveform, and the angular difference may be used by the controller 24 as an estimate of PF.

PF may be used as an indication of the efficiency of the electric motor, or the compressor. Increased lag between the current waveform and the voltage waveform results in a lower power factor. A power factor near one, i.e., a unity power factor, is more desirable than a lower power factor. An electric motor with a lower power factor may require more energy to operate, thereby resulting in increased power consumption. Additionally, utility providers may impose a tariff for equipment operating below a pre-determined PF value.

PF may also be used as an indication of a fault in a system component, such as the run capacitor 132. For example, the controller 24 may determine a fault in the run capacitor 132 based on a PF value and a current value. Further, the controller 24 may confirm the impact or result of the capacitor fault by detecting a stable air-side circuit temperature, as described in further detail below, based on the air temperature difference or temperature split (TS) between the supply air and return air of the indoor unit 104. Alternatively or additionally, the controller 24 may confirm the impact or result of the capacitor fault by detecting a stable outdoor unit temperature, for example compressor discharge temperature, as sensed by the compressor discharge temperature sensor 50 (FIG. 1) or condenser temperature, as sensed by the condenser temperature sensor 51 (FIG. 1). A stable outdoor unit temperature condition may exist, for example, when the compressor discharge temperature and/or the condenser temperature remain relatively unchanged, or stable, despite operation of the refrigeration system 10.

Figure 3:
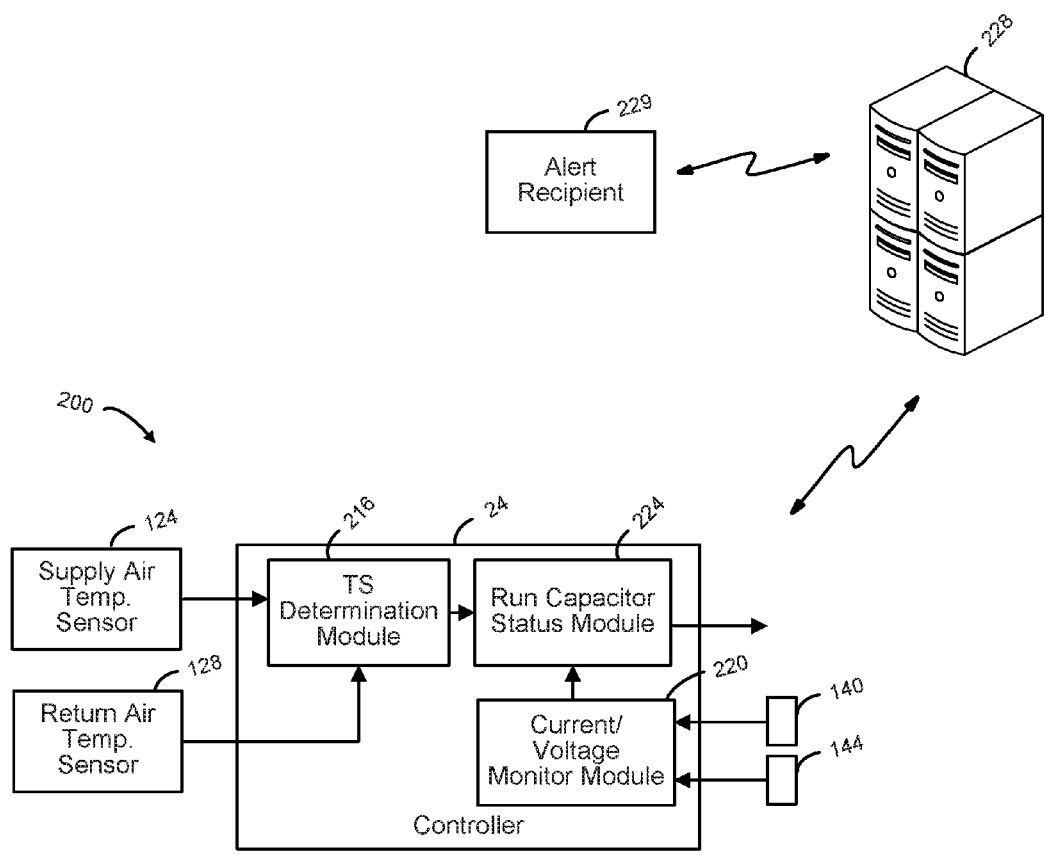
FIG. 3 is a block diagram of controller with a run capacitor fault determination system.

With particular reference to FIG. 3, a block diagram of an example run capacitor fault determination system 200 is shown. The run capacitor fault determination system 200 includes the supply air temperature sensor 124, the return air temperature sensor 128, and controller 24. The controller 24 includes a temperature split (TS) determination module 216, a current/voltage monitor module 220, and a run capacitor status module 224. The TS determination module 216 determines a difference in temperature between supply air temperature and return air temperature. For example, as described in FIG. 2, the supply air temperature sensor 124 monitors a supply air temperature of air supplied by the indoor unit 104. The supply air temperature sensor 124 communicates the supply air temperature to the TS determination module 216. Similarly, the return air temperature sensor 128 monitors return air temperature of air returned to the indoor unit 104. The return air temperature sensor 128 communicates the return air temperature to the TS determination module 216. The TS determination module 216 determines an air temperature change value by subtracting the return air temperature value from the supply air temperature value. The TS determination module 216 communicates the air temperature difference value to the run capacitor status module 224. The functionality of the TS determination module 216 may also be performed by an indoor unit controller, which may receive the supply air temperature value and the return air temperature value from the supply air temperature sensor 124 and the return air temperature sensor 128 and may communicate the difference, or temperature split (TS) to controller 24 and/or to the run capacitor status module 224.

The current/voltage monitor module 220 receives current and voltage measurements from the voltage sensor 140 and the current sensor 144. The current/voltage monitor module 220 determines when measured current is above a predetermined current threshold. For example, the predetermined current threshold may be a current value indicative of a sudden increase in a total current demand. For example, an increase in current demand from the compressor 12 or the condenser fan 17 may contribute to an increase in the total current demand. The current/voltage monitor module 220 communicates current values above the predetermined current threshold to the run capacitor status module 224. The current/voltage monitor module 220 also calculates a power factor (as described above) based on the current and voltage measurements. The current/voltage monitor module 220 communicates the PF to the run capacitor status module 224. The run capacitor status module 224 and the current/voltage monitor module 220 can be separate modules or, alternatively, can be integrated into a single module. Further, the functionality and processing performed by the run capacitor status module 224 can alternatively be performed outside of controller 24. For example, the functionality and processing performed by the run capacitor status module 224 can be performed by an indoor unit controller, an indoor thermostat, or a refrigeration system controller. Additionally, the functionality and processing performed by the run capacitor status module 224 can be performed by a remote server, for example a cloud server that receives and monitors data for the refrigeration system 10. For example, the functionality and processing performed by the run capacitor status module 224 can be performed by remote server 228 shown in FIG. 3.

The run capacitor status module 224 determines a fault in a run capacitor, for example the run capacitor 132, based on the calculated PF, the current measurements, and the confirming air temperature difference value. For example, the run capacitor status module 224 determines whether a sudden drop in PF has occurred. The run capacitor status module 224 receives a first PF value and a second PF value from the current/voltage monitor module 220. The run capacitor status module 224 compares the second PF value to the first PF value. The run capacitor status module 224 determines a sudden drop in PF when a difference between the first PF value and the second PF value is greater than a predetermined threshold and when the drop in PF has occurred within a predetermined period of time. For example only, the run capacitor status module 224 may determine that a drop in PF is a sudden drop in PF when the first PF value is 10% greater than the second PF value during a time period of 15 seconds. It is understood, however, that other percentage drops and other time periods can be used.

The run capacitor status module 224 then determines whether the difference between the supply air temperature value and the return air temperature value is indicative of a stable condition, i.e., whether TS is stable and has not dropped towards zero. The run capacitor status module 224 receives the air temperature difference value from the TS determination module 216. The run capacitor status module 224 determines that TS is stable when the air temperature difference value is less than a predetermined temperature difference threshold. Conversely, the run capacitor status module 224 determines that TS is not stable when the air temperature difference value is below a predetermined temperature difference threshold near zero. As discussed above, alternatively or additionally, the run capacitor status module may confirm the impact or result of the capacitor fault by detecting a stable outdoor unit temperature, for example compressor discharge temperature, as sensed by the compressor discharge temperature sensor 50 (FIG. 1) or condenser temperature, as sensed by the condenser temperature sensor 51 (FIG. 1).

The run capacitor status module 224 also monitors the current values received from the current/voltage monitor module 220. The run capacitor status module 224 determines a fault in the run capacitor 132, such as a drop in capacitance, when there has been a sudden drop in PF, coupled with a stable TS condition, and a current value above a predetermined current threshold. As discussed above, a stable outdoor unit temperature condition can be used in addition to, or instead of, the stable TS condition. When these conditions occur, the run capacitor status module 224 may determine that a run capacitor fault has occurred or will occur in the near future and may deactivate the compressor 12 to avoid damage to the compressor 12 or other system components.

In another embodiment, the run capacitor status module 224 can determine a fault in the run capacitor 132 when there has been a sudden drop in PF coupled with a current value above a predetermined current threshold. When these conditions occur, the run capacitor status module 224 may determine that a run capacitor fault has occurred or will occur in the near future and may deactivate the compressor 12 to avoid damage to the compressor 12 or other system components.

In another embodiment, the run capacitor status module 224 can determine an open run capacitor fault when there is no current flowing through the run capacitor 132 and the start winding 152, and when the TS is at or near zero. When these conditions occur, the run capacitor status module 224 may determine that an open run capacitor fault has occurred and that the compressor may subsequently experience a locked-rotor motor trip. In such case, controller 24 may deactivate the compressor 12 to avoid damage to the compressor 12 or other system components. Alternatively, the run capacitor status module 224 may determine an open run capacitor fault when there is no current flowing through the run capacitor 132 and the start winding 152, and when there is no change or increase in an outdoor unit temperature, such as the compressor discharge temperature, as sensed by the compressor discharge temperature sensor 50 (FIG. 1), or the condenser temperature, as sensed by the condenser temperature sensor 51 (FIG. 1). For example, during normal operation the compressor discharge temperature and the condenser temperature increase after startup of the compressor. If, on the other hand, there is no increase in the compressor discharge temperature and/or the condenser temperature, in combination with no current flowing through the run capacitor 132 and the start winding 152, the run capacitor status module 224 may determine that an open run capacitor fault has occurred. Additionally or alternatively, the compressor discharge temperature and/or the condenser temperature may be compared with ambient temperature to determine whether the compressor discharge temperature and/or the condenser temperature are converging towards the ambient temperature. If such a condition exists in combination with no current flowing through the run capacitor 132 and the start winding 152, the run capacitor status module 224 may determine that an open run capacitor fault has occurred.

In another embodiment, the run capacitor status module 224 may determine that the run capacitor 132 has been incorrectly installed, for example when the wrong type of capacitor has been installed after initial installation or after a replacement service, when PF is below a pre-determined value, such as, for example, 90%. Typically, the compressor manufacturer optimizes the run capacitor selection such that the PF is at least 90%. When these conditions occur, the run capacitor status module 224 may determine that a run capacitor fault has occurred and that the compressor may subsequently experience a locked-rotor motor trip. In such case, controller 24 may deactivate the compressor 12 to avoid damage to the compressor 12 or other system components.

The run capacitor status module 224 may also communicate an alert to a remote server 228. For example, when the run capacitor status module 224 determines that a run capacitor fault has occurred, the run capacitor status module 224 may communicate an alert indicative of the run capacitor fault to the remote server 228. The remote server 228 may be a cloud service, a cluster of servers, or an internet application. The remote server 228 may then communicate the alert to an alert recipient 229, such as a home owner, a service person, or both. Alternatively or additionally, the remote server 228 may also communicate the alert to other alert recipients 229, such as a thermostat coupled to refrigeration system 10, a mobile device, or an e-mail address. In another example, the run capacitor status module 224 may communicate the alert directly to the alert recipient 229, such as the thermostat, the mobile device, or the e-mail address. The run capacitor status module 224 may also display the alert locally, such as on a display of the controller 24. For example, an LED display of the controller 24 may communicate an alert to a contractor using a diagnostic code.

Figure 4:
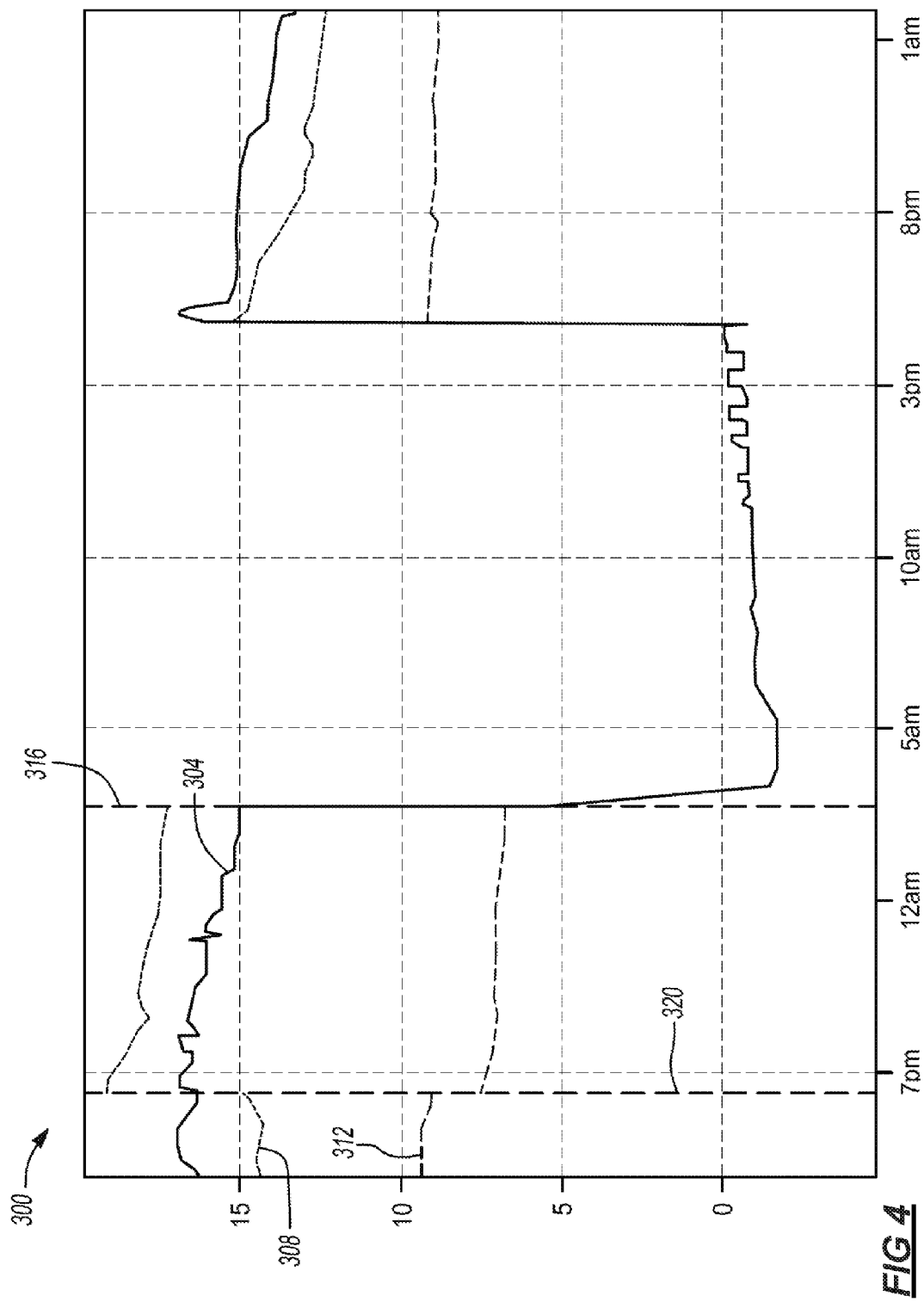
FIG. 4 is a graph showing a run capacitor fault event.

With reference to FIG. 4, a graphical depiction of a run capacitor fault event 300 is shown. The run capacitor fault event 300 is a graphical depiction of current, TS, and PF over an event period of time. The vertical axis of the run capacitor fault event 300 includes various different scales. Each of the current, TS, and PF values are represented on a single scale in order to illustrate a relative relationship between current, TS, and PF. The run capacitor fault event 300 includes a TS graph 304, a current graph 308, and a PF graph 312. The run capacitor fault event 300 also includes a capacitor fault line 316 (indicating an open capacitor condition) and a fault prediction line 320 (indicating a degraded capacitance condition). The TS line 304 depicts a plurality of TS values over the event period. For example, starting at the left of the graph and proceeding forward in time to the right of the graph, the TS graph 304 begins at a first TS value and remains stable until the capacitor fault line 316. The TS graph 304 then decreases to a value indicative of a run capacitor fault.

The current graph 308 depicts current measurements over the event period. For example, the current graph 308 begins at a first value. The current graph 308 increases at the fault prediction line 320. The PF graph 312 depicts calculated PF values over the event period. The PF graph 312 begins at a first PF value. The PF line 312 decreases to a second PF value at the fault prediction line 320.

At the fault prediction line 320, the PF graph 312 is indicative of a sudden drop in PF indicative of a sudden significant drop in capacitance, the current graph 308 is indicative of a sudden increase in current draw, and the TS graph 304 is indicative of a relatively stable TS condition. At the fault prediction line 320, the conditions are present to predict or forecast a future or impending fault in the run capacitor. At the capacitor fault line 316, the sudden change in TS to almost zero, as shown by the TS line 304, indicates a fault in the run capacitor (i.e., a zero capacitance/open capacitor condition). The open run capacitor 132, for example, can create an open start winding 152 condition and will not cause the compressor 12 to cause a locked-rotor trip of a motor protector circuit at start up. In such case, the electric motor 148 will not be able to rotate the compressor 12.

Figure 5:
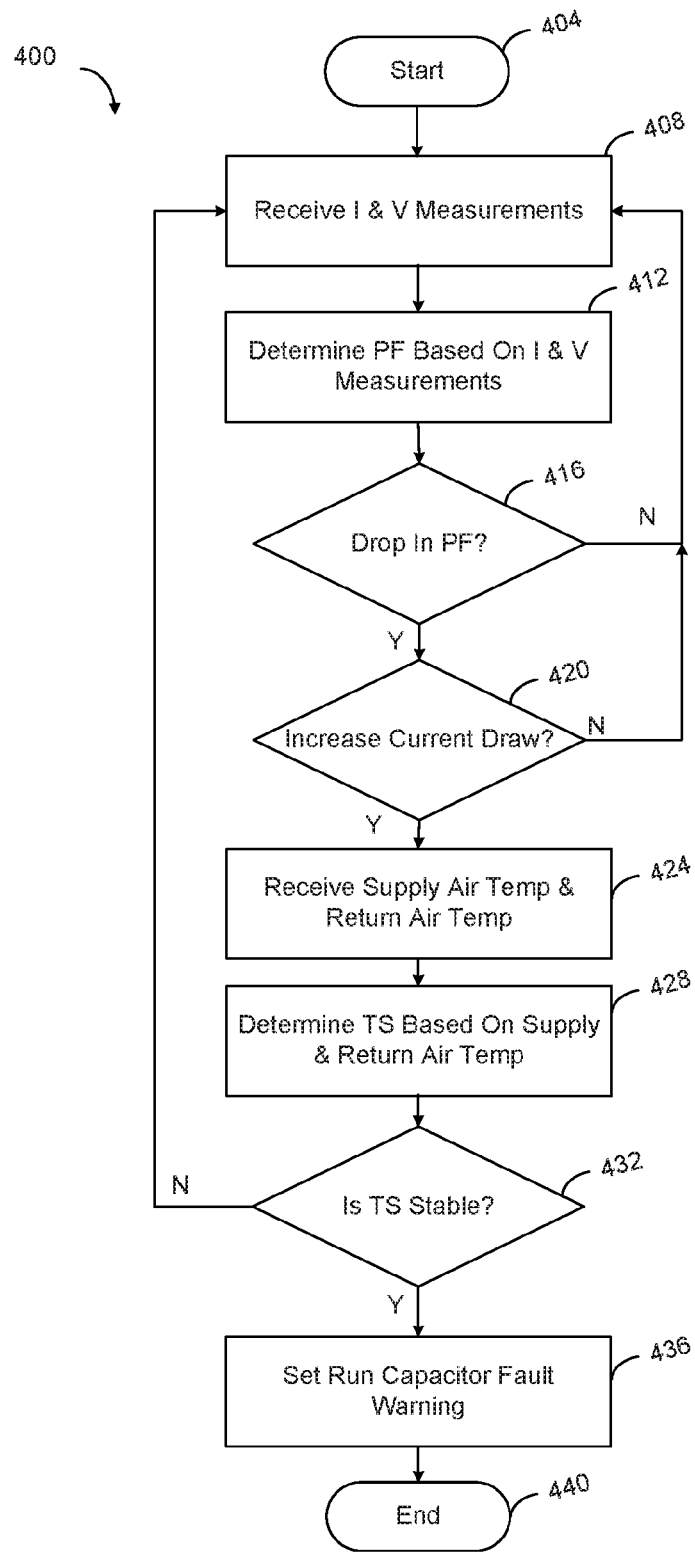
FIG. 5 is flow diagram for a control algorithm according to the present disclosure.

With reference to FIG. 5, an example method for run capacitor fault prediction 400 starts at 404. At 404, the method 400 receives current measurements and voltage measurements. At 412, the method 400 calculates a PF value based on the current measurements and the voltage measurements. At 416, the method 400 determines whether a sudden drop in PF has occurred. If false, the method 400 continues at 408. If true, the method 400 continues at 420. At 420, the method determines whether an increase in current draw has occurred based on the current measurement. If false, the method 400 continues at 416. If true, the method 400 continues at 424. At 424, the method 400 receives a supply air temperature and a return air temperature. At 428, the method 400 calculates a TS value based on the difference between the supply air temperature and the return air temperature. At 432, the method 400 determines whether TS is stable based on the TS value. If false, the method 400 continues at 408. If true, the method 400 continues at 436. At 436, the method 400 deactivates a compressor and/or sends an alert indicative of a fault in the run capacitor to a remote server or to an alert recipient. The method 400 ends at 440.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term controller or module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term controller or module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be partially or fully implemented by one or more computer programs executed by one or more processors. The computer programs include processor-executable instructions that are stored on at least one non-transitory tangible computer readable medium. The computer programs may also include and/or rely on stored data. Non-limiting examples of the non-transitory tangible computer readable medium include nonvolatile memory, volatile memory, magnetic storage, and optical storage.

What is claimed is:

1. A method of operating a refrigeration system including a compressor and a capacitor electrically coupled to the compressor, the method comprising:
    measuring, with a voltage sensor, a plurality of voltage values based on alternating current power powering the compressor;
    measuring, with a current sensor, a plurality of current values based on the alternating current power;
    determining, with a controller in communication with the voltage sensor and the current sensor, a power factor value based on at least one of the plurality of voltage values and at least one of the plurality of current values;
    receiving a supply air temperature value from a supply air temperature sensor installed in the refrigeration system;
    receiving a return air temperature value from a return air temperature sensor installed in the refrigeration system;
    determining, with the controller, a temperature split based on a difference between the return air temperature value and the supply air temperature value;
    determining, with the controller, a fault in the capacitor based on the power factor value and the temperature split; and
    selectively communicating the fault in the capacitor from the controller to at least one of a user, a service person, a system controller, a remote server, a thermostat, a mobile device, and an email address.

2. The method of claim 1, further comprising disabling the compressor in response to detection of the fault in the capacitor.

3. The method of claim 1, further comprising:
    determining, with the controller, a plurality of power factor values based on the plurality of voltage values and the plurality of current values,
    wherein the plurality of power factor values includes the power factor value, and
    wherein the fault in the capacitor is determined based on (i) the temperature split and (ii) a decrease in the plurality of power factor values.

4. The method of claim 3, wherein the fault in the capacitor is determined based on (i) the temperature split being stable and (ii) the decrease in the plurality of power factor values.

5. The method of claim 4, further comprising determining that the temperature split is stable in response to the temperature split being less than a predetermined temperature difference threshold.

6. The method of claim 3, wherein the fault in the capacitor is determined based on (i) the temperature split, (ii) the decrease in the plurality of power factor values, and (iii) an increase in the plurality of current values.

7. The method of claim 6, wherein the fault in the capacitor is determined based on concurrent identification of (i) the temperature split being stable, (ii) the decrease in the plurality of power factor values, and (iii) the increase in the plurality of current values.

8. The method of claim 7, wherein the decrease in the plurality of power factor values requires at least a predetermined percentage decrease over a predetermined period of time.

9. The method of claim 1, further comprising detecting a second capacitor fault in response to the power factor value being below a predetermined threshold subsequent to installation of the capacitor, wherein the second capacitor fault indicates that the capacitor is an incorrect type.

10. The method of claim 1, further comprising:
detecting a second capacitor fault in response to concurrent determination that (i) zero current is flowing through the capacitor and (ii) a measured temperature value is below a predetermined threshold, wherein the second capacitor fault indicates that the capacitor is an open circuit,
wherein the measured temperature value is based on one of (i) the temperature split, (ii) a refrigerant temperature at a discharge side of the compressor, and (iii) a refrigerant temperature at a condensing coil of the refrigeration system.

11. An apparatus comprising:
a voltage sensor configured to measure a plurality of voltage values of alternating current power powering a compressor in a refrigeration system, wherein the refrigeration system includes a capacitor electrically coupled to the compressor;
a current sensor configured to measure a plurality of current values based on the alternating current power; and
a controller, in communication with the voltage sensor and the current sensor, configured to:
determine a power factor value based on at least one of the plurality of voltage values and at least one of the plurality of current values;
receive a supply air temperature value from a supply air temperature sensor installed in the refrigeration system;
receive a return air temperature value from a return air temperature sensor installed in the refrigeration system;
determine a temperature split based on a difference between the return air temperature value and the supply air temperature value;
determine a fault in the capacitor based on the power factor value and the temperature split; and
selectively communicate the fault in the capacitor to at least one of a user, a service person, a system controller, a remote server, a thermostat, a mobile device, and an email address.

12. A system comprising:
the apparatus of claim 11;
the compressor; and
the capacitor.

13. The apparatus of claim 11, wherein the controller is configured to disable the compressor in response to detection of the fault in the capacitor.

14. The apparatus of claim 11, wherein the controller is configured to:
determine a plurality of power factor values based on the plurality of voltage values and the plurality of current values, wherein the plurality of power factor values includes the power factor value; and
determine the fault in the capacitor based on (i) the temperature split and (ii) a decrease in the plurality of power factor values.

15. The apparatus of claim 14, wherein the controller is configured to determine the fault in the capacitor based on (i) the temperature split being stable and (ii) the decrease in the plurality of power factor values.

16. The apparatus of claim 15, wherein the controller is configured to determine that the temperature split is stable in response to the temperature split being less than a predetermined temperature difference threshold.

17. The apparatus of claim 14, wherein the controller is configured to determine the fault in the capacitor based on (i) the temperature split, (ii) the decrease in the plurality of power factor values, and (iii) an increase in the plurality of current values.

18. The apparatus of claim 17, wherein the controller is configured to determine the fault in the capacitor based on concurrent identification of (i) the temperature split being stable, (ii) the decrease in the plurality of power factor values, and (iii) the increase in the plurality of current values.

19. The apparatus of claim 18 wherein the decrease in the plurality of power factor values requires at least a predetermined percentage decrease over a predetermined period of time.

20. The apparatus of claim 11, wherein the controller is configured to detect a second capacitor fault in response to the power factor value being below a predetermined threshold subsequent to installation of the capacitor, wherein the second capacitor fault indicates that the capacitor is an incorrect type.

21. The apparatus of claim 11, wherein the controller is configured to:
detect a second capacitor fault in response to concurrent determination that (i) zero current is flowing through the capacitor and (ii) a measured temperature value is below a predetermined threshold, wherein the second capacitor fault indicates that the capacitor is an open circuit,
wherein the measured temperature value is based on one of (i) the temperature split, (ii) a refrigerant temperature at a discharge side of the compressor, and (iii) a refrigerant temperature at a condensing coil of the refrigeration system.

* * * * *